US008409886B2

(12) United States Patent
Iwafuchi et al.

(10) Patent No.: US 8,409,886 B2
(45) Date of Patent: Apr. 2, 2013

(54) METHOD OF PRODUCING IMAGE DISPLAY UNIT

(75) Inventors: Toshiaki Iwafuchi, Tokyo (JP); Toyoharu Oohata, Tokyo (JP); Masato Doi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/558,620

(22) Filed: Nov. 10, 2006

(65) Prior Publication Data
US 2007/0087644 A1 Apr. 19, 2007

Related U.S. Application Data

(60) Division of application No. 10/427,815, filed on Apr. 30, 2003, now Pat. No. 7,880,184, which is a division of application No. 10/066,423, filed on Jan. 30, 2002, now Pat. No. 6,613,610, which is a continuation of application No. PCT/JP01/06213, filed on Jul. 18, 2001.

(30) Foreign Application Priority Data

| Jul. 18, 2000 | (JP) | P2000-217953 |
| Jul. 18, 2000 | (JP) | P2000-217988 |
| Dec. 26, 2000 | (JP) | P2000-396225 |
| Jun. 29, 2001 | (JP) | P2001-200113 |

(51) Int. Cl.
*H01L 21/00* (2006.01)

(52) U.S. Cl. ............... 438/28; 438/22; 438/24; 257/88; 257/89

(58) Field of Classification Search .............. 438/22, 438/24, 28, 46, 47; 257/76, 78, 79, 82, 84, 257/88, 89, 103
See application file for complete search history.

(56) References Cited

U.S. PATENT DOCUMENTS

| 5,339,180 | A | | 8/1994 | Katoh | |
| 5,391,257 | A | * | 2/1995 | Sullivan et al. | 438/458 |
| 5,674,599 | A | * | 10/1997 | Yamada | 428/212 |
| 5,702,963 | A | * | 12/1997 | Vu et al. | 438/197 |
| 6,025,251 | A | * | 2/2000 | Jakowetz et al. | 438/464 |
| 6,113,685 | A | * | 9/2000 | Wang et al. | 117/3 |
| 6,475,629 | B1 | * | 11/2002 | Takeuchi et al. | 428/450 |

FOREIGN PATENT DOCUMENTS

| DE | 19603444 A1 | 8/1997 |
| DE | 19840210 A1 | 3/2000 |

(Continued)

OTHER PUBLICATIONS

Yang et al., "Single-crystal GaN pyramids grown on (1 1 1)Si substrates by selective lateral overgrowth", Journal of Crystal Growth, 1999, pp. 270-274, vol. 204.

(Continued)

*Primary Examiner* — Ori Nadav
(74) *Attorney, Agent, or Firm* — K&L Gates LLP

(57) ABSTRACT

A method of producing the image display unit, wherein the image display unit includes an array of a plurality of light emitting devices for displaying an image, and wherein the method of producing the image display unit employs, for example, a space expanding transfer, whereby a first transfer step includes transferring the devices arrayed on a first substrate to a temporary holding member such that the devices are spaced from each other with a pitch larger than a pitch of the devices arrayed on the first substrate, a second holding step includes holding the devices on the temporary holding member, and a third transfer step includes transferring the devices held on the temporary holding member onto a second board such that the devices are spaced from each other with a pitch larger than the pitch of the devices held on the temporary holding member.

13 Claims, 41 Drawing Sheets

FOREIGN PATENT DOCUMENTS

| | | |
|---|---|---|
| EP | 0785880 A2 | 7/1997 |
| EP | 0903792 A2 | 3/1999 |
| JP | 56017385 A | 2/1981 |
| JP | 11142878 | 5/1999 |
| JP | 11-312840 | 11/1999 |
| WO | 90/01803 | 2/1990 |

OTHER PUBLICATIONS

European Search Report dated Jun. 14, 2011, for corresponding European Appln. No. 11002100.3.
Search report from corresponding European Application No. EP 11002114 dated May 24, 2011.

* cited by examiner

70 ATTRACTING JIG

71 ATTRACTING CIRCUIAR HOLE

PRIOR ART

PRIOR ART

F I G. 42
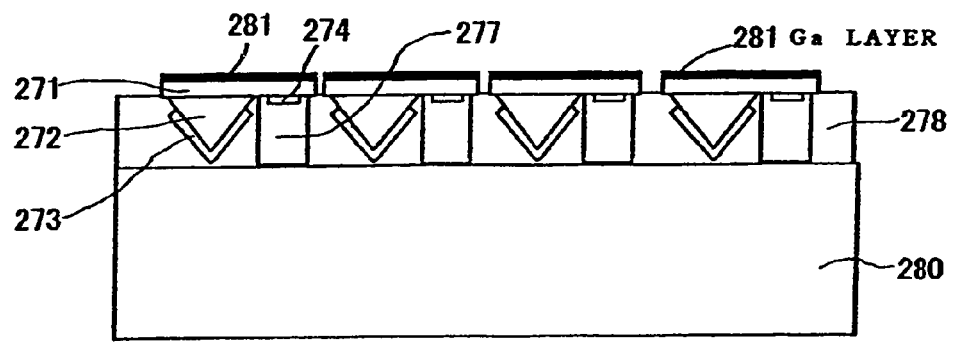
F I G. 43
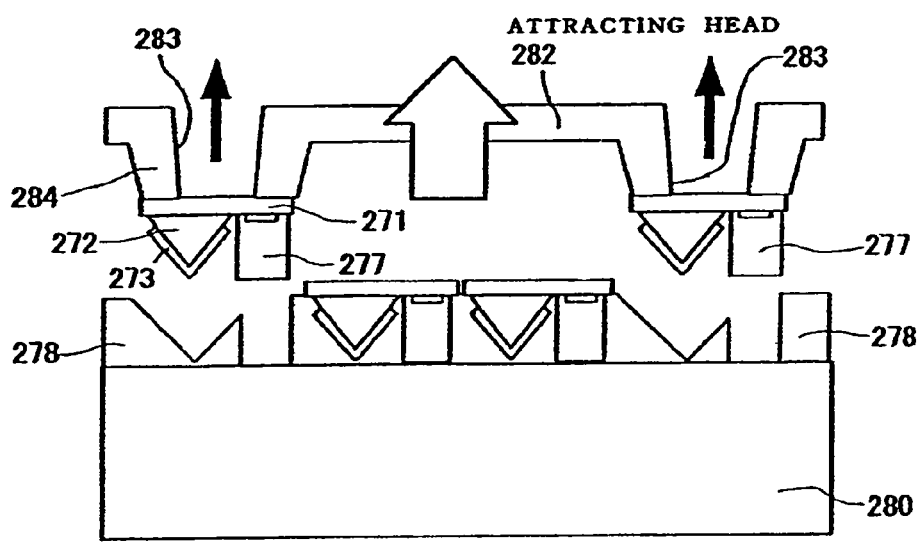

METHOD OF PRODUCING IMAGE DISPLAY UNIT

The present application is a divisional of U.S. application Ser. No. 10/427,815 filed on Apr. 30, 2003 which is a divisional of U.S. application Ser. No. 10/066,423, filed on Jan. 30, 2002 which is a continuation of International Application No. PCT/JP01/06213 with an international filing date of Jul. 18, 2001. The present application claims priority to Japanese Patent Application No. P2000-217953 filed on Jul. 18, 2000; Japanese Patent Application No. P2000-217988 filed on Jul. 18, 2000; Japanese Patent Application No. P2000-396225 filed on Dec. 26, 2000; and Japanese Patent Application No. P2001-200113 filed on Jun. 29, 2001. The above-referenced applications are incorporated herein by reference to the extent permitted by law.

BACKGROUND

The present invention generally relates to image display units and methods of producing same. More specifically, the present invention relates to an image display unit including light emitting devices and methods of producing same.

Various lightweight and thin display units have been developed, including LED (Light Emitting Diode) displays, liquid crystal displays, and plasma displays. The application of these image display units has been extended along with progress of computer techniques. For example, display units having a diagonal size of about 30 to 150 cm have been used for television receivers, video reproducing devices, and output units for game devices, and further, display units having a diagonal size smaller than about 30 cm have been used for vehicle-mounted navigation systems, picture recording systems, and monitors.

Each of the above-described image display units, however, has drawbacks in terms of characteristics such as resolution, luminance, light output/power efficiency, and image quality, and further, in terms of screen size and production costs. For example, in display units of a type using light emitting diodes arrayed in a matrix, individual light emitting diodes are collectively mounted to form an array of the light emitting devices. However, since each light emitting diode is packaged, it has a size as large as several millimeters. In general, a set of light emitting diodes of differing colors (e.g., red, green and blue) make up a pixel, which is the basic unit of the composition of an image on an image display unit. Thus, the size of each pixel becomes large, thereby degrading the resolution (i.e., the smaller the pixel size, the higher and better the resolution). Additionally, since the cost per each pixel is raised, the production costs become high, in particular, for an image display unit having a large screen.

In liquid crystal display units, a substrate forming part of the display unit is put in a film formation apparatus, kept in vacuum, and devices such as transistors and wiring are formed using photolithography. In such display units, particularly, when increasing the resolution of the liquid crystal display, a process control must be performed on the order of p.m. Accordingly, to improve the production yield, the process control must be strictly performed, and therefore, the production costs are increased when producing a liquid crystal display unit having a large screen. Further, liquid crystal display units have a viewing angle dependence in which the contrast or tint varies depending on a viewing angle, and also experience a response speed delay when one color is changed to another color.

Plasma display units primarily function by making use of a mechanism that generates a discharge in a narrow space on the order of a pixel size and visual light is generated by exciting phosphors with the aid of ultraviolet rays derived from an ionized gas generated from the discharge. Accordingly, plasma display units have low luminous efficiency and large power consumption. Further, external light is reflected from phosphors, thereby degrading the contrast. Additionally, plasma display units have a narrow color reproduction range.

Accordingly, each of the above-described image display units make it difficult to form a large-sized screen, are high in production costs, and have problems in terms of resolution, process control, image quality, and luminous efficiency.

Production costs for image display units using LEDs can be reduced by producing a number of LEDs from one wafer. More specifically, for example, the production costs of an image display unit can be reduced by separating an LED chip having a larger area into LED chips each having a significantly smaller area and mounting the LED chips, thus separated, on a board.

In this regard, there are various techniques known in which devices formed at a high density are moved to a wide region while being spaced from each other by transfer or the like, to obtain a relatively large display unit such as an image display unit. For example, U.S. Pat. No. 5,438,241 discloses a thin film transfer method, and Japanese Patent Laid-open No. Hei 11-142878 discloses a method of forming a transistor array panel for a display unit.

In the transfer method disclosed in U.S. Pat. No. 5,438,241, devices densely formed on a substrate are coarsely re-arrayed on a specific display panel by transferring the devices densely formed on the substrate to a stretchable board provided with an adhesive layer, extending the stretchable board along a first axis and then along an orthogonal axis while monitoring the spacing between the devices along both axes, and transferring the devices on the extended stretchable board onto the display panel.

In the technique disclosed in Japanese Patent Laid-open No. Hei 11-142878, thin film transistors forming a liquid crystal display portion on a first substrate are all transferred on a second board, and the thin film transistors are selectively transferred from the second board to a third board with an array pitch corresponding to a pixel pitch (i.e., the distance from center to center of any two adjacent pixels).

The above-described techniques, however, encounter the following problems. The transfer method disclosed in U.S. Pat. No. 5,438,241, in which devices closely formed on a substrate are coarsely re-arrayed on a display panel requires that the device position is deviated by a chip size (e.g., about 20 μm), at a minimum, depending on at which position of an adhesively bonding surface of the device chip, a fixed point (supporting point) at the time of extension of the stretchable board is located. As a result, this transfer method requires accurate positional control for each device chip. Accordingly, when forming a high definition TFT array panel requiring positional accuracy of at least about 1 μm, it takes a lot of time to perform positioning of the TFT device chips including positional measurement and control for each TFT device chip. Another disadvantage of this transfer method is that when transferring TFT device chips on a resin film having a large thermal expansion coefficient, positional accuracy may be reduced depending on variations in temperature and stress, both before and after the positioning operation. Thus, from the viewpoint of mass production, this transfer method has problems in terms of positional accuracy and time constraints.

The technique disclosed in Japanese Patent Laid-open No. Hei 11-142878 has the following problem. In this method, wiring electrodes and the like are formed after final transfer. However, since it has been required to reduce sizes of devices such as thin film transistors or light emitting devices for satisfying a requirement toward high integration of the devices so as to realize high-speed operation and reduction in costs, if a wiring layer and the like are formed after the devices are arrayed with an array pitch corresponding to a specific pixel pitch, then it is required to form wiring in a state that the micro-chips are already arrayed in a wider region. As a result, this method has a problem in terms of possible wiring failures due to problems with the positional accuracy of the devices.

There have been known some image display units in which light emitting devices such as light emitting diodes are mounted so as to be arrayed on a wiring board in a matrix. Japanese Patent No. 2895566 and Japanese Patent Laid-open No. Hei 9-293904 disclose light emitting diodes of a so-called flip-chip type. When producing an image display unit by arraying such light emitting diodes in a matrix, each light emitting diode must be contained in a package and an array of a number of these light emitting diodes must be mounted for assembly into a flat type image display unit or the like. Thus, since LEDs formed on a wafer are separated into individual chips and are each sealed in a package, each LED chip in a bare chip state has a size less than about 1 mm (e.g., each side of an approximately square-shaped chip is less than about 1 mm) and the package of the LED chip has a size on order of about several millimeters. As a result, the size of one pixel becomes large, thereby resulting in resolution degradation, and failing to produce a small-sized high definition image display unit. Further, for a light emitting diode made from a GaN based nitride semiconductor, since the light emitting diode is generally formed on a sapphire substrate, the package of each LED becomes thicker than the thickness of the sapphire substrate.

In view of the foregoing, a need exits to provide an image display unit capable of enhancing characteristics such as resolution, image quality, and luminous efficiency, facilitating formation of a large-sized screen, and reducing the production time and costs. An additional need exists to provide a method of arraying devices, which is capable of transferring micro-devices to a wider region without degrading positional accuracy after transfer and without the occurrence of a wiring failure.

SUMMARY

The present invention provides an improved image display unit including light emitting devices and methods of producing same. In this regard, the present invention provides improved image display units having enhanced characteristics such as resolution, image quality, and luminous efficiency, while facilitating formation of a large-sized screen, and reducing the production time and costs. Additionally, the present invention provides a method of arraying devices, for example, to be used in an image display unit, which enables transferring micro-devices to a wider region without degrading positional accuracy after transfer and without the occurrence of a wiring failure.

To this end, in an embodiment of the present invention, a method of re-arraying a number of devices arrayed on a first substrate each having a first pitch onto a second substrate is provided. The method includes the steps of transferring the devices to a temporary holding member such that the devices are spaced apart, each having a second pitch, wherein the second pitch is larger than the first pitch, holding the devices on the temporary holding member, and transferring the devices to the second substrate such that the devices are spaced apart, each having a third pitch, wherein the third pitch is larger than the second pitch.

In an embodiment, the second pitch is about an integer multiple of the first pitch, and the third pitch is about an integer multiple of the second pitch.

In an embodiment, after the step of transferring the devices to the temporary holding member, the method further includes the steps of molding the devices with a resin, forming electrodes of the devices on the resin, and processing the resin to divide the resin into a number of sections.

In an embodiment, the step of transferring the devices to the temporary holding member includes selectively transferring from the first substrate the devices located at positions spaced from each other when the first substrate is opposed to the temporary holding member.

In an embodiment, the step of transferring the devices to the second substrate includes selectively transferring from the temporary holding member the devices located at positions spaced from each other when the temporary holding member is opposed to the second substrate.

In an embodiment, the devices are transferred from the temporary holding member to a position adjacent to each other on the second substrate that is different from a position of the devices on the temporary holding member.

In an embodiment, the step of transferring the devices to the temporary holding member and the step of transferring the devices held on the temporary holding member to the second substrate are performed employing at least one of a mechanical mechanism and an optical mechanism.

In an embodiment, the mechanical mechanism is capable of selectively transferring the devices while imparting a dynamic energy to each of the devices.

In an embodiment, the mechanical mechanism is capable of transferring the devices by selectively attracting the devices.

In an embodiment, the optical mechanism is capable of selectively transferring the devices while imparting a light energy to each of the devices by light irradiation. In an embodiment, the first substrate is a translucent substrate.

In an embodiment, each of the devices is a semiconductor device including a nitride semiconductor and the light irradiation is performed using a laser beam.

In an embodiment, at least a portion of the devices are selected from the group consisting of a light emitting device, a liquid crystal device, a photoelectric transfer device, a piezoelectric device, a thin film transistor device, a thin film diode, a resistance device, a switching device, a micro-magnetic device, and a micro-optical device.

In an embodiment, the devices are produced on the first substrate.

In an embodiment, the step of holding the devices on the temporary holding member includes forming a wiring portion on each of the devices.

In an embodiment, the wiring portion includes an electrode pad.

In another embodiment of the present invention, an image display unit is provided. The image display unit includes an array of a number of light emitting devices each having an occupied area mounted on a wiring board for displaying an image in response to an image signal, wherein the occupied area ranges from about 25 µm2 to about 10,000 1.tm2.

In an embodiment, a ratio of the occupied area of each of the light emitting devices to an occupied area of a pixel on the image display unit ranges from about 10 to about 40,000.

In an embodiment, the ratio ranges from about 10 to about 10,000.

In an embodiment, the light emitting device is selected from the group consisting of a nitride semiconductor light emitting device, an arsenide semiconductor light emitting device, and a phosphide semiconductor light emitting device.

In an embodiment, a pixel includes a set of three of the light emitting devices, wherein each of the light emitting devices in the set has a different wavelength.

In an embodiment, a current retention circuit is electrically connected to each of the light emitting devices for retaining a current flowing in each of the light emitting devices.

In an embodiment, the current retention circuits are formed in a chip shape, and are mounted, together with each of the light emitting devices, on the wiring board.

In an embodiment, each of the current retention circuits formed in the chip shape has a size substantially equal to a size of each of the light emitting devices.

In a further embodiment of the present invention, a method of producing an image display unit having an array of a number of light emitting devices for displaying an image in response to an image signal is provided. The method includes the steps of preparing a wiring board on which wiring is provided in a matrix, preparing the light emitting devices separated into individual chips, wherein an occupied area of each of the light emitting devices ranges from about 25 µm2 to about 10,000 µm2, and mounting the light emitting devices on the wiring board so as to connect the light emitting devices to the wiring.

In an embodiment, the method further includes the steps of stacking a semiconductor layer on a device forming substrate, forming the light emitting devices on the semiconductor layer so as to be arrayed thereon, separating each of the light emitting devices into individual chips, and mounting the individual chips of each of the light emitting devices on the wiring board.

In an embodiment, the method further includes the steps of forming grooves reaching a front surface of the device forming substrate in a region adjacent to two of the light emitting devices so as to surround each of the light emitting devices, separating each of the light emitting devices surrounded by the grooves from the device forming substrate, and mounting each of the separated light emitting devices on the wiring board.

In an embodiment, the step of mounting each of the separated light emitting devices onto the wiring board includes positioning each of the separated light emitting devices such that at least one of a front surface and a back surface of each of the separated light emitting devices is attracted by an attracting mechanism.

In an embodiment, the step of separating each of the light emitting devices from the device forming substrate includes irradiating each of the light emitting devices with an energy beam from a back surface of the device forming substrate.

In an embodiment, the method further includes the steps of staging each of the light emitting devices on the device forming substrate between the device forming substrate and a temporary holding board before the step of separating each of the light emitting devices from the device forming substrate, and staging each of the light emitting devices on the temporary holding board after the step of separating each of the light emitting devices from the device forming substrate.

In an embodiment, an adhesive is substantially formed on the temporary holding board, and a front surface of each of the light emitting devices is temporarily affixed to the adhesive.

In an embodiment, the step of mounting each of the separated light emitting devices on the wiring board includes pressing an electrode portion of the light emitting device into contact with a conductive material on the wiring board.

In yet another embodiment of the present invention, a method of producing light emitting devices is provided. The method includes the steps of applying a semiconductor layer onto a substrate, forming an array of a number of light emitting devices on the semiconductor layer, separating the array of light emitting devices into individual light emitting devices, and separating each of the light emitting devices from the substrate.

In an embodiment, the step of separating each of the light emitting devices from the substrate includes irradiating each of the light emitting devices with an energy beam from a back surface of the substrate.

In an embodiment, the method further includes the steps of staging each of the light emitting devices on the substrate between the substrate and a temporary holding board before the step of separating each of the light emitting devices from the substrate, and staging each of the light emitting devices on the temporary holding board after the step of separating each of the light emitting devices from the substrate.

In an embodiment, an adhesive material is substantially formed on the temporary holding board, and a front surface of each of the light emitting devices is temporarily affixed to the adhesive.

In another embodiment of the present invention, a method of producing an image display unit on which devices are arrayed in a matrix is provided. The method includes the steps of transferring the devices arrayed on a first substrate each having a first pitch to a temporary holding member such that the devices are spaced from each other with a second pitch that is larger than the first pitch of the devices arrayed on the first substrate, staging the devices on the temporary holding member, transferring the devices to a second substrate such that the devices are spaced from each other with a third pitch that is larger than the second pitch, and forming wiring to be connected to each of the devices.

In an embodiment, the devices include at least one of a light emitting device and a liquid crystal control device.

In an embodiment, a pixel includes a set of at least a portion of the devices which each correspond to a different wavelength.

In an embodiment, the step of staging the devices on the temporary holding member includes forming an electrode pad on each of the devices, and the step of forming wiring to each of the devices includes forming wiring to the electrode pad.

In a further embodiment of the present invention, an image display unit is provided. The image display unit includes a wiring board and a number of light emitting devices mounted on the wiring board along a principal plane of the wiring board, wherein the light emitting devices include a crystal growth layer formed during crystal growth in an inverted direction that is perpendicular to the principal plane.

In an embodiment, a portion of the crystal growth layer is formed from a substrate via a window portion, and the light emitting device is separated from the substrate before being mounted on the wiring board.

In an embodiment, the image display unit further includes a first conductive layer, an active layer, and a second conductive layer formed on the crystal growth which has a crystal plane that is inclined with respect to a principal plane of the substrate, and a first electrode connectable to the first conductive layer and a second electrode connectable to the second conductive layer, wherein a height of the first electrode is substantially equal to a height of the second electrode.

In an embodiment, the image display unit further includes a first conductive layer, an active layer, and a second conductive layer formed on the crystal growth layer which has a crystal plane that is inclined with respect to a principal plane of the substrate, and a first electrode connectable to the first conductive layer and a second electrode connectable to the second conductive layer, wherein the crystal growth layer is positioned between the first electrode and the second electrode in a direction perpendicular with respect to a principal plane of the substrate.

In an embodiment, the crystal growth layer includes a nitride semiconductor composed of wurtzite formed by selective crystal growth.

In an embodiment, the crystal growth layer is formed by selective growth into at least one of a hexagonal pyramid shape and a hexagonal trapezoid shape.

In yet another embodiment of the present invention, a method of producing an image display unit is provided. The method includes the steps of producing a light emitting device on a substrate by selective growth of a crystal growth layer via an opening on the substrate, forming a first conductive layer, an active layer, and a second conductive layer on the crystal growth layer, forming a first electrode connected to the first conductive layer and a second electrode connected to the second conductive layer such that a height of the first electrode is substantially equal to a height of the second electrode, separating the crystal growth layer from the substrate, and mounting the crystal growth layer on a wiring board in a position that is inverted with respect to a position of the crystal growth layer on the substrate.

In an embodiment, a connecting portion is connected to at least one of the first and second electrodes such that the heights of the first and second electrodes are substantially equal.

In an embodiment, the step of mounting the crystal growth layer on the wiring board includes mounting the light emitting device on the wiring board such that at least one of a front surface and a back surface of the light emitting device is attracted by an attracting mechanism.

In an embodiment, the step of separating the crystal growth layer from the substrate includes irradiating the light emitting device with an energy beam from a back surface of the substrate.

In an embodiment, the irradiating with the energy beam is selectively performed.

In an embodiment, the method further includes the steps of holding the light emitting device between the substrate and a board for transfer before the step of separating the crystal growth layer from the substrate, and holding the light emitting device on the board for transfer after the step of separating the crystal growth layer from the substrate.

In another embodiment of the present invention a device mounting board is provided. The device mounting board includes a wiring board and a number of devices attached to the wiring board along a principal plane of the wiring board, wherein the devices include a crystal growth layer formed during crystal growth in an inverted direction with respect to crystal growth that is perpendicular to the principal plane.

In an embodiment, each of the crystal growth layers includes a portion extending along a substantially flat surface plane such that each portion has a substantially identical height relative to a surface of the wiring board upon which the devices are mounted.

Additional features and advantages are described herein, and will be apparent from, the following Detailed Description and the figures.

BRIEF DESCRIPTION OF THE FIGURES

FIGS. 18A and 18B are views showing a light emitting device used for a method of arraying devices according to an embodiment of the present invention, wherein FIG. 18A is a sectional view and FIG. 18B is a plan view.

FIGS. 36A and 36B are views showing a light emitting device as a component of an image display unit according to an embodiment of the present invention, wherein FIG. 35A is a sectional view of the device and FIG. 35B is a plan view of the device.

FIG. 42 is a sectional view showing a step of transferring devices to a temporarily holding board in a method of producing an image display unit according to an embodiment of the present invention.

FIG. 43 is a sectional view showing a step of attracting a selected light emitting device in a method of producing an image display unit according to an embodiment of the present invention.

DETAILED DESCRIPTION

The present invention provides an image display unit including light emitting devices and methods of producing same. The present invention provides methods of arraying devices such that, for example, the image display unit of the present invention can be manufactured with reduced production time and costs while providing an image display unit with enhanced characteristics, such as resolution, image quality, and luminous efficiency.

In a method of arraying devices and a method of producing an image display unit according to an embodiment of the present invention, two-step transfer is performed by transferring devices formed on a first substrate at a high density onto a temporary or temporarily holding member such that the devices are spaced from each other with a pitch larger than a pitch of the devices arrayed on the first substrate, and further transferring the devices held on the temporarily holding member onto a second board such that the devices are spaced from each other with a pitch larger than the pitch of the devices held on the temporarily holding member. It should be noted that two-step transfer is adopted in this embodiment, but multi-step transfer such as three or more step transfer can be adopted in accordance with a necessary enlargement ratio in array pitch between the devices arrayed on the first substrate and the devices mounted on the second board.

It should be noted that the term pitch as used throughout the specification, in general, denotes the spacing between any two adjacent devices and/or a collective number of devices (e.g., a pixel) adjacent to one another as defined by a distance between a center of the devices.

Figure 13:
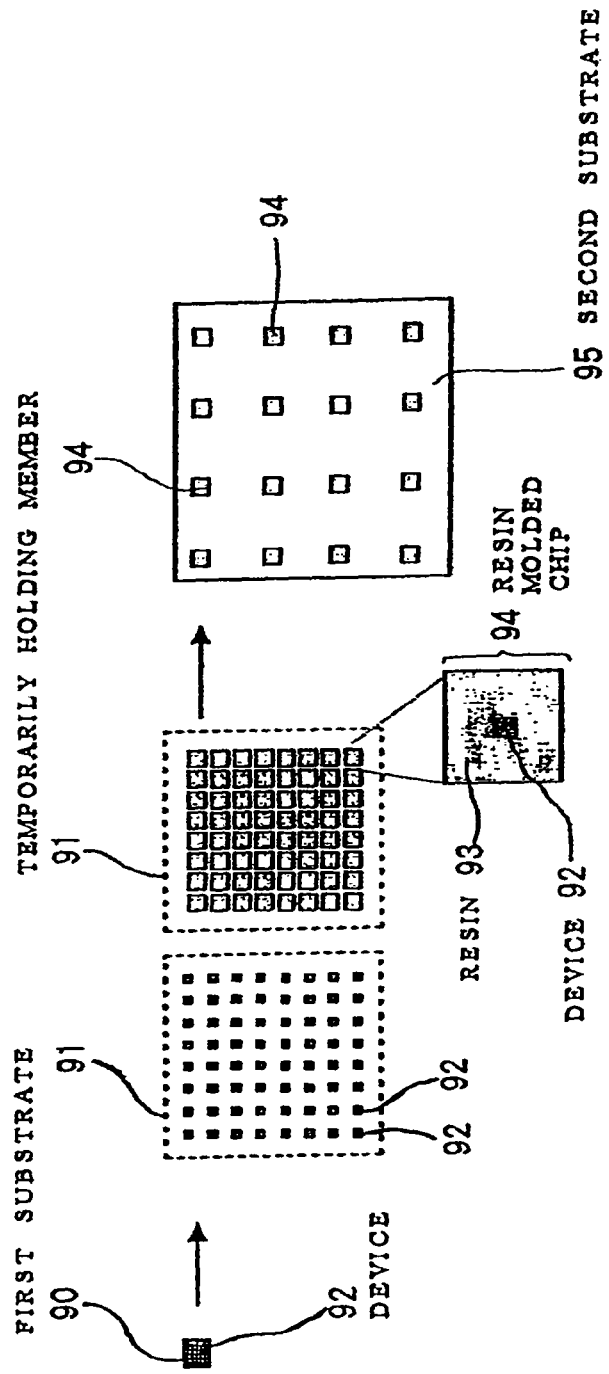
FIGS. 13A to 13D are schematic diagrams showing a method of arraying devices according to an embodiment of the present invention.

FIGS. 13A to 13D are schematic diagrams illustrating basic steps of transferring devices using a two-step enlarged transfer method according to an embodiment of the present invention. First, devices 92, such as light emitting devices, liquid crystal control devices, or the like, are densely formed on a first substrate 90, as shown in FIG. 13A. Liquid crystal control devices are devices such as thin film transistors for controlling an alignment state of liquid crystal at the time of forming a liquid crystal panel as a final product. By densely forming the devices 92, the number of devices 92 produced for each substrate can be increased, thereby reducing the final cost of the associated products.

As the first substrate 90, various kinds of substrates on which devices can be formed, such as a semiconductor wafer, a glass substrate, a quartz glass substrate, a sapphire substrate, a plastic substrate, or the like, can be used. The devices 92 may be directly formed on the first substrate 90, or may be formed on another substrate and arrayed on the first substrate 90.

As shown in FIG. 13B, the devices are transferred to a temporarily holding member 91 (shown by broken lines in the figure) and held on the temporarily holding member 91. On the temporarily holding member 91, the adjacent two of the devices are spaced from each other, and the devices are arrayed in a matrix shown in the figure as a whole. More specifically, the devices 92 are transferred to the temporarily holding member 91 such as to be spaced from each other not only in the X direction but also in the Y direction, perpendicular to the X direction. The enlargement ratio in array pitch between the devices on the first substrate 90 and the devices on the temporarily holding member 91 is not particularly limited but may be determined in consideration of formation of resin portions and formation of electrode pads in the subsequent steps. The devices can all be transferred from the first substrate 90 onto the temporarily holding member 91 such as to be spaced from each other. Thus, a size of the temporarily holding member 91 along each of the X direction and the Y direction may be equal to or more than a value obtained by multiplying the number of the devices arrayed in each of the X direction and the Y direction by the pitch of the devices arrayed on the temporarily holding member 91. It should be noted that part of the devices on the first substrate 90 may be transferred onto the temporarily holding member 91 such as to be spaced from each other.

In an embodiment, the transfer of the devices 92 onto the temporarily holding member 91 may be performed (as will be described later) by adopting a specific mechanical mechanism (e.g., using an attracting jig, an actuator, or the like). Alternatively, the devices 92 may be selectively transferred to the temporarily holding member 91 by coating the devices 92 with a resin causing a reaction such as softening, hardening, bridging, or deterioration due to heat or light, and locally irradiating selected ones of the devices 92 with heat or light, to thereby peel or adhesively bond the selected devices. The transfer of the devices 92 may be performed by combination of the thermal or optical mechanisms and/or the mechanical mechanism. In general, the transfer of the devices 92 is performed from the first substrate 90 to the temporarily holding member 91 which faces to the first substrate 90. However, chips of the devices 92 may be individually separated from the first substrate 90 and then re-arrayed on the temporarily holding member 91.

In an embodiment, after such a first transfer step, as shown in FIG. 13C, resin molding to cover each device and formation of an electrode pad are performed for each of the devices 92 spaced from each other on the temporarily holding member 91. The resin molding to cover each device is performed for facilitating both formation of the electrode pad for the device and handling of the device in the subsequent second transfer step. Since each electrode pad is formed after the second transfer step (as will be described later) followed by final wiring, the electrode pad is formed into a relatively large size so as not to cause a wiring failure in the final wiring. It should be noted that the electrode pads are not shown in FIG. 13C. By covering each device 92 with a resin 93, a resin molded chip 94 is formed. The device 92 is located at an approximately central portion of the resin molded chip 94 in a plan view. However, the device 92 may be located at a position offset from the central portion to one side or a corner of the resin molded chip 94.

Subsequently, as shown in FIG. 13D, the second transfer step is carried out. In this second transfer step, the devices 92, which are arrayed in the matrix on the temporarily holding member 91 in the form of the resin molded chips 94, are transferred to a second board 95 such as to be spaced from each other with a further enlarged pitch. Like the first transfer step, the transfer of the devices 92 may be performed by adopting a specific mechanical mechanism (e.g., using an attracting jig, an actuator, or the like) Alternatively, the devices 92 may be selectively transferred by coating the devices 92 with a resin causing a reaction such as softening, hardening, bridging, or deterioration due to heat or light, and locally irradiating selected ones of the devices 92 with heat or light, to thereby peel or adhesively bond the selected devices 92. The transfer of the devices 92 may be performed by combination of the thermal or optical mechanisms and/or the mechanical mechanism.

Even in the second transfer step, adjacent two of the devices 92 in the form of the resin molded chips 94 are spaced from each other, and the devices 92 are re-arrayed in a matrix as shown in the figure as a whole. More specifically, the devices 92 are transferred such as to be spaced from each other not only in the X direction but also in the Y direction. If the positions of the devices 92 re-arrayed in the second transfer step correspond to positions of pixels of a final product, such as an image display unit, then a pitch of the devices 92 re-arrayed in the second transfer step is about an integer multiple of an original pitch of the devices 92 arrayed on the first board 90. Assuming that an enlargement ratio in pitch between the devices 92 held on the temporarily holding member 91 and the devices 92 arrayed on the first substrate 90 is taken as "n" and an enlargement ratio in pitch between the devices 92 re-arrayed on the second board 95 and the devices held on the temporarily holding member 91 is taken as "m", a total magnification E (that is, the above-described about an integer multiple) is expressed by E=n×m. Each of the enlargement ratio "n" and "m" may be an integer, or may be not an integer insofar as the enlargement ratios "n" and "m" are combined with each other so that the total magnification E becomes an integer (for example, n=2.4 and m=5).

In an embodiment, the devices 92 in the form of the resin molded chips 94, re-arrayed on the second board 95 such as to be spaced from each other, are then subjected to wiring, making use of the previously formed electrode pads, or the like. Preferably, the wiring is performed with care so as not to cause a connection failure. For light emitting devices such as light emitting diodes, the wiring includes wiring to p-electrodes and n-electrodes, and for light crystal control devices, the wiring includes wiring to selective signal lines, voltage lines, alignment electrode films, and the like.

Figure 14:
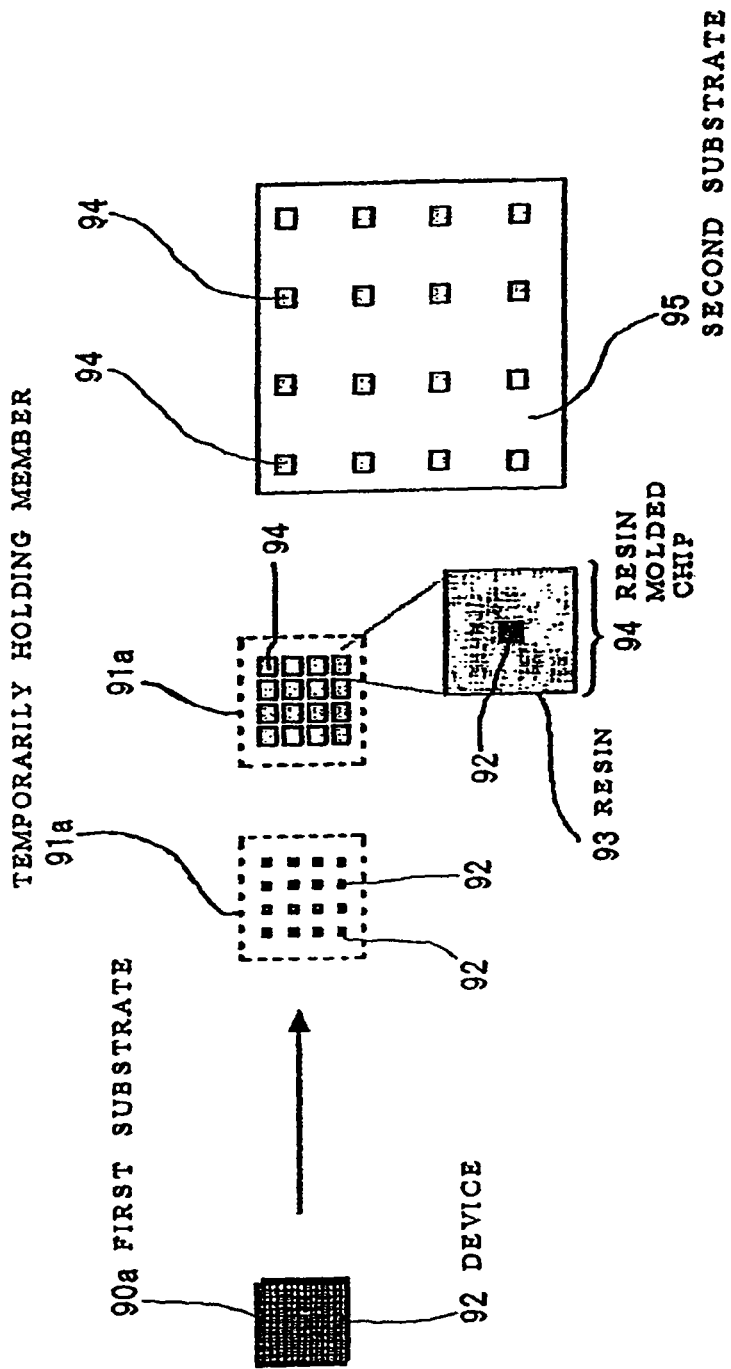
FIGS. 14A to 14D are schematic diagrams showing a method of arraying devices according to an embodiment of the present invention.

FIGS. 14A to 14D are views showing an embodiment according to the present invention that includes a modification of a previously described embodiment using a two-step enlarged transfer method (shown in FIGS. 13A to 13D). This modification is characterized by a transfer manner from a first substrate 90a to a temporarily holding member 91a. As shown in FIG. 14A, devices 92 such as light emitting devices, liquid crystal control devices, or the like are densely formed on the first substrate 90a. A number of the devices 92 are arrayed on the first substrate 90a in a matrix. Like the first substrate 90 shown in FIGS. 13A to 13D, the first substrate 90a is a substrate on which various kinds of devices can be formed, such as a semiconductor wafer, a glass substrate, a quartz glass substrate, a sapphire substrate, a plastic substrate, or the like. The devices 92 may be directly formed on the first substrate 90a, or may be formed on another substrate and arrayed on the first substrate 90a.

In an embodiment, after being formed in a matrix on the first substrate 90a, a number of the devices 92 are transferred to the temporarily holding member 90a while being spaced from each other. Thus, the temporarily holding member 91a is opposed to the first substrate 90a, and the devices 92 arrayed in a matrix on the first substrate 90a are transferred in a discrete transfer manner. According to the discrete transfer manner, when transferring one of the devices 92 on the first substrate 90a, those adjacent thereto are not transferred. More specifically, of all of the devices 92 arrayed on the first substrate 90a, those located at positions spaced from each other at intervals of a specific value are transferred to the temporarily holding member 91a opposed to the first substrate 90a. Thus, those adjacent to each of the devices 92, which have been transferred, remain on the first substrate 90a. However, by transferring the remaining devices 92 onto another temporarily holding member, all of the devices 92 densely formed on the first substrate 90a can be effectively used.

In an embodiment, transfer of the devices 92 onto the temporarily holding member 91a may be performed (as will be described later) by adopting a specific mechanical mechanism (e.g., using an attracting jig, an actuator, or the like). Alternatively, the devices 92 may be selectively transferred on the temporarily holding member 91a by coating the devices 92 with a resin causing a reaction such as softening, hardening, bridging, or deterioration due to heat or light, and locally irradiating selected ones of the devices 92 with heat or light, to thereby peel or adhesively bond the selected devices.

The transfer of the devices 92 may be performed by combination of the thermal or optical mechanisms and/or the mechanical mechanism.

In an embodiment, after the first transfer step, as shown in FIG. 14C, the devices 92 on the temporarily holding member 91a are present in a state being spaced from each other, and each of the devices 92 is covered with resin 93 and an electrode pad is formed for each of the devices 92. Subsequently, as shown in FIG. 14D, a second transfer step is carried out. In the second transfer step, the devices 92 in the form of resin molded chips 94 re-arrayed in a matrix on the temporarily holding member 91a are transferred on a second board 95 while being spaced from each other with a further enlarged pitch. The cover of each device with the resin 93 and the formation of each electrode pad and further the second transfer step are the same as those described with reference to FIGS. 13A to 13D, and also, formation of desired wiring performed after the two-step enlarged transfer is the same as that described with reference to FIGS. 13A to 13D.

In embodiments using two-step enlarged transfer such as those shown in FIGS. 13A to 13D and FIGS. 14A to 14D, each electrode pad and resin molding can be performed by making use of the spacing between adjacent two of the devices 92 after first transfer, and after second transfer, wiring can be performed without causing a connection failure by making use of the previously formed electrode pads. Accordingly, it is possible to improve the production yield of the image display unit.

Further, two-step enlarged transfer method according to an embodiment of the present includes two steps, in each of which the devices are spaced from each other. By carrying out such a number of enlarged transfer steps, the number of transfer can be actually reduced. For example, assuming that an enlargement ratio in pitch between the devices on the first substrate 90 or 90a and the devices on the temporarily holding member 91 or 91a is 2 (i.e., n=2) and an enlargement ratio in pitch between the devices on the temporarily holding member 91 or 91a and the devices on the second board 95 is 2 (i.e., m=2), the total transfer magnification becomes 4 (i.e., n×m=2×230=4). In order to realize the transfer magnification of 4, according to a one-step transfer method, the number of transfer (alignment) becomes 16 (i.e., 4×4) times.

On the contrary, according to an embodiment using a two-step enlarged transfer method, the number of transfer (alignment) is obtained by adding a square of the enlargement ratio (i.e., 2) in the first transfer step to a square of the enlargement ratio (i.e., 2) in the second transfer step, and therefore, the number of transfer becomes 8 (i.e., 22+22=4+4). More specifically, letting the enlargement ratios in the first and second steps be "n" and "m", respectively, according to an embodiment using a two-step enlarged transfer method, in order to achieve the total transfer magnification of n×m, the total number of transfer becomes (n2+m2) times. Meanwhile, according to one-step transfer method, in order to achieve the transfer magnification of n×m, the number of transfer becomes (n+m)2=n2+2 nm+m2. As a result, according to an embodiment using a two-step enlarged transfer method, the number of transfer can be made smaller than that according to the one-step transfer method by 2 nm times, thereby correspondingly saving time and costs required for the production step. This becomes more significant as the transfer magnification becomes larger.

In embodiments using a two-step enlarged transfer method such as those shown in FIGS. 13A to 13D and FIGS. 14A to 14D, each device 92 is configured as a light emitting device or a liquid crystal control device, but is not limited thereto and may be selected from a photoelectric transfer device, a piezoelectric device, a thin film transistor, a thin film diode, a resistance device, a switching device, a micro-magnetic device, a micro-optical device, the like and combinations thereof.

Figure 1:
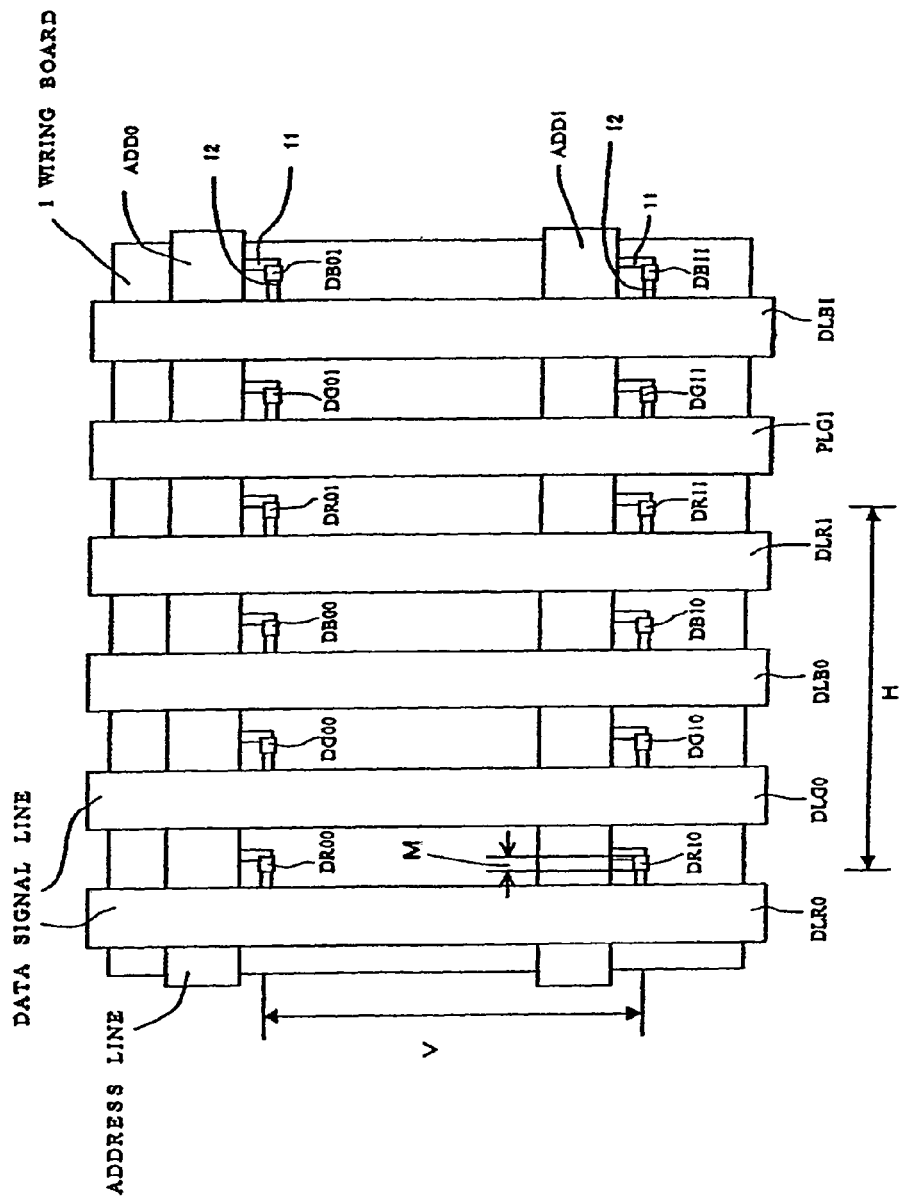
FIG. 1 is a schematic diagram showing a portion of an image display unit according to an embodiment of the present invention.

FIG. 1 is a schematic diagram of a portion of an image display unit according to an embodiment of the present invention, wherein the portion is equivalent to four pixel regions (i.e., two pixel regions in each of the vertical and horizontal directions). In the image display unit according to this embodiment, a number of address lines ADDO and ADD 1 extending in the horizontal direction are formed on a principal plane of a wiring board 1, and further, a number of data lines DLRO to DLB1 extending in the vertical direction are formed on the principal plane of the wiring board 1 via an interlayer insulating film (not shown). As the wiring board 1, a general-purpose board for fabricating a semiconductor device, such as a glass board, a metal board covered with a synthetic resin or an insulating film, a silicon board or the like is typically used. However, any other board may be also used insofar as address lines and data lines can be formed on the board with a necessary accuracy.

Figure 22:
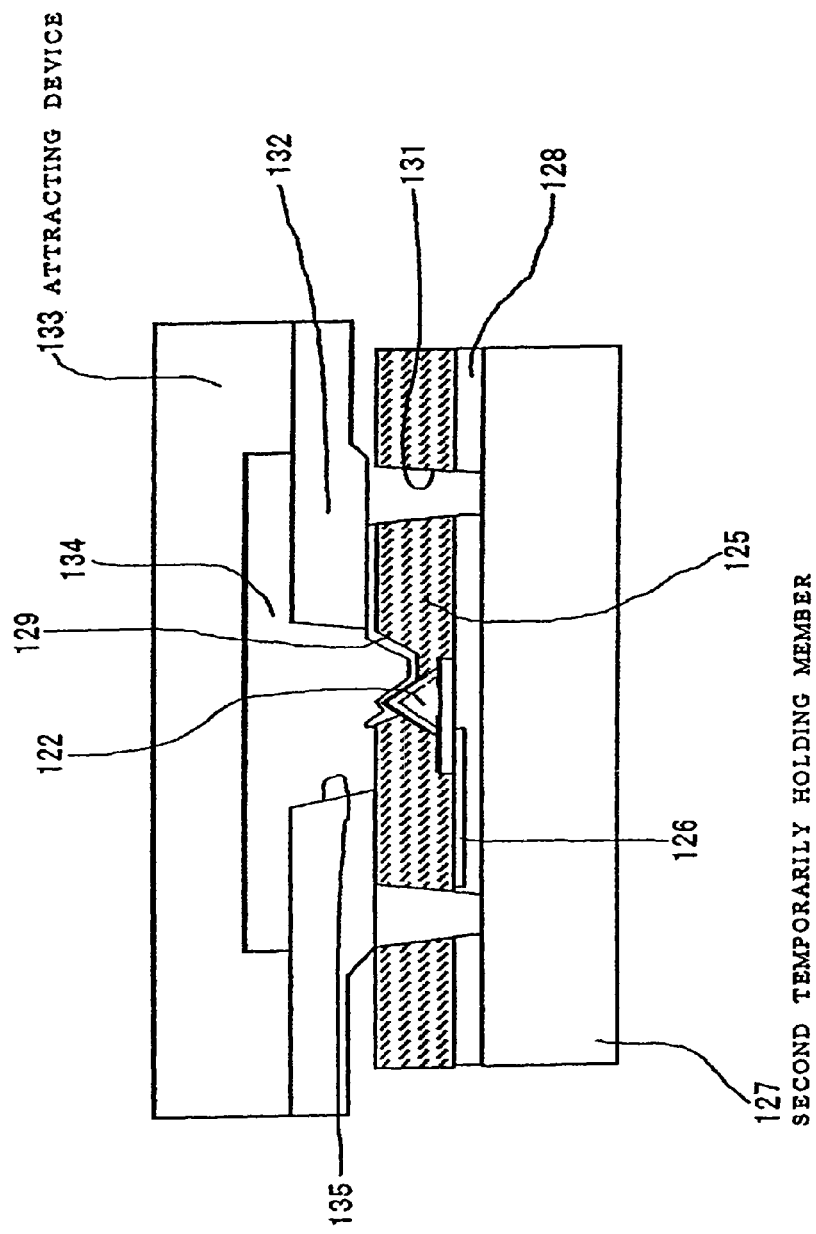
FIG. 22 is a sectional view showing a step of attracting a selected light emitting device in a method of arraying light emitting devices according to an embodiment of the present invention.

The address lines ADDO and ADD 1 are formed by a metal material layer excellent in conductivity, a combination of a semiconductor material layer and a metal material layer, or the like. A line width of each address line can be, as shown in FIG. 22, made wider than a size M of a light emitting diode. Such a relationship can be realized due to the fact that, as will be described later, micro-sized light emitting diodes, each having an occupied area about 25 1.im2 or more, about 10,000 μm2 or less, preferably ranging from about 25 μm2 to about 10,000 μm2 are mounted on the wiring board 1. With this relationship, a delay due to a resistance of each address line when outputting a desired image by sequentially scanning pixels is maximally reduced. The address lines ADDO and ADD 1 extend in the horizontal direction such that one address line passes through each pixel. Accordingly, a common address line is selected for pixels adjacent to each other in the horizontal direction.

Like the address lines, the data lines DLRO to DLB 1 are formed by a metal material layer excellent in conductivity, a combination of a semiconductor material layer and a metal material layer, or the like. As shown in FIG. 1, line widths of the data lines DLRO to DLB 1 can be set to take up about a half of an occupied area of the wiring board 1. Such a wider line width of the data line can be realized due to the fact that, as described above with respect to the address line, micro-sized light emitting diodes, each having an occupied area of about 25 μm2 or more, about 10,000 μm2 or less, preferably ranging from about 25 μm2 to about 10,000 μm2 are mounted on the wiring board 1. These data lines DLRO to DLB 1 extend in the vertical direction, and data lines of the number corresponding to that of the light emitting diodes, that is, three data lines are used for each pixel. More specifically, a red light emitting diode DROO, a green light emitting diode DGOO, and a blue light emitting diode DBOO are provided in the pixel positioned on the upper left side of the figure, and the data lines DLRO to DLBO pass through the pixel so as to correspond to the colors, that is, red, green and blue (R, G, and B) of the light emitting diodes DROO, DGOO and DBOO, respectively. With respect to these data lines DLRO to DLB1, a common data line is used for the diodes of the same luminous color, the diodes being disposed in the pixels adjacent to each other in the vertical direction.

The image display unit according to this embodiment has light emitting diodes arrayed in a matrix, and performs light emission in response to a specific image signal (including a video signal, that is, a dynamic image, the same applying correspondingly to the following). The image display unit in this embodiment is driven by a point-sequence manner or a line-sequence manner, like an active matrix type liquid crystal display unit, or the like. As materials of light emitting diodes, for example, a multi-layer structure having a gallium nitride based double-hetero structure grown on a sapphire substrate can be used for a blue or green light emitting diode, and a multi-layer crystal having an aluminum gallium arsenide or indium aluminum gallium phosphide based double-hetero structure grown on a gallium arsenide substrate can be used for a red light emitting diode. A set of three kinds of light emitting diodes as three light emitting devices, which are different from each other in emission wavelength, constitute one pixel. The set of three kinds of light emitting diodes different from each other in emission wavelength are not necessarily limited to a set of light emitting diodes for emitting light rays of red, green, and blue, but may be a set of light emitting diodes for emitting light rays of other colors.

In an embodiment, the red light emitting diodes DROO and DR01 are provided in the two pixels horizontally arranged on one row and the red light emitting diodes DR10 and DR11 are provided in the two pixels horizontally arranged on the next row. The green light emitting diodes DGOO and DG01 are provided in the two pixels horizontally arranged on one row and the green light emitting diodes DG10 and DG11 are provided in the two pixels horizontally arranged on the next row. The blue light emitting diodes DBOO and DBO1 are provided in the two pixels horizontally arranged on one row and the blue light emitting diodes DB 10 and DB 11 are provided in the two pixels horizontally arranged on the next row. For example, the red light emitting diode DROO, the green light emitting diode DGOO, and the blue light emitting diode DBOO are arrayed in the pixel located at the upper left side of the figure. Thus, the set of these three light emitting diodes constitute one pixel.

Each light emitting diode has an approximately square shape, and has a chip structure being mounted in a non-package state or in a micro-package state (e.g., about 1 mm or less). While a detailed layer structure of the light emitting diode is not shown in the layout of FIG. 1, each light emitting diode is formed into an approximately square shape in a plan view. Such approximately square shaped chips of the light emitting diodes are mounted in a matrix. The light emitting diodes are located at positions corresponding to positions at which the address lines ADDO and ADD1 cross the data lines DLRO to DLB 1. Each light emitting diode is electrically connected to the address line via an electrode pad portion 11 connected to the address line, and similarly, electrically connected to the data line via an electrode pad portion 12 connected to the data line. The electrode pad portion 11 is a small strip-like region extending in the vertical direction, and the electrode pad portion 12 is a small strip-like region extending in the horizontal direction. The light emitting diodes are electrically connected to the address lines and the data lines via the electrode pad portions 11 and 12, and are driven in the point-sequence manner, a line-sequence manner, or the like.

Since the device occupied area of each light emitting diode ranges from about 25 μm2 to about 10,000 μm2, the size of each side of the light emitting diode having an approximately square shape ranges from about 5 gm to about 100 μm. The light emitting diode having such a micro-size is mounted on the wiring board 1 in a micro-package state or a non-package state. Preferably, the light emitting diode can be produced in accordance with a method of producing a light emitting diode (to be described later).

In an embodiment, the pixels are arrayed with a pitch of V in the vertical direction and are arrayed with a pitch of H in the horizontal direction. The array pitches V and H are each set to a value ranging from about 0.1 mm to about 1 mm. This is done because in image display units for displaying dynamic images (for example, television receivers, video equipment, game devices, or the like), or for displaying information images (for example, used for computers or the like), a suitable diagonal size thereof ranges from about 30 cm to about 150 cm, and the number of pixels, each including a set of diodes of R, G, and B, may be desirable in a range from about 300,000 to about 2,000,000 pieces from the practical viewpoint. Further, in direct-viewing image display units, the array pitch of pixels may be desirable to be in a range of about 0.1 mm (i.e., display of high definition images for one viewer) to about 1 mm (i.e., display of dynamic images for several viewers) from the viewpoint of a human visible characteristic. As a result, when one side of each light emitting diode is set to a value ranging from about 5 µm to about 100 µm, a ratio of an occupied area of each light emitting diode to an occupied area of one pixel on the image display unit preferably ranges from about 10 to about 40,000, and more preferably, from about 10 to about 10,000.

A light emitting device of an ordinary image display unit typically has, in the state before resin package, a chip size of about 0.3 mm and has, in the state after resin package, a chip size exceeding 1 mm, such as about 3 mm to about 4 mm in length of each side of an approximately square-shaped chip. Accordingly, assuming that the array pitch of pixels is set to about 5 mm, a ratio of an occupied area of each light emitting diode to an occupied area of one pixel on the image display unit ranges from about 1 to about 2. This ratio, that is, about 1 to about 2, is out of the ratio of an occupied area of each light emitting diode to an occupied area of one pixel on the image display unit according to an embodiment, which preferably ranges from about 10 to about 40,000, and more preferably, from about 10 to about 10,000 (as described above).

Although the image display unit according to this embodiment includes light emitting diodes of such micro-chip sizes, it is able to obtain a sufficient luminance (as described below). A necessary luminance of a display unit of an indoor type is about 500 cd/m2. Such a luminance is converted into a light output of about 5 W/m2 for each of R, G, and B. To enable an image display unit to realize the light output of about 5 W/m2 for each of R, G, and B, an average light output of each light emitting diode may range from about 0.017 µW to about 1.7 µW. Assuming that a reliability of the light emitting diodes, each of which has an average light output of about 0.017 µW to about 1.7 µW, is equal to that of ordinary light emitting diodes, if a drive current density of the above light emitting diodes is equal to that of the ordinary light emitting diodes, then each of the light emitting diodes may have a size of about 1 µm2 to about 100 µm2, even when adding a slight margin. As a result, by setting an occupied-area-of each of light emitting diodes to be mounted on a wiring board to a value in the range from about 25 µm2 to about 10,000 µm2, the image display unit can realize a sufficient luminance as well as a sufficient reliability.

Each light emitting diode to be mounted as being in a micro-size state has the above-described size, and according to a production method of the present invention, these light emitting diodes are formed on a device forming board, being separated into chips, and mounted on a mounting board in a non-package state or a micro-package state. The non-package state is a state in which each diode chip is not covered with resin molding, and the micro-package state is a state in which the diode chip is covered with a thin resin layer or the like and has a package size (for example, about 1 mm or less) smaller than that of an ordinary package size. Accordingly, having no-package or having a micro-package allows each light emitting diode used for the image display unit according to this embodiment to realize a micro-size state.

An image display unit according to an embodiment will be described below with reference to FIGS. 2 and 3. This embodiment is a modification of an image display unit according to a previously discussed embodiment, and is particularly characterized by a current retention circuit that is electrically connected to each light emitting diode and is mounted in a chip state.

Figure 2:
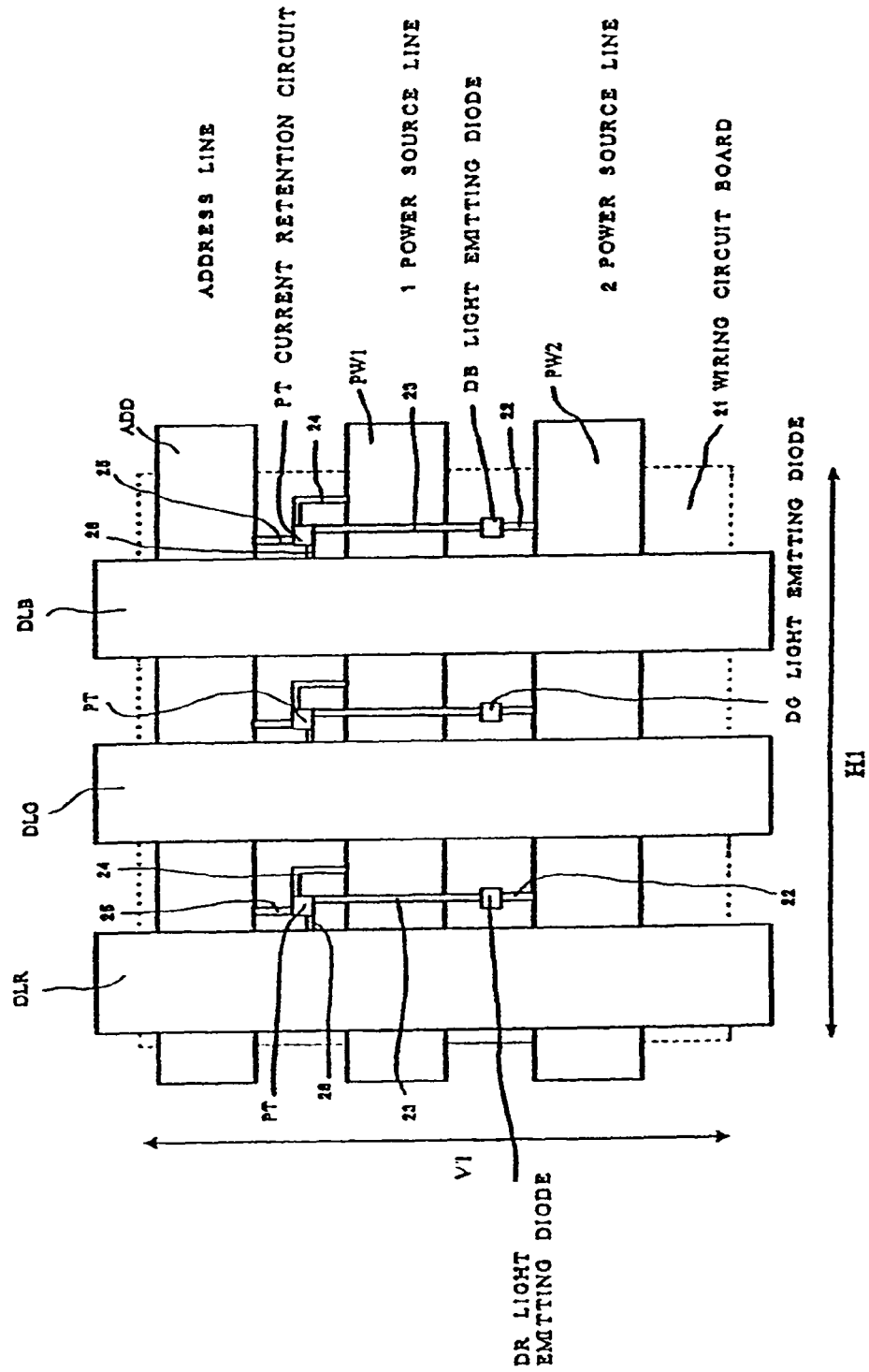
FIG. 2 is a schematic diagram showing a portion of an image display unit according to an embodiment of the present invention.

FIG. 2 is a schematic diagram showing a structure of one pixel region (V1×H1) within the image display unit according to this embodiment. One address line ADD and two power source lines PW1 and PW2 extending in the horizontal direction are formed on a wiring board 21 (similar to that used in a previously discussed embodiment) such as to be spaced from each other with a specific pitch. The address line ADD and two power source lines PW1 and PW2 are formed by a metal material layer excellent in conductivity, or a combination of a semiconductor material layer and a metal material layer, or the like, and a line width of each of these lines is wider than a size of a light emitting diode and a chip of a current retention current. Signal lines DLR, DLG, and DLB for the light emitting diodes of R, G, and B extending in the horizontal direction are formed within the same pixel, and each of these signal lines DLR, DLG, and DLB has the same structure and dimension as those of the address line ADD.

In an embodiment, light emitting diodes DR, DG, and DB are arrayed in a matrix, and are used for light emission in response to a specific image signal. In this pixel, the red light emitting diode DR, the green light emitting diode DG, and the blue light emitting diode DB are arrayed in this order. A set of the three light emitting diodes constitute one pixel. Like the above-described embodiment, each of the light emitting diodes DR, DG, and DB in a mounted state has a chip structure. formed into an approximately square shape having a micro-size. The light emitting diodes DR, DG, and DB are mounted in a region between the power supply lines PW1 and PW2.

In an embodiment, current retention circuits PT, which are electrically connected to the light emitting diodes DR, DG, and DB for retaining currents flowing in the light emitting diodes DR, DG, and DB are formed for the light emitting diodes DR, DG, and DB, respectively. The current retention circuit PT has a circuit configuration including transistors and a capacitance (which will be described later). In particular, the current retention circuits PT are formed into individual chips and are mounted on the wiring board 21.

In an embodiment, the chip size of each of the light emitting diodes DR, DG, and DB is substantially the same as the chip size of each of the current retention circuits PT, and an occupied area of each light emitting diode is set in a range from about 25 µm2 to about 10,000 µm2, and an occupied area of the chip of each current retention circuit PT is similarly set in a range from about 25 µm2 to about 10,000 µm2. By making the chip size of each current retention circuit nearly equal to that of each light emitting diode, the chips of the current retention circuits and the chips of the light emitting diodes can be mounted in the same mounting step, thereby simplifying the production steps. The current retention circuits PT are formed in a region between the power source line PW1 and the address line ADD.

In an embodiment, wiring portions 22 to 26 are formed, from the need of wiring, between the power source line PW2 and the light emitting diodes DR, DG, and DB, between the light emitting diodes DR, DG, and DB and the current retention circuits PT, between the power source line PW1 and the current retention circuits PT, between the current retention circuits PT and the address line ADD, and between the current retention circuits PT and the signal lines DLR, DLG, and DLB.

According to an embodiment of the present invention, the wiring portions 22 are small strip-like regions extending in the vertical direction, thereby connecting the light emitting diodes to the power source line PW2. The wiring portions 23 are strip-like regions extending in the vertical direction, thereby connecting the light emitting diodes DR, DG, and DB to the current retention circuits PT for retaining currents for driving the light emitting diodes DR, DG, and DB, respectively. The wiring portions 24 are strip-like regions horizontally extending from the light emitting diodes and vertically extending to be connected to the power source line PWl, thereby connecting the current retention circuits PT to the power source line PW1. The wiring portions 25 are small strip-like regions extending in the vertical direction, thereby connecting the current retention circuits PT to the address line ADD. The wiring portions 26 are small strip-like regions extending in the horizontal direction, thereby connecting the current retention circuits PT to the signal lines DLR, DLG, and DLB.

When the light emitting diodes DR, DG, and DB are mounted on a wiring board as being in micro-size states according to an embodiment of the present invention, the corresponding members of the wiring portions 22 to 26 can be joined to conductive material joining portions (to be described later) formed on the wiring board, and similarly, when the current retention circuits PT are mounted on the wiring board as being in micro-size states, the corresponding members of the wiring portions 22 to 26 can be joined to conductive material joining portions (to be described later) formed on the wiring board.

Figure 3:
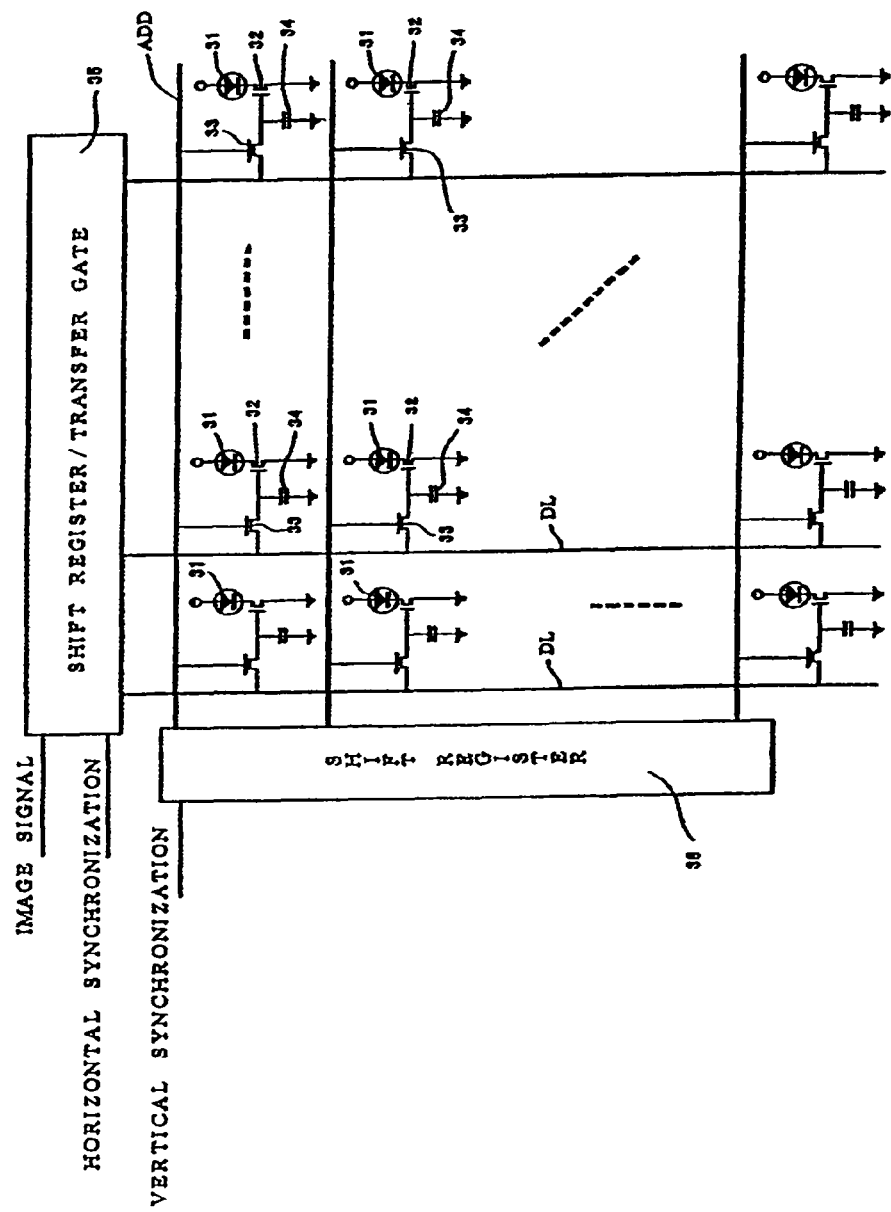
FIG. 3 is a circuit diagram showing an image display unit according to an embodiment of the present invention.

FIG. 3 is a circuit diagram showing the image display unit according to an embodiment of the present invention. Reference numeral 31 designates a light emitting diode for light emission of a specific color in response to an image signal. It should be noted that three pieces of the diodes 31 of R, G, and B arrayed in the horizontal direction constitute one pixel. However, for simplicity, these diodes 31 are shown without reference to colors. Transistors 32, 33 and a capacitance (e.g., a capacitor or the like) 34 connected to the diode 31 constitute the current retention circuit. The transistor 32 is connected in series between the power source lines PW1 and PW2, and only when the transistor 32 is in an ON state does the diode 31 perform light emission. One of the power source lines PW1 and PW2 supplies a ground voltage to the transistor 32 and the other supplies a source voltage to the transistor 32. One terminal of the capacitor 34 and one of source and drain regions of a transistor 33 functioning as a switching transistor are connected to a gate of the transistor 32. The other of the source and drain regions of the transistor 33 is connected to the signal line DL to which an image signal is supplied, and a gate of the transistor 33 is connected to the address line ADD extending in the horizontal direction.

The address line ADD has a structure in which a level thereof is selectively switched by a shift register circuit 36. For example, by shifting one of a number of address lines to a high level, a horizontal address corresponding to the selected address line is selected. The signal line DL is wiring for transmitting an image (e.g., video) signal to each light emitting diode 31. One signal line DL is provided for each light emitting diode 31. While the level of the address line ADD is selectively shifted by the shift register circuit 36, the signal line DL is scanned by a shift register/transfer gate circuit 35, and an image signal is supplied to the selected signal line DL via the shift register/transfer gate circuit 35.

The capacitor 34, which is connected to the gate of the transistor 32 and is connected to one of the source and drain regions of the transistor 33, functions to hold a potential of the transistor 32 when the transistor 33 switches to an OFF state. Since the gate voltage can be held even if the transistor 33 is turned off, the light emitting diode 31 can be continuously driven.

The operation of an image display unit according to an embodiment of the present invention will be briefly described below. A voltage is applied from the shift register circuit 36 to a specific one of the horizontal address lines ADD, to select an address corresponding to the selected address line ADD, whereby the switching transistors 33 of the current retention circuits in the selected line are turned on. In such a state, an image signal is applied as a voltage to a specific one of the signal lines DL extending in the vertical direction. At this time, the voltage reaches the gate of the transistor 32 of each of the current retention circuits along the selected signal line DL via the switching transistor 33 of the current retention circuit, and simultaneously, the gate voltage is stored in the capacitor 34 of the current retention circuit. The capacitor 34 holds the gate voltage of the transistor 32. Even after the selecting operation of the address line ADD in the horizontal direction is stopped and thereby the potential of the selected address line is shifted again to the low level, that is, even after the transistor 33 is turned off, the capacitor 34 continuously holds the gate voltage. In principle, the capacitor 34 can continuously hold the gate voltage applied at the time of address selection until the next address selection occurs. During a period in which the capacitor 34 continuously holds the gate voltage, the transistor 32 can perform the operation associated with the voltage thus held, thereby continuously applying a drive current to the corresponding light emitting diode 31. By holding a light emission time of the light emitting diode 31 longer (as described above), a luminance of the entire image can be enhanced even if a drive current applied to each emitting diode is reduced.

A method of producing the image display unit according to an embodiment of the present invention will be described in detail with reference to FIGS. 4 to 12. In addition, the method of producing the image display unit can be applied to a method of producing light emitting devices. More specifically, description of the beginning steps of the method of producing the image display unit until the light emitting devices are mounted on a wiring board is equivalent to description of the method of producing light emitting devices.

Figure 4:
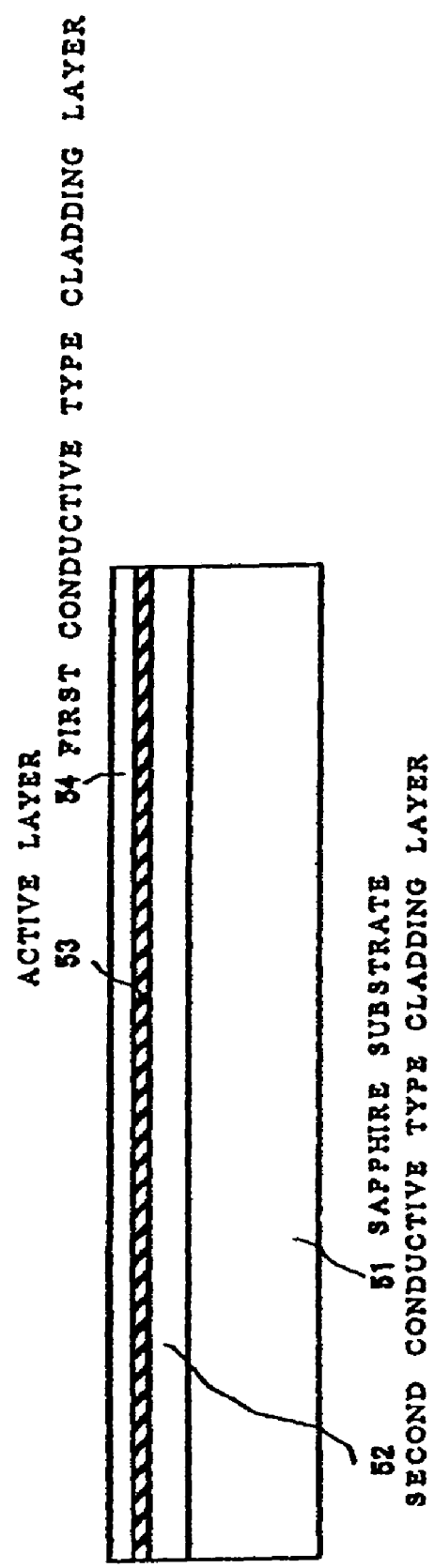
FIG. 4 is a sectional view showing a step of forming a crystal layer in a method of producing an image display unit according to an embodiment of the present invention.

In an embodiment, as shown in FIG. 4, a sapphire substrate 51 is first prepared, and low temperature and high temperature buffer layers (not shown) are formed thereon. A second conductive type cladding layer 52, an active layer 53, and a first conductive type cladding layer 54 are sequentially stacked on the buffer layers. The sapphire substrate 51 is configured as a device formation substrate. Here, for example, when producing blue and green light emitting diodes, each of the second conductive type cladding layer 52, the active layer 53, and the first conductive type cladding layer 54 may be configured as a gallium nitride based crystal growth layer. With the growth of such layers, light emitting diodes of a double-hetero structure having a pn-junction are formed on the sapphire substrate 51.

Figure 5:
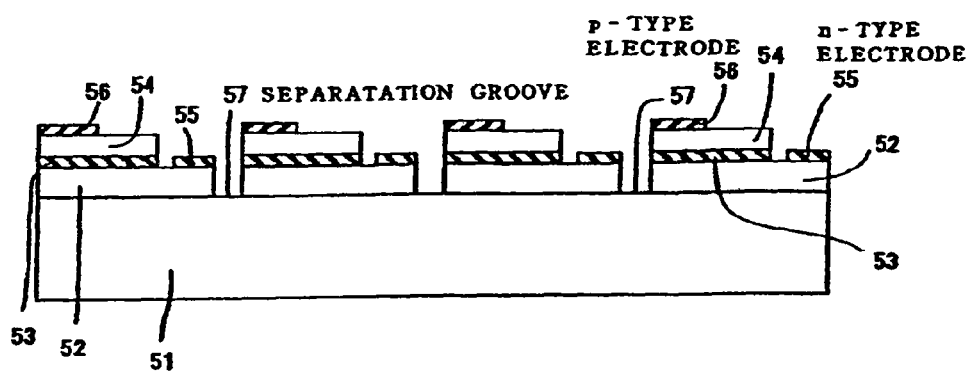
FIG. 5 is a sectional view showing a step of forming separation grooves in a method of producing an image display unit according to an embodiment of the present invention.

In an embodiment, as shown in FIG. 5, n-type electrodes 55 are formed such as to be connected to the second conductive type cladding layer 52 and p-type electrodes 56 are formed such as to be connected to the first conductive type cladding layer 54, by making use of a photolithography technique and further use of vapor-deposition and reactive ion etching. After formation of the electrodes 55, 56 in respective device forming areas, separation grooves 57 are formed such as to separate peripheries of respective devices from each other. An arrangement pattern of the separation grooves 57 is generally set to a grid pattern for forming remaining light emitting diodes into square shapes. However, it is not limited thereto but may be set to any other pattern. A depth of the separation grooves 57 is set to a value allowing a principal plane of the sapphire substrate 51 to be exposed from the stacked layers to the outside. Accordingly, even the second conductive type cladding layer 52 is separated into parts by the separation grooves 57. In addition, an occupied area of each light emitting diode is set in a range from about 25 1.tm2 to about 10,000 μm2, and accordingly, one side of the light emitting diode ranges from about 5 p.m to about 100 p.m.

Figure 6:
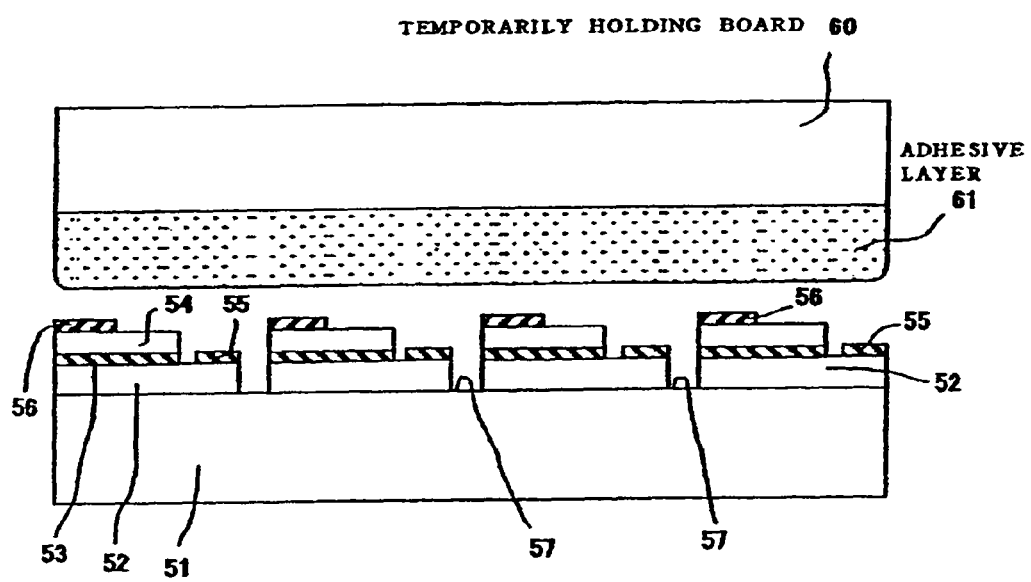
FIG. 6 is a sectional view showing a step of pressing light emitting devices to a temporarily holding board in a method of producing an image display unit according to an embodiment of the present invention.

In an embodiment illustrated in FIG. 6, a temporary or temporarily holding board 60 for temporarily holding respective light emitting diodes when transferring the light emitting diodes is prepared. A front surface of the temporarily holding board 60 is coated with an adhesive material layer. A front surface of the adhesive material layer 61 is brought into press-contact with a light emitting diode side, on which the separation grooves 57 have been already formed, of the sapphire board 51. Accordingly, front surfaces of respective light emitting diodes are adhesively bonded to the front surface of the adhesive material layer 61.

Figure 7:
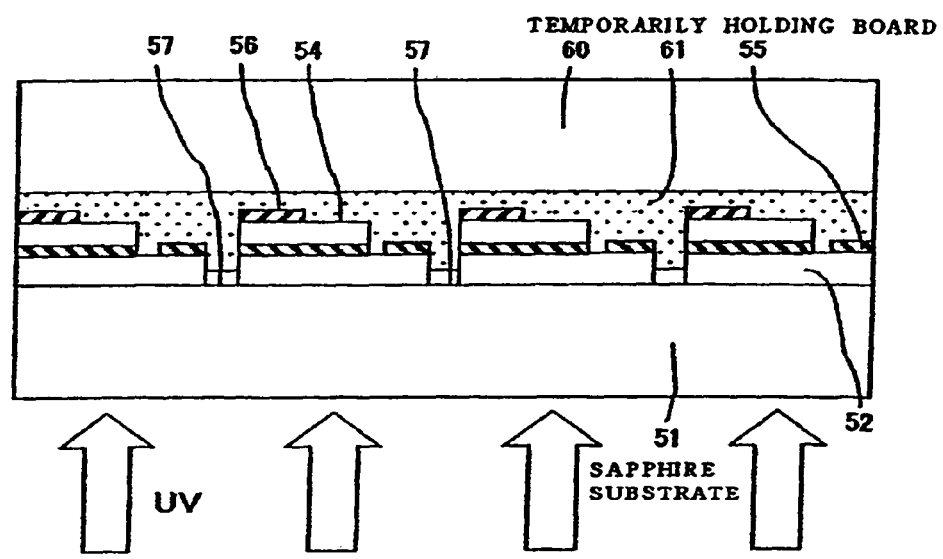
FIG. 7 is a sectional view showing a step of irradiating light emitting devices with an energy beam in a method of producing an image display unit according to an embodiment of the present invention.
Figure 8:
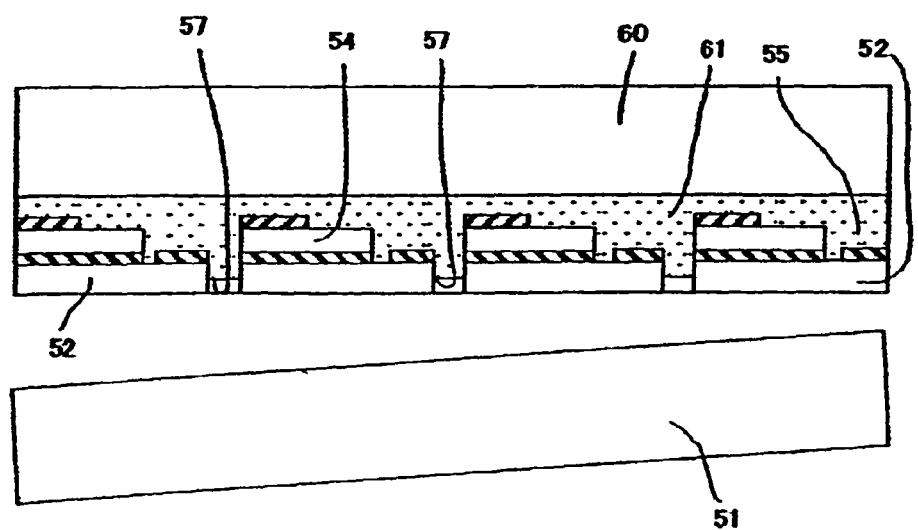
FIG. 8 is a sectional view showing a step of peeling light emitting devices from a substrate for growth in a method of producing an image display unit according to an embodiment of the present invention.

Subsequently, in an embodiment shown in FIG. 7, a back surface side of the sapphire substrate 51 is irradiated with an energy beam, typically, a high output pulse ultraviolet laser beam or the like such as an excimer laser beam such that the energy beam passes through the sapphire substrate 51 from the back surface side to the front surface side. With this irradiation by the high output pulse ultraviolet laser beam, at a boundary between the sapphire substrate 51 and the second conductive type cladding layer 52 as the crystal layer and its neighborhood, a material forming the second conductive type cladding layer 52, for example, gallium nitride is decomposed into nitrogen gas and metal gallium, whereby a bonding force between the second conductive type cladding layer 52 and the sapphire substrate 51 becomes weak. As a result, as shown in FIG. 8, the sapphire substrate 51 can easily be peeled from the second conductive type cladding layer 52 as the crystal layer.

Figure 9:
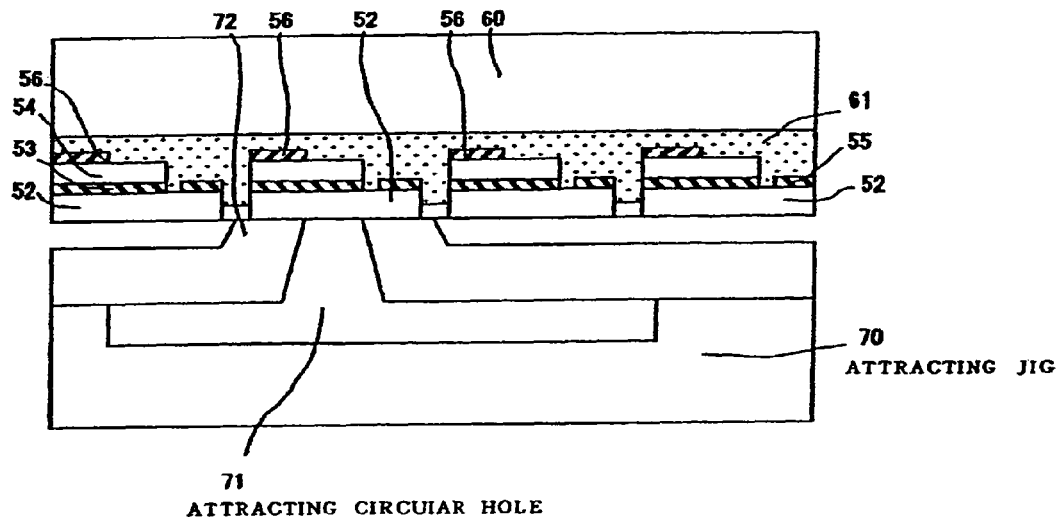
FIG. 9 is a sectional view showing a step of attracting light emitting devices in a method of producing an image display unit according to an embodiment of the present invention.

After being peeled from the sapphire substrate 51, each light emitting diode is held, in the device separated state, on the adhesive material layer 61 of the temporarily holding board 60. In such a state, as shown in FIG. 9, a portion, located at a position of one light emitting diode to be attracted, of the front surface of the second conductive type cladding layer 52 is attracted by an attracting jig 70 (i.e., a tool, device, or mechanism to guide and assist in the completion of the attraction process). More specifically, an attracting portion 72 of the attracting jig 70 is brought into contact with the portion, corresponding to the light emitting diode to be attracted, of the back surface of the second conductive type cladding layer 52, and an inner pressure in an attracting hole 71 provided in the attracting jig 70 is reduced. The attracting operation necessary for attracting the light emitting diode to be attracted is thus performed.

Figure 10:
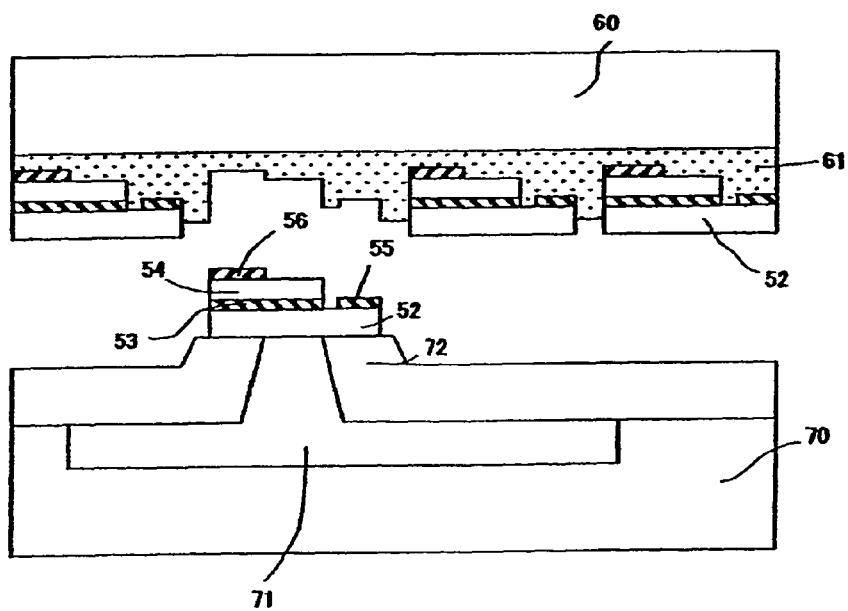
FIG. 10 is a sectional view showing a step of separating a selected light emitting device in a method of producing an image display unit according to an embodiment of the present invention.

After the portion, corresponding to the light emitting diode to be attracted, of the back surface of the second conductive type cladding layer 52 is sufficiently attracted, the attracting jig 70 is separated from the temporarily holding board 60, to remove the light emitting diode to be attracted from the temporarily holding board 60, as shown in FIG. 10.

Figure 11:
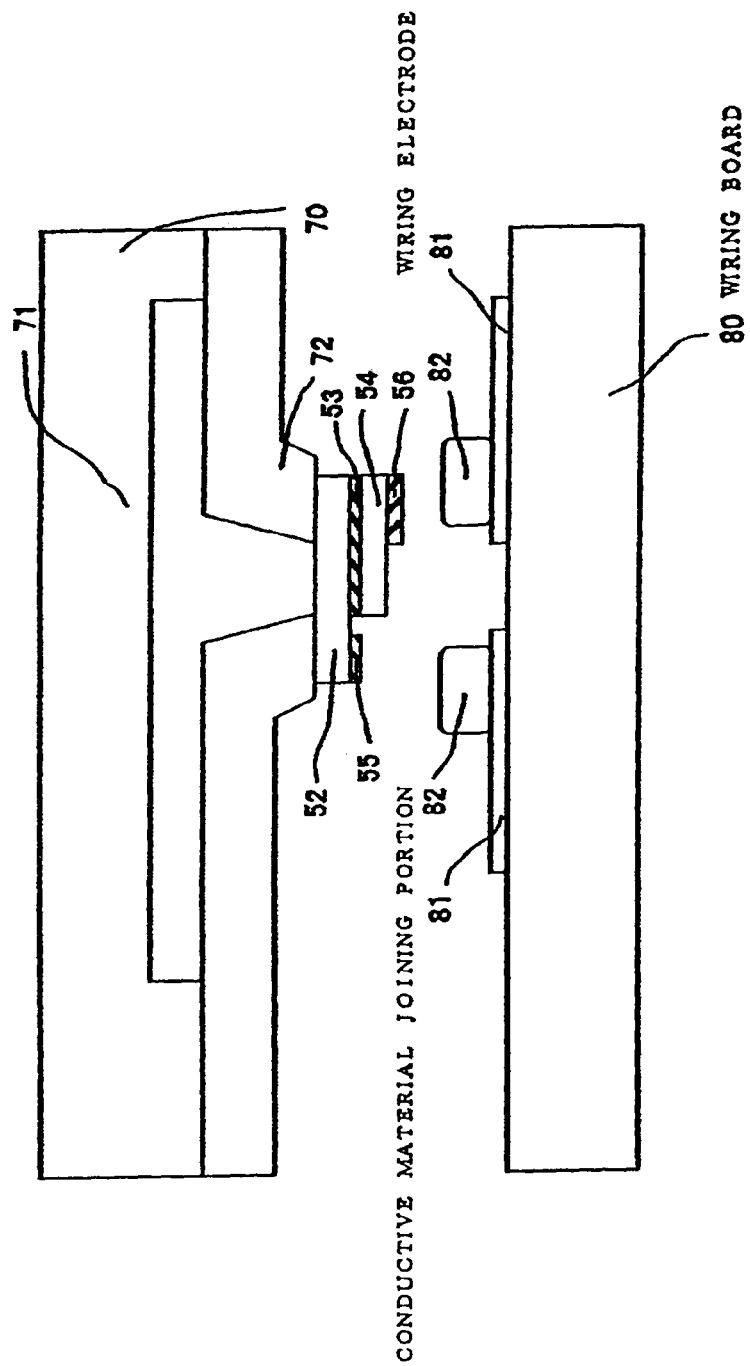
FIG. 11 is a sectional view showing a state immediately before a light emitting device is mounted in a method of producing an image display unit according to an embodiment of the present invention.

The above-described steps also pertain to the method of producing individual light emitting devices of small sizes according to an embodiment of the present invention. In an embodiment, the above-described steps are followed by steps of mounting each light emitting diode on a wiring board, thereby producing an image display unit. FIG. 11 is a sectional view showing a state immediately before the light emitting diode attracted on the attracting jig 70 is mounted on a wiring board 80. The light emitting diode to be mounted has a micro-size. Specifically, an occupied area of the light emitting diode is set in a range from about 25 μm2 to about 10,000 μm2. In this step, the wiring board 80 has been already prepared, on which wiring electrodes 81 such as specific signal lines, address lines, power source lines, ground lines, and the like have been already formed.

As the wiring board 80, a general-purpose board for fabricating a semiconductor device, such as a glass board, a metal board covered with a synthetic resin or an insulating film, a silicon board, or the like is typically used. However, any other board may be also used insofar as address lines and data lines can be formed on the board with a necessary accuracy. Conductive material joining portions 82 are formed on the wiring board 80. The conductive material joining portion 82 may be made from a material capable of achieving electric connection while being deformed when the light emitting diode is brought into press-contact therewith.

Figure 12:
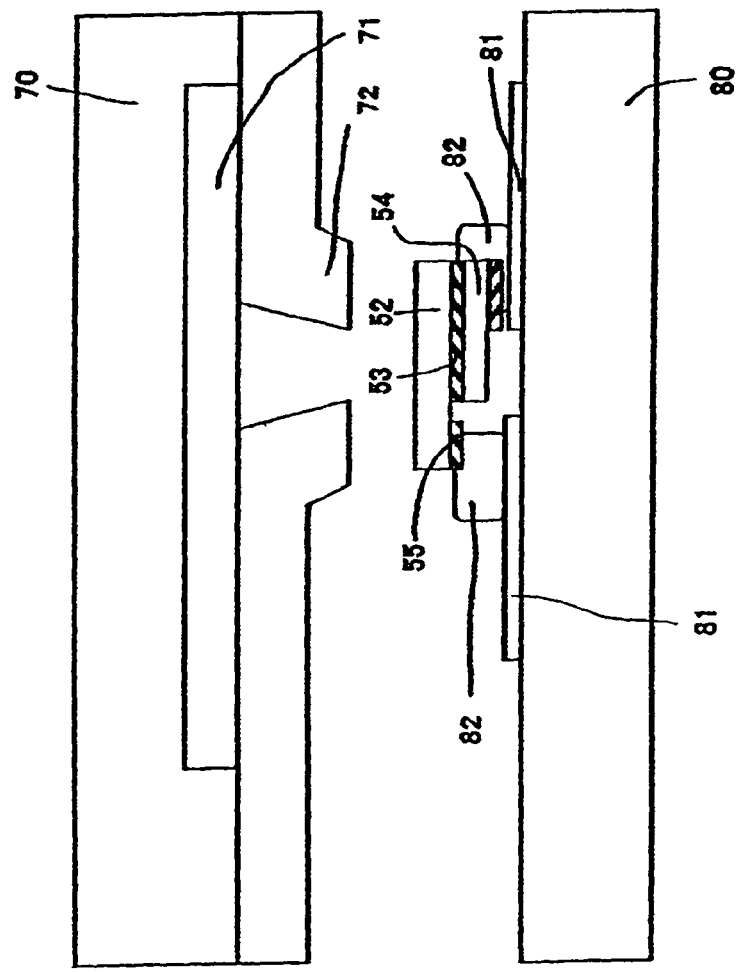
FIG. 12 is a sectional view showing a state after a light emitting device is mounted in the method of producing an image display unit according to an embodiment of the present invention.

As illustrated in FIG. 12, in an embodiment, the attracting jig 70 is moved closer to the wiring board 80, and then the light emitting diode is brought into press-contact with a specific position, to be thus mounted on the wiring board 80. The conductive material joining portions 82 are deformed by press-contact of the light emitting diode in a non-package state, so that the light emitting diode is certainly fixed thereto. The mounting of the light emitting diode on the wiring board 80 is thus ended. The work of mounting the light emitting diode is repeated for all the diodes, to obtain an image display unit in which pixels are arrayed in a matrix. The current retention circuits can be similarly mounted on the wiring board as being in non-package states, so that a circuit configuration having the current retention circuits can easily be produced.

When carrying out a method of producing an image display unit according to an embodiment of the present invention, micro-chips of light emitting diodes formed on a gallium nitride substrate or light emitting diodes formed on a silicon substrate, and micro-chips of circuit devices can be formed not by only using laser means but by a combination of grinding, polishing and chemical etching from the back surface of the substrate and etching for forming separation grooves.

In the above-described embodiment, light emitting diodes are attracted one by one to be mounted. However, to improve productivity, a number of light emitting diodes can simultaneously be attracted by using a jig having a number of attracting portions. Further, when forming devices on a silicon substrate or a compound semiconductor substrate, the use of irradiation of an energy beam adopted in the above-described embodiment may be replaced with the use of grinding, polishing and chemical etching from the back surface of the substrate.

It should be appreciated that since LEDs (Light Emitting Diodes) as light emitting devices are expensive, an image display unit using LEDs can be produced at a lower cost by producing a number of LEDs from one wafer as described above. For example, the cost of an image display unit can be reduced by separating an LED chip that has, for example, a size of about 300 micrometers (e.g., the size of each side of an approximately square-shaped chip), an mounting the LEDs chips thus separated on a board.

FIGS. 15A to 15D are views showing an embodiment using discrete transfer, similar to the embodiment shown in FIGS. 14A and 14B. The discrete transfer is performed by selectively transferring devices from a supply side substrate to a reception side board (member). Thus, by making the size of the reception side board (member) sufficiently large, all of the devices on the supply side substrate can be transferred to the reception side board (member).

FIGS. 15A to 15D show an embodiment in which an enlargement ratio in a first transfer step is 3. A temporarily holding member 91c has an area being 9 (i.e., 3×3) times an area of a first substrate 90c. To transfer all of devices 92 on the first substrate 90c as the supply side substrate to the temporarily holding member 91c, the transfer operation is repeated 9 times. A matrix pattern of the devices 92 on the first substrate 90c is divided into 3×3 matrix units. Nine pieces of the devices 92, each of which is in one of the 3×3 matrix units, are transferred to the temporarily holding member 91. Such transfer is repeated 9 times, whereby all of the devices 92 on the first substrate 90c are transferred to the temporarily holding member 91c.

Figure 15:
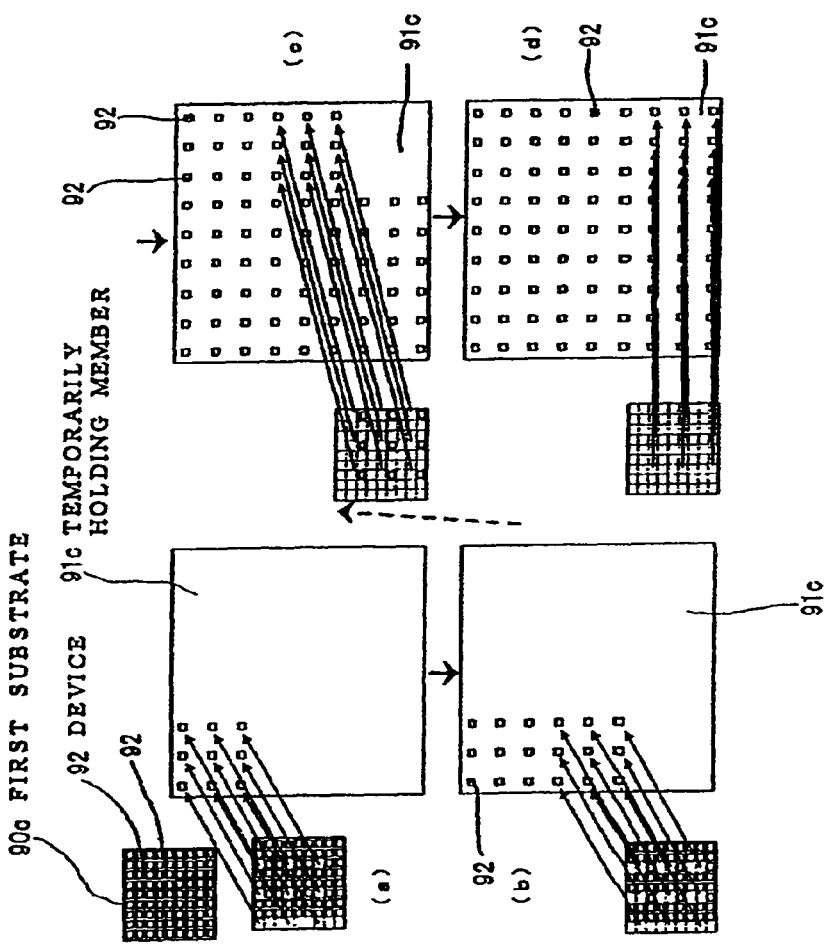
FIGS. 15A to 15D are schematic diagrams showing discrete transfer in a method of arraying devices according to an embodiment of the present invention.

FIG. 15A schematically shows a state in which of the devices 92 on the first substrate 90c, a first group of the devices 92, which are located at first positions in the 3×3 matrix units, are transferred to the temporarily holding member 91c. FIG. 15B schematically shows a state in which a second group of the devices 92, which are located at second positions in the 3×3 matrix units, are transferred to the temporarily holding member 91c. In the second transfer, the discrete transfer is performed after the alignment position of the first substrate 90c to the temporarily holding member 91c is shifted in the vertical direction in the figure. FIG. 15C schematically shows a state in which an eighth group of the devices 92, which are located at eighth positions in the 3×3 matrix units, are transferred to the temporarily holding member 91c. FIG. 15D schematically shows a state in which a ninth group of the devices 92, which are located at ninth positions in the 3×3 matrix units, are transferred to the temporarily holding member 91c. After the ninth transfer is ended, none of the devices 92 remain on the first substrate 90c, and the devices 92 are held in a matrix on the temporarily holding member 91c while being spaced from each other. Subsequently, two-step enlarged transfer is carried out in accordance with the same steps as those shown in FIGS. 13C and 13D and FIGS. 14C and 14D.

Figure 16:
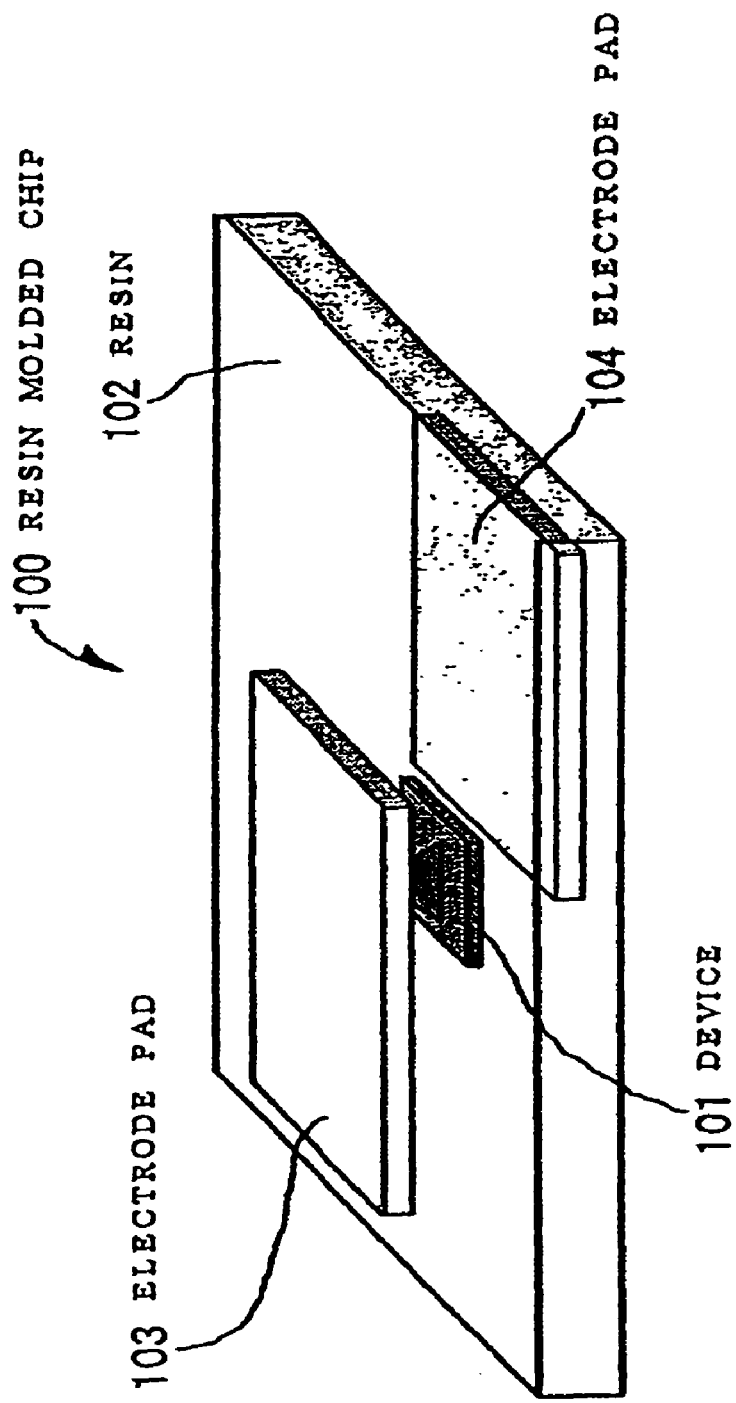
FIG. 16 is a perspective view showing a resin molded chip in a method of arraying devices according to the embodiment of the present invention.
Figure 17:
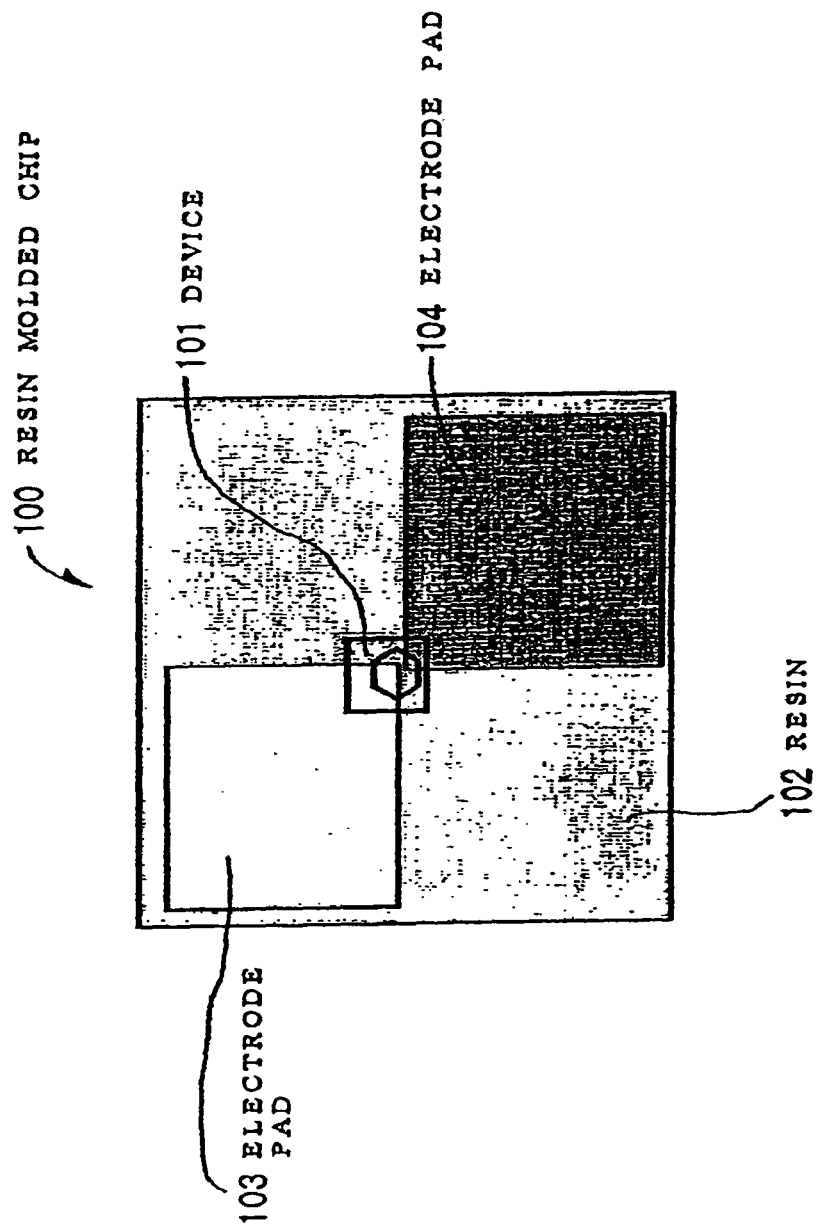
FIG. 17 is a plan view showing a resin molded chip in a method of arraying devices according to an embodiment of the present invention.

Resin molded chips formed according to an embodiment on a temporarily holding member and transferred to a second board will be described with reference to FIGS. 16 and 17. A resin molded chip 100 is obtained by filling a space around a device 101, which is spaced from another device, with a resin 102. Such a resin molded chip 100 can be used for transferring the device 101 from the temporarily holding member to the second board.

In an embodiment, the device 101 is exemplified as a light emitting device, but may be configured as another kind of device. The resin molded chip is formed into an approximately flat plate shape with an approximately square shaped principal plane, The resin molded chips 100 are produced by coating the surface of the temporarily holding member so as to contain the devices 101 with a non-hardened resin, hardening the resin, and cutting the hardened resin 102 into square chips by dicing (i.e., separation or dividing the hardened resin into sections).

In an embodiment, electrodes 103 and 104 are formed on front and back surface sides of the approximately flat plate like resin 22, respectively. These electrode pads 103 or 104 are produced by forming a conductive layer made from a metal, polysilicon, or the like as a material for forming the electrode pads overall on the surface of the resin 102, and patterning the conductive layer into specific electrode shapes by photolithography or the like. These electrode 103 and 104 are formed so as to be connected to a p-electrode and an n-electrode of the device 101, and a via-hole is formed in the resin 102 as needed.

In an embodiment, the electrode pads 103 and 104 are formed on the front and back surface sides of the resin molded chip 100, respectively. However, they may be formed on either of the front and back surface sides of the resin molded chip 100. For a thin film transistor having three electrodes, that is, source, gate, and drain electrodes, three or more electrode pads may be formed. The reason why the electrode pads 103 and 104 are offset from each other in the horizontal direction is to prevent the electrode pads 103 and 104 from overlapping when forming a contact hole from above at the time of formation of final wiring. The shape of each of the electrode pads 103 and 104 is not limited to a square shape but may be any other shape.

In an embodiment, a space around the device 101 is covered with the resin 102. The electrode pads 103 and 104 can be accurately formed on the flattened surfaces of the resin 102 of the resin molded chip 100 such as to extend to a region wider than the chip size of the device 101, so that the handling of the resin molded chip 100 at the time of transfer in the second transfer step, which is carried out by an attracting jig or the like. Since final wiring (as will be described later) is performed after the second transfer step, a wiring failure can be prevented by performing wiring using the electrode pads 103 and 104, having relatively large sizes.

Figure 18A:
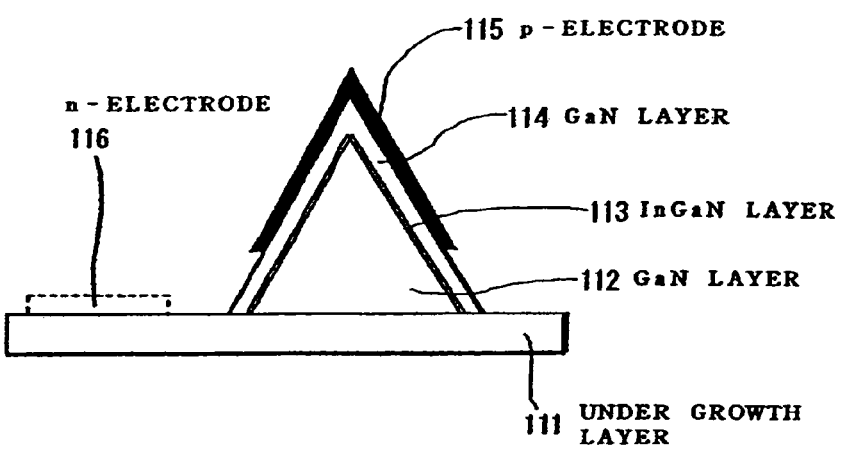
Figure 18B:
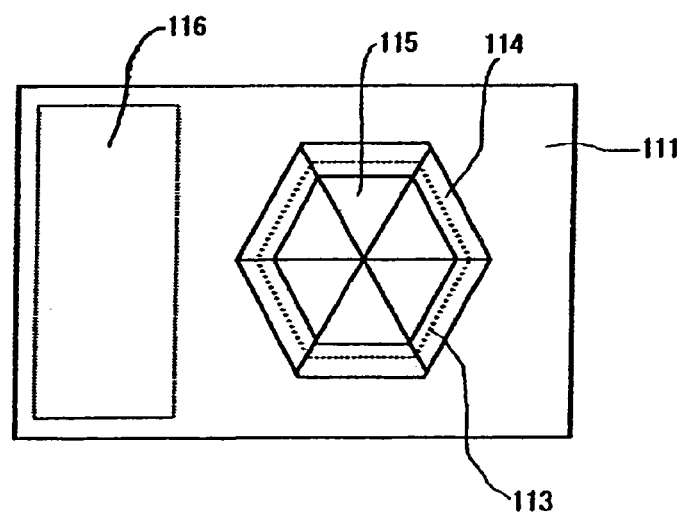

FIGS. 18A and 18B show a structure of a light emitting device according to an embodiment of the present invention, wherein FIG. 18A is a sectional view of the device and FIG. 18B is a plan view of the device. In an embodiment, the light emitting device is a GaN based light emitting diode formed by crystal growth, typically on a sapphire substrate. In such a GaN based light emitting diode, laser abrasion by irradiation with a laser beam passing through the substrate generates a phenomenon in which nitrogen of GaN is evaporated, thereby causing film peeling at a boundary between the sapphire substrate and a GaN based growth layer. As a result, device separation can easily be performed.

The GaN based light emitting diode has a structure in which a hexagonal pyramid shaped GaN layer 112 is formed by selective growth on an under growth layer 111 composed of a GaN based semiconductor layer. In an embodiment, an insulating film (not shown) is formed on the under growth layer 111, and the hexagonal pyramid shaped GaN layer 112 is formed via an opening or a window portion formed in the insulating film by a MOCVD process or the like. The GaN layer 112 is a growth layer formed into a pyramid shape covered with an S-plane (i.e., a plane expressed as a (1-101) plane in accordance with Miller indices of a hexagonal system), with a principal plane of a sapphire substrate used at the time of growth being a C-plane.

It is noted that the plane terminology (e.g., S-plane, C-plane or the like) as used herein denotes crystal planes in accordance with Miller indices of a hexagonal crystal system. Where appropriate, throughout the specification, these planes are intended to include more than one plane in the hexagonal crystal system. For example, the S-plane is listed above as corresponding to the (1-101) plane, but it should be understood that, where appropriate, the S-plane is intended to include one or more of the planes relating to the family of planes making up a crystal structure having the S-plane. For example, if the crystal structure being described is a hexagonal pyramid having the S-plane, planes corresponding to each side face of the hexagonal pyramid would be included in the family of planes denoted by the S-plane. For example, in addition to the (1-101) plane, a hexagonal pyramid has side faces corresponding to the (10-11), (01-11), (-1101) and (0-111) planes.

In an embodiment, the GaN layer 112 is doped with a suitable material, preferably silicon. The inclined S-plane of the GaN layer 112 functions as a cladding portion of a double-hetero structure. An InGaN layer 113 functioning as an active layer is formed such as to cover the inclined S-plane of the GaN layer 112. A GaN layer 114 doped with magnesium is formed on the InGaN layer 113. The GaN layer 114 doped with magnesium also functions as a cladding portion.

Figure 20:
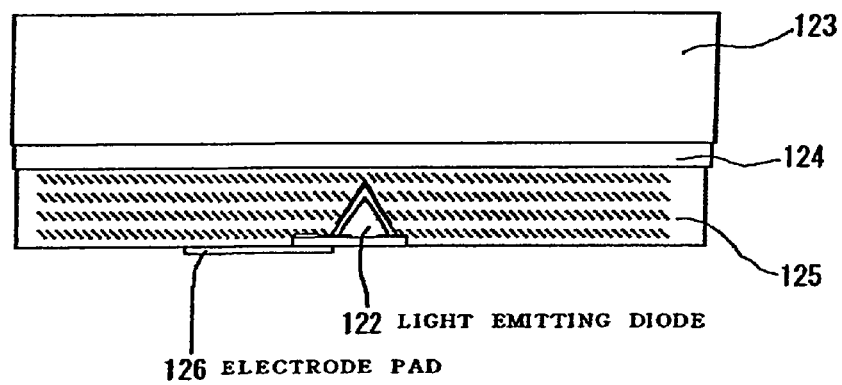
FIG. 20 is a sectional view showing a step of forming an electrode pad in a method of arraying light emitting devices according to an embodiment of the present invention.

The light emitting diode is provided with a p-electrode 115 and an n-electrode 116. A combination of metal materials such as Ni/Pt/Au, Ni(Pd)/Pt/Au or the like are formed by vapor-deposition on the GaN layer 114 doped with magnesium, to form the p-electrode 115. A combination of metal materials such as Ti/Al/Pt/Au or the like are formed by vapor-deposition via an opening or a window portion formed in the above-described insulating film (not shown), to form the n-electrode 116. It should be noted that, when extracting an n-electrode from a back surface side of the under growth layer 111 as shown in FIG. 20, the formation of the n-electrode 116 on the front surface side of the under growth layer 111 can be omitted.

The GaN based light emitting diode having such a structure enables light emission of blue. In particular, such a light emitting device can be relatively simply peeled from the sapphire substrate by laser abrasion. In other words, the device can be selectively peeled by selective irradiation by a laser beam. In addition, the GaN based light emitting diode may be of a structure in which an active layer may be formed in a planar or strip shape, or may be a pyramid with a C-plane formed on an upper end portion. Further, the GaN light emitting diode may be replaced with any other nitride based light emitting device, a compound semiconductor device, or the like.

A method of arraying light emitting devices according to an embodiment of the present invention will be described below with reference to FIGS. 19, 20, and 21. In an embodiment, the GaN based light emitting diode shown in FIGS. 18A and 18B is used as the light emitting device.

Figure 19:
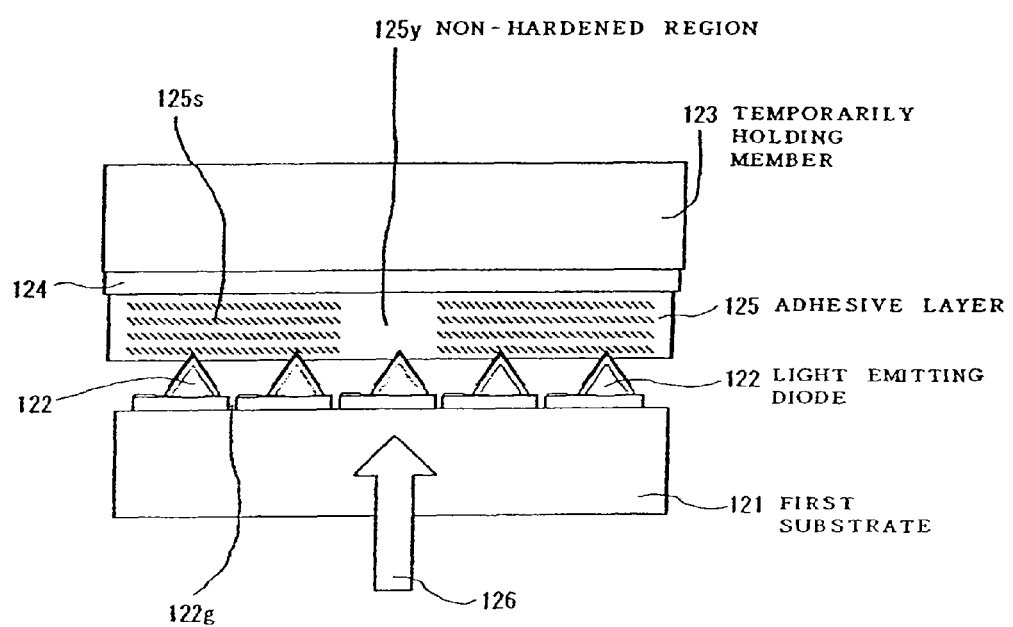
FIG. 19 is a sectional view showing a first transfer step in a method of arraying light emitting devices according to an embodiment of the present invention.

In an embodiment, as shown in FIG. 19, a number of light emitting diodes 122 are formed in a matrix on a principal plane of a first substrate 121. A size of the light emitting device 122 is set to about 20 gm. The first substrate 121 is made from a material having a high transmittance against a wavelength of a laser beam used for irradiation of the light emitting diode 122, for example, sapphire or the like. The light emitting diode 122 is already provided with a p-electrode and the like but is not subjected to final wiring. Grooves 122g for device separation are formed to allow the light emitting diodes 122 to be individually separated from the first substrate 121. The grooves 122g are formed, for example, by reactive ion etching or the like. As shown in FIG. 19, the first substrate 121 is placed opposite to a temporary or temporarily holding member 123 to enable selective transfer of at least one of the light emitting devices 122 from the first substrate 121 to the temporarily holding member 123.

Both a peeling layer 124 and an adhesive layer 125 are formed on a surface, opposed to the first substrate 121, of the temporarily holding member 123. As the temporarily holding member 123, a glass substrate, a quartz glass substrate, a plastic substrate, or the like can be used. The peeling layer 124 on the temporarily holding member 123 can be formed of a fluorine coat, a silicone resin, a water soluble adhesive (for example, PVA), polyimide, or the like. The adhesive layer 125 on the temporarily holding member 123 can be made from an ultraviolet-curing (UV-curing) type adhesive, a thermosetting type adhesive, a thermoplastic type adhesive, or the like. In an embodiment, a quartz glass substrate is used as the temporarily holding member 123, and a polyimide film as the peeling layer 124 is formed thereon to a thickness of about 4 gm and an UV-curing type adhesive layer as the adhesive layer 125 is formed on the peeling layer 124 to a thickness of about 20 μm.

The adhesive layer 125 of the temporarily holding member 123 is adjusted so as to mixedly include a hardened resin 125$s$ and a non-hardened region 125$y$. The non-hardened region 125$y$ is positioned such that the light emitting diode 122 to be selectively transferred is located at the non-hardened region 125$y$. The adjustment of the adhesive layer 125 such that the hardened region 125$s$ and the non-hardened region 125$y$ are mixedly located in the adhesive layer 125, may be performed by selectively exposing portions, spaced from each other with a pitch of about 200 μm, of the adhesive layer 125 configured by the UV-curing type adhesive layer by an exposure system, so that portions, to which the light emitting diode 122 is to be transferred remain non-hardened and the other portions are hardened.

In an embodiment, after such adjustment of the adhesive layer 125 by exposure, the light emitting diode 122 located at the non-hardened region 125$y$ is irradiated with a laser beam from a back surface of the first substrate 121, to be peeled from the first substrate 121 by laser abrasion. Since the GaN based light emitting diode 122 is decomposed into Ga and nitrogen at a boundary between the GaN layer and sapphire, the light emitting diode 122 can be relatively simply peeled. As the laser beam used for irradiation of the light emitting device, an excimer laser beam, a harmonic YAG laser beam, or the like is used.

The light emitting diode 122, which has been selectively irradiated with a laser beam, is peeled from the first substrate 121 at the boundary between the GaN layer and the first substrate 121 by laser abrasion, and is transferred to the opposed temporarily holding member 123 such that the p-electrode portion of the light emitting diode 122 is placed in the corresponding non-hardened region 125$y$ of the adhesive layer 125. Since the other light emitting diodes 122 have not been irradiated with laser beams and are also located at positions corresponding to the hardened region 125$s$ of the adhesive layer 125, the other light emitting diodes 122 are not transferred to the temporarily holding member 123. It should be noted that, in the embodiment shown in FIG. 19, only one light emitting diode 122 is selectively irradiated with a laser beam. However, in actuality, the light emitting diodes 122 spaced from each other with an n-pitch are irradiated with laser beams. With such selective transfer, the light emitting diodes 122 are re-arrayed on the temporarily holding member 123 such that the re-array pitch of the diodes 122 on the temporarily holding member 123 is larger than the array pitch of the diodes 122 on the first substrate 121.

In an embodiment, after the selected light emitting diode 122 is transferred from the first substrate 121 to the temporarily holding member 123, as shown in FIG. 20, the non-hardened region 125$y$ of the adhesive layer 125 is hardened, whereby the light emitting diode 122 is fixed to the adhesive layer 125. The hardening of the non-hardened region 125$y$ can be performed by imparting heat, light or the like thereto. While the light emitting diode 122 is held by the adhesive layer 125 of the temporarily holding member 123, a back surface of the light emitting diode 122, which is taken as an n-electrode side (cathode electrode side), is cleaned for removal of the resin (adhesive) therefrom. Accordingly, if an electrode pad 126 is formed on the back surface of the light emitting diode 122, it can be electrically connected thereto.

In an embodiment, to perform cleaning of the adhesive layer 125, the resin forming the adhesive is etched with oxygen plasma and cleaned by irradiation of UV ozone. Further, when the GaN based light emitting diode is peeled from the first substrate 121 made from sapphire by laser, Ga is deposited on the peeling plane, and accordingly, such an element Ga must be etched with a NaOH containing water solution, dilute nitric acid, or the like. Subsequently, the electrode pad 126 is patterned. The electrode pad on the cathode side can be formed into a size of about 60 μm square, that is each of the four sides of an approximately square shape equal about 60 μm. A transparent electrode (ITO or ZnO based electrode), a Ti/Al/Pt/Au electrode, or the like can be used as the electrode pad 126. When using a transparent electrode, even if the electrode largely covers the back surface of the light emitting diode, it does not shield light emission, so that a patterning accuracy of the electrode may be low and further, the size of the electrode can be made large, resulting in facilitation of the patterning process.

Figure 21:
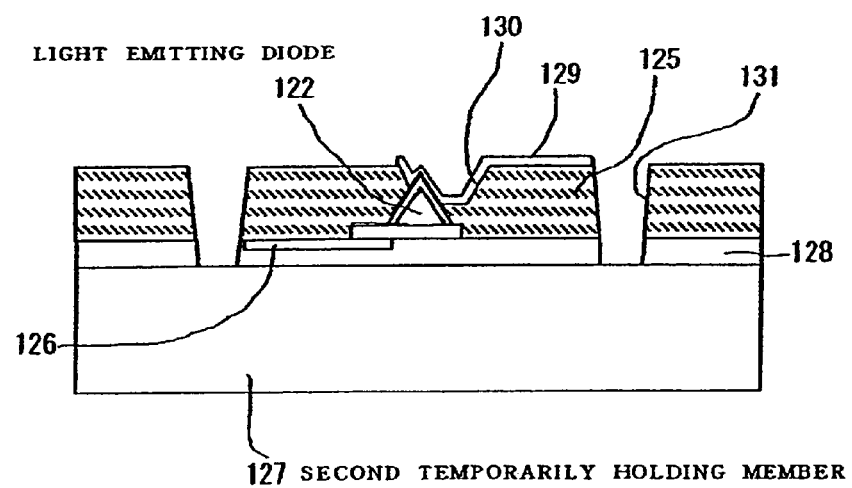
FIG. 21 is a sectional view showing a step of forming an electrode pad in a method of arraying light emitting devices according to an embodiment of the present invention.

FIG. 21 shows an embodiment in which, after the light emitting diode 122 is transferred from the temporarily holding member 123 to a second temporarily holding member 127, and a via-hole 130 on an anode electrode (p-electrode) side is formed in the adhesive layer 125, an anode side electrode pad 129 is formed, and the adhesive layer 125 is subjected to dicing. As a result of dicing, device separation grooves 131 are formed, to separate the light emitting diodes 122 from each other. To separate the light emitting diodes 122 arrayed in a matrix from each other, the device separation grooves have a planar pattern composed of a number of parallel lines extending in the vertical and horizontal directions. The bottom of the device separation groove 131 faces to the surface of the second temporarily holding member 127. The second temporarily holding member 127 has on its surface a peeling layer 128 exemplified by a fluorine coat, a layer of silicon resin, a water-soluble adhesive (for example, PVA), polyimide, or the like.

In an embodiment, as the second temporarily holding member 127, there can be used a so-called dicing sheet composed of a plastic board coated with an UV adhesive whose adhesive strength becomes weak at the time of irradiation by ultraviolet rays. The back surface side of the temporarily holding member 127 is irradiated with an excimer laser beam. With this irradiation by the laser beam, if the peeling layer 128 is made from polyimide, peeling occurs at a boundary between polyimide and the quartz board by abrasion of polyimide, whereby the light emitting diode 122 is transferred to the second temporarily member 127.

In an embodiment, the surface of the second temporarily holding member 127 is etched with oxygen plasma until the surface of the light emitting diode 122 is exposed. The via-hole 130 is formed using an excimer laser, a harmonic YAG laser beam, a carbon dioxide laser beam, or the like. The diameter of the via-hole ranges from about 3 gm to about 7 gm. The anode side electrode pad is made from Ni/Pt/Au or the like The dicing process may be performed by using a general blade, and if a narrow cut-in width of about 20 gm or less is required, the dicing process may be performed by laser cutting. The cut-in width is dependent on the size of the light emitting diode covered with the adhesive layer 125 in a pixel of an image display unit. Thus, in an embodiment, grooves each having a width of about 40 gm are formed by an excimer laser beam, to form the chip shape.

In an embodiment, the light emitting diode 122 is peeled from the second temporarily holding member 127 by using a mechanical mechanism or the like. FIG. 22 shows a state in which the light emitting diodes 122 arrayed on the second temporarily holding member 127 are picked up by an attracting system 133. The attracting system 133 has attracting holes 135 opened in a matrix corresponding to a pixel pitch of an image display unit in order to collectively attract a number of the light emitting diodes 122. More specifically, the attracting holes 135, each having an opening diameter of about 100 gm, are arranged with a pitch of about 600 gm, and the attracting system 133 can collectively attract about 300 pieces of the light emitting diodes 122. The portion of the attracting hole 135 is produced from Ni or the like by casting, or forming a hole in a metal plate such as a SUS plate 132 by etching. An attracting chamber 134 is formed at the depth of the attracting hole 135 formed in the metal plate 132. The control of the pressure in the attracting chamber 134 into a negative pressure allows the attracting system 133 to attract the light emitting diode 122. Since each light emitting diode 122 covered with the adhesive layer 125 whose surface is nearly flatted, the selective attraction of the light emitting device 122 by the attracting system 133 can be facilitated.

Figure 23:
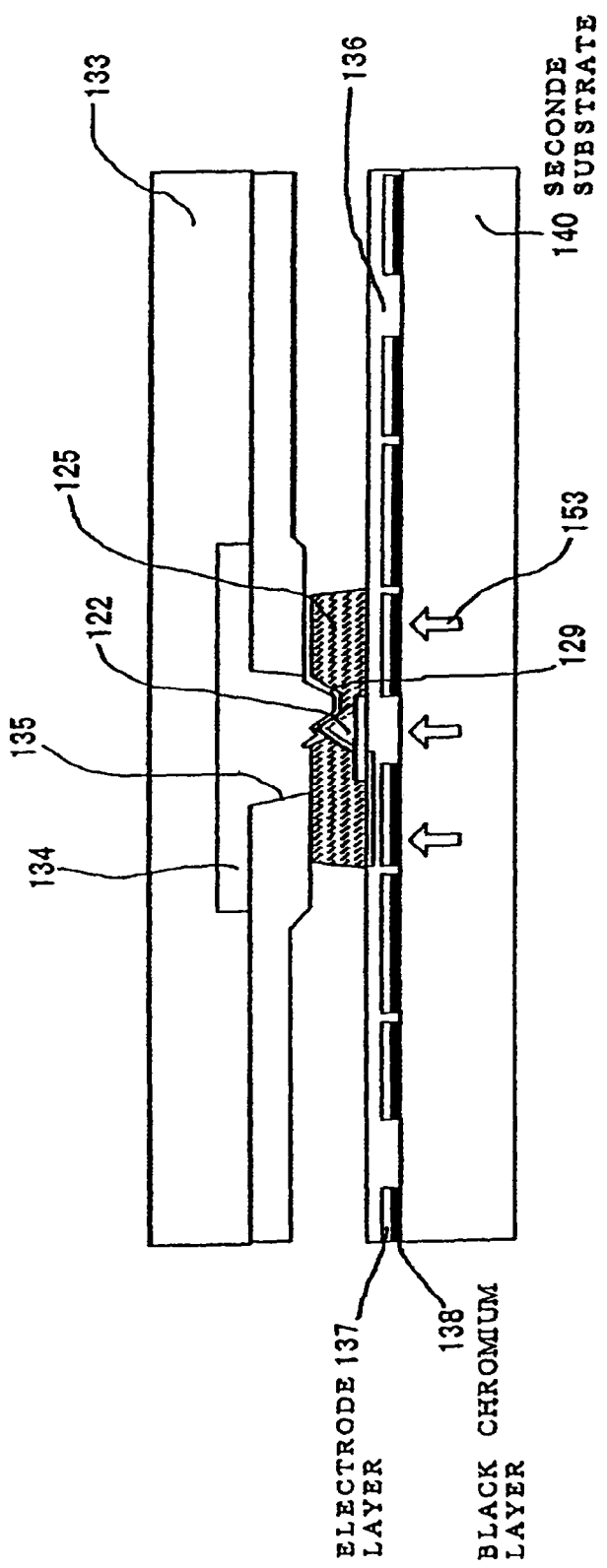
FIG. 23 is a sectional view showing a second transfer step in a method of arraying light emitting devices according to an embodiment of the present invention.

FIG. 23 is a view showing an embodiment in which the light emitting diode 122 is transferred to a second board 140. An adhesive layer 136 is previously formed on the second board 140. By hardening a portion, corresponding to the light emitting diode 122, of the adhesive layer 136, the light emitting diode 122 can be fixedly arrayed on the second board 140. At the time of this mounting, the pressure of the attracting chamber 134 of the attracting system 133 becomes high, to release the attraction of the light emitting diode 122 to the attracting system 133. The adhesive layer 136 is made from an UV-curing type adhesive, a thermosetting adhesive, a thermoplastic adhesive, or the like. In addition, the light emitting diodes 122 thus arrayed on the second board 140 are spaced from each other with a pitch larger than a pitch of the light emitting diodes 122 held on each of the temporarily holding members 123 and 127. An energy for hardening the resin of the adhesive layer 136 is given from the back surface of the second board 140. A portion, corresponding to the light emitting diode 122, of the adhesive layer may be hardened by using ultraviolet rays if the adhesive layer 136 is made from an UV-curing type adhesive, or using a laser beam if the adhesive layer 136 is made from a thermosetting adhesive. If the adhesive layer 136 is made from a thermoplastic adhesive, the adhesive is melted by laser irradiation, to bond the light emitting diode 136 thereto.

In an embodiment, an electrode layer 137, which also functions as a shadow mask, is disposed on the second board 140. In particular, a black chromium layer 138 is formed on a surface, on the screen side, that is, the viewer side, of the electrode layer 137. This makes it possible to improve the contrast of an image. Further, since an energy efficiency is increased by providing the black chromium layer 138, a portion, selectively irradiated with a beam 153, of the adhesive layer 136 can be early hardened. If the adhesive layer is made from an UV-curing type adhesive, it may be irradiated with ultraviolet rays having an energy of about 1,000 mJ/cm2.

Figure 24:
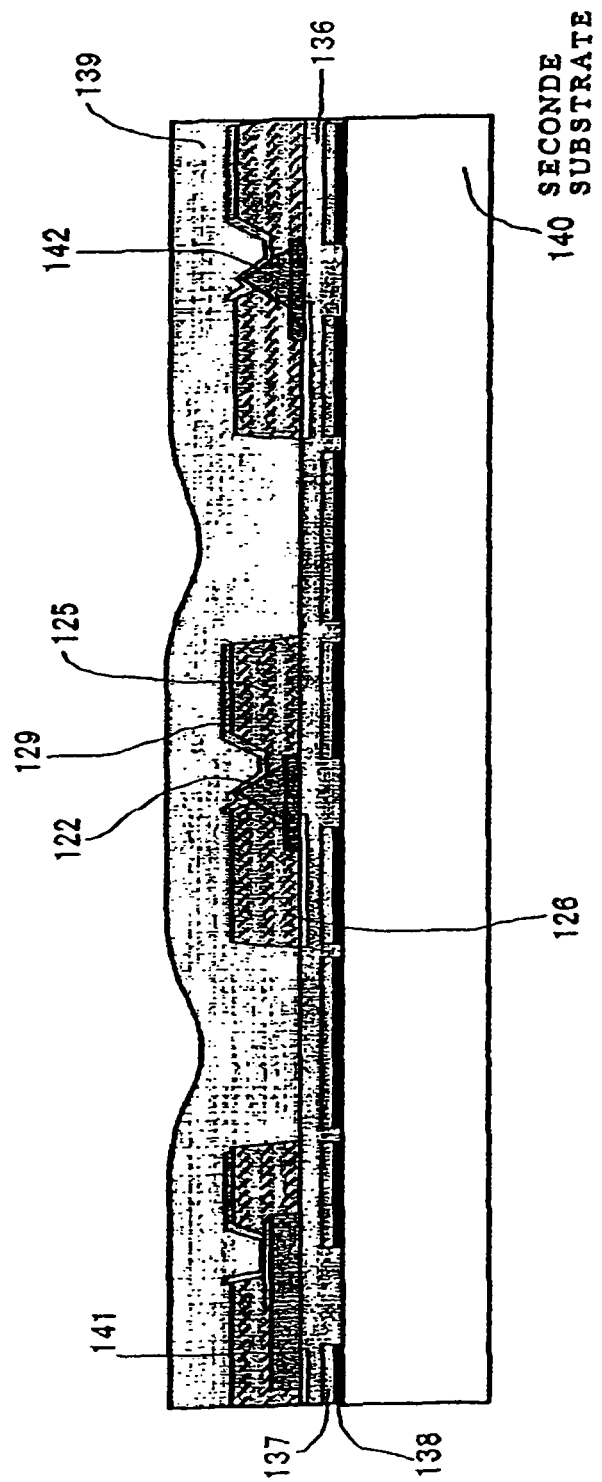
FIG. 24 is a sectional view showing a step of forming an insulating layer in a method of arraying light emitting devices according to an embodiment of the present invention.

FIG. 24 is a view showing an embodiment in which light emitting diodes 122, 141, 142 of three colors, that is, R, G, and B are arrayed on the second board 140 and are coated with an insulating layer 139. By mounting each of the light emitting diodes 122, 141, and 142 on the second board 140 at a position shifted to a position of a desired color, a pixel composed of the light emitting diodes 122, 141 and 142 of the three colors can be formed with a fixed pixel pitch. The insulating layer 139 may be made from a transparent epoxy adhesive, an UV-curing type adhesive, polyimide, or the like. The shapes of the light emitting diodes 122, 141, and 142 of three colors are not necessarily identical to each other. In an embodiment shown in FIG. 24, the light emitting diode 141 of red, which has a structure having no hexagonal pyramid shaped GaN layer, is different in shape from each of the other light emitting diodes 122 and 142. However, in this stage, each of the light emitting diodes 122, 141, and 142 has been already covered with the adhesive layer 125 to be formed into a resin molded chip, and therefore, the light emitting diodes 122, 141, and 142 can be handled in the same manner, irrespective of the difference in device structure.

Figure 25:
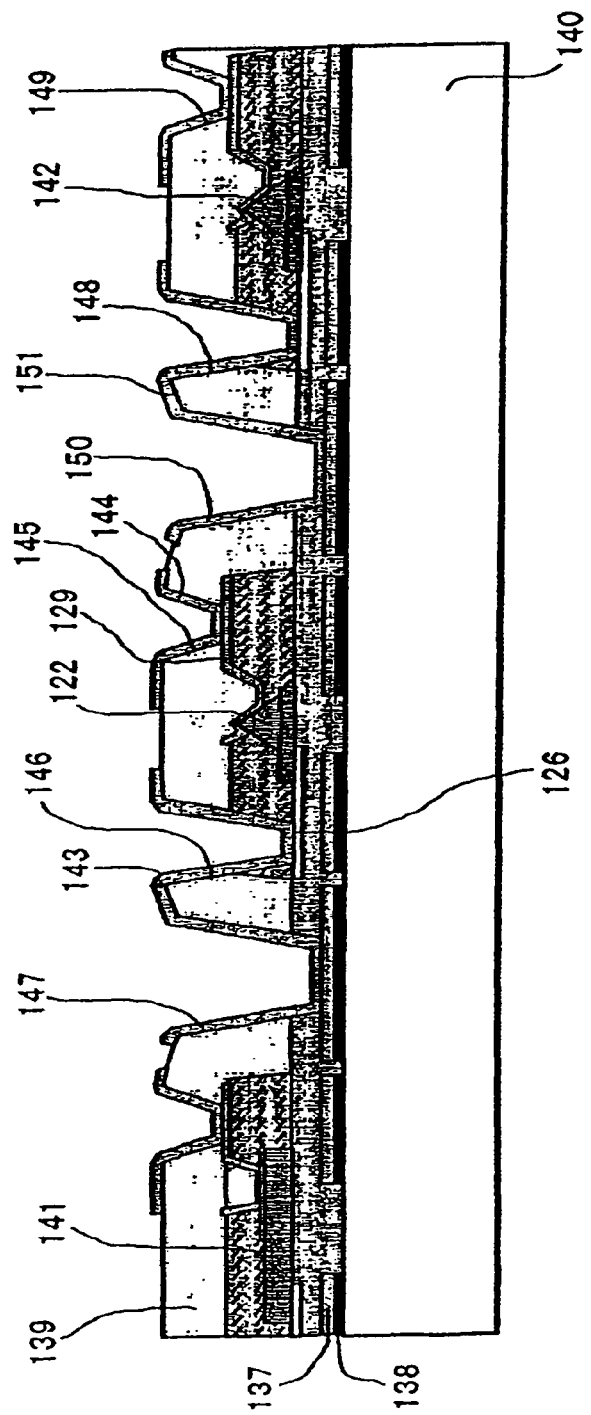
FIG. 25 is a sectional view showing a step of forming wiring in a method of arraying light emitting devices according to the embodiment of the present invention.

FIG. 25 shows a wiring forming step according to an embodiment of the present invention, in which openings 145, 146, 147, 148, 149, and 150 are formed in the insulating layer 139, and wiring portions 143, 144, and 145 for connecting electrode pads of anodes and cathodes of the light emitting diodes 122, 141, and 142 to the electrode layers 137 for wiring on the second board 140 side are formed. Since the areas of the electrode pads 126 and 129 of the light emitting diodes 122, 141, and 142 are large, the shapes of the openings, that is, via-holes can be made large, and the positioning accuracy of each via-hole may be rough as compared with a via-hole directly formed in each light emitting diode. More specifically, when each of the electrode pads 126 and 129 having a size of about 60 µm (e.g., each of four sides of an approximately square shape equaling about 60 gm) is provided, the via-hole having a diameter of about 20 µm can be formed. The via-holes are of three kinds connected to the wiring board, the anode electrode, and the cathode electrode. The depth of each via-hole is optimized by controlling the pulse number of a laser beam depending on the type of via-hole to be formed. A protective layer is then formed on the wiring, to accomplish a panel of an image display unit. The protective layer may be made from the transparent epoxy adhesive used for the insulating layer 139. The protective layer is heated to be hardened, to perfectly cover the wiring. Subsequently, a driver IC is connected to the wiring at the end portion of the panel, to produce a drive panel.

In the above-described embodiment of arraying light emitting devices, since the light emitting diodes 122 are already spaced from each other with an enlarged pitch on the temporarily holding member 123, the relatively large electrode pads 126 and 129 can be provided by making use of the large pitch of the devices 122, and since the wiring is performed by making use of the relatively large electrode pads 126 and 129, even if the size of the final unit is significantly large as compared with the device size, the wiring can be easily formed. Also, since spaces around the light emitting devices are covered with the hardened adhesive layer, the electrode pads 126 and 129 can be accurately formed on the flattened surface of the adhesive layer 125 and can extend to a region wider than the device size, so that the handling of the electrode pads 126 and 129 by the attracting jig in the second transfer step can be facilitated. Further, at the time of transfer of each light emitting diode 122 to the temporarily holding member 123, the light emitting diode 122 can be relatively easily peeled by making use of decomposition of the GaN material into metal Ga and nitrogen at the boundary between GaN and sapphire.

A method of arraying liquid crystal control devices according to an embodiment of the present invention will be described with reference to FIGS. 26 to 31. In an embodiment, the liquid crystal control device includes a thin film transistor for controlling an alignment state of liquid crystal of a liquid crystal panel as a final product.

Figure 26:
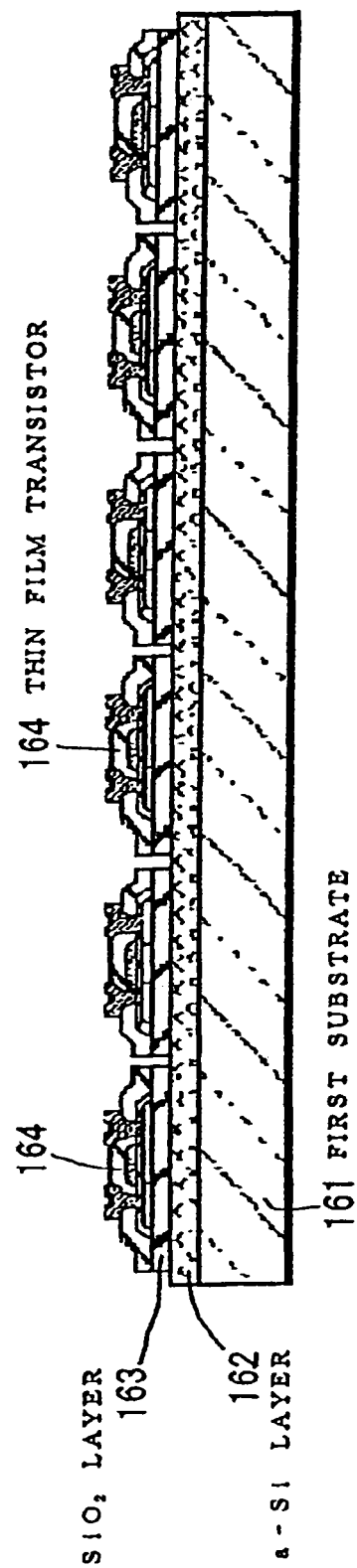
FIG. 26 is a sectional view showing a step of forming thin film transistors in a method of arraying liquid crystal control devices according an embodiment of the present invention.

In an embodiment, as shown in FIG. 26, an amorphous silicon film 162 is formed on a first substrate 161 typically configured as a quartz glass substrate, or the like. The amorphous silicon film 162 is a peeling film used as a sacrifice film in a subsequent step. A silicon oxide film 163 is formed as an under insulating film on the amorphous film 162, and thin film transistors 164 are densely formed in a matrix on the silicon oxide film 163. The thin film transistor 164 is produced by forming a gate oxide film and a gate electrode on a polysilicon film, and source and drain regions in the polysilicon film. Grooves for device separation are formed to a depth allowing part of the amorphous silicon film 162 to be exposed by reactive ion etching or the like, whereby the thin film transistors 164 are separated from each other.

Figure 27:
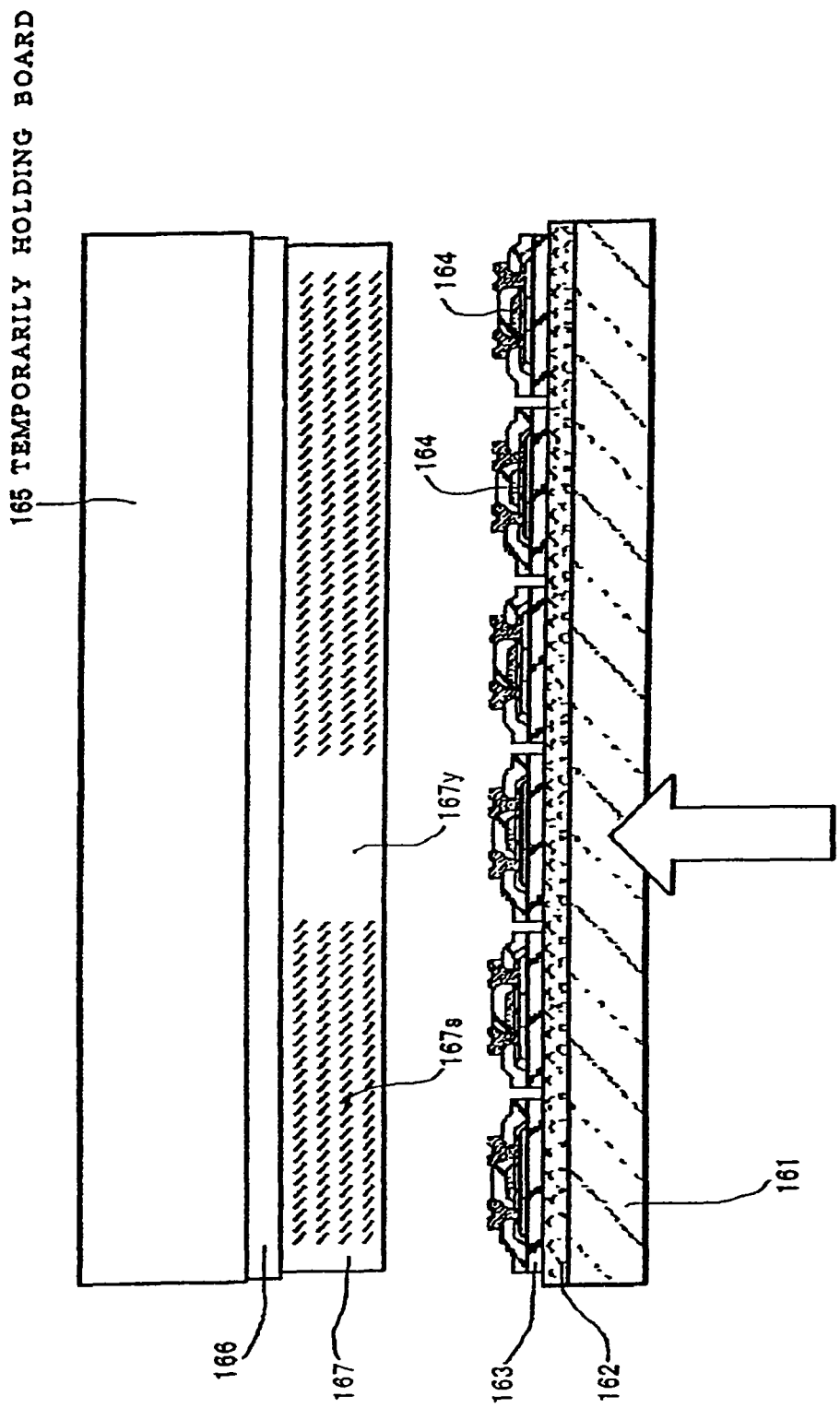
FIG. 27 is a sectional view showing a first transfer step in a method of arraying liquid crystal control devices according an embodiment of the present invention.

As illustrated in FIG. 27, in an embodiment, the first substrate 161 is opposed to a temporarily holding member 165 for selective transfer. A peeling layer 166 and an adhesive layer 167 are stacked on a surface, opposed to the first substrate 161, of the temporarily holding member 165. In an embodiment, as the temporarily holding member 165, a glass board, a quartz glass board, a plastic board, or the like can be used. As the peeling layer 166 formed on the temporarily holding member 165, a fluorine coat, a layer of silicon resin, a water-soluble adhesive (for example, PVA), polyimide, or the like can be used. As the adhesive layer 167 formed on the temporarily holding member 165, a layer of an UV-curing type adhesive, a thermosetting adhesive, a thermoplastic adhesive, or the like can be used.

In an embodiment, the adhesive layer 167 of the temporarily holding member 165 has a hardened region 167s and a non-hardened region 167y. The first transistor 161 is opposed to the temporarily holding member 165 such that one of the thin film transistors 164 to be selectively transferred is positioned to the non-hardened region 167y. If the adhesive layer 167 is of an UV-curing type, the adjustment of hardening of the adhesive layer 167 such that the adhesive layer 167 has the hardened region 167s and the non-hardened region 167y may be performed by selectively exposing the adhesive layer 167 so as to make a region, in which the thin film transistor 164 is to be transferred, remain as non-hardened and to harden the other region. After such alignment, the thin film transistor 164 positioned to the non-hardened region 167y is irradiated with a laser beam from the back surface of the first substrate 161, to peel the thin film transistor 164 from the first substrate 161 by making use of laser abrasion. As the laser used for irradiation, an excimer laser, a harmonic YAG laser, or the like can be used.

In an embodiment, the thin film transistor 164 to be selectively transferred is transferred to the opposed non-hardened region 167y of the adhesive layer 167 by peeling which makes use of laser abrasion. The other thin film transistors 164 positioned in the region, not irradiated with the laser beam, of the first substrate 161 are not transferred to the temporarily holding member 165 because the corresponding portions of the adhesive layer 167 are located in the hardened region 167s and also, the thin film transistors 164 are not irradiated with the laser beam. It should be noted that only one thin film transistor 164 is selectively irradiated with a laser beam in FIG. 27. However, those of the thin film transistors 164, which are spaced from each other with an n-pitch, may be irradiated with laser beams and transferred. With such selective transfer, the selected thin film transistors 164 are arrayed on the temporarily holding member 165 while being spaced from each other with a pitch larger than an original pitch of the thin film transistors 164 arrayed on the first substrate 161.

Figure 28:
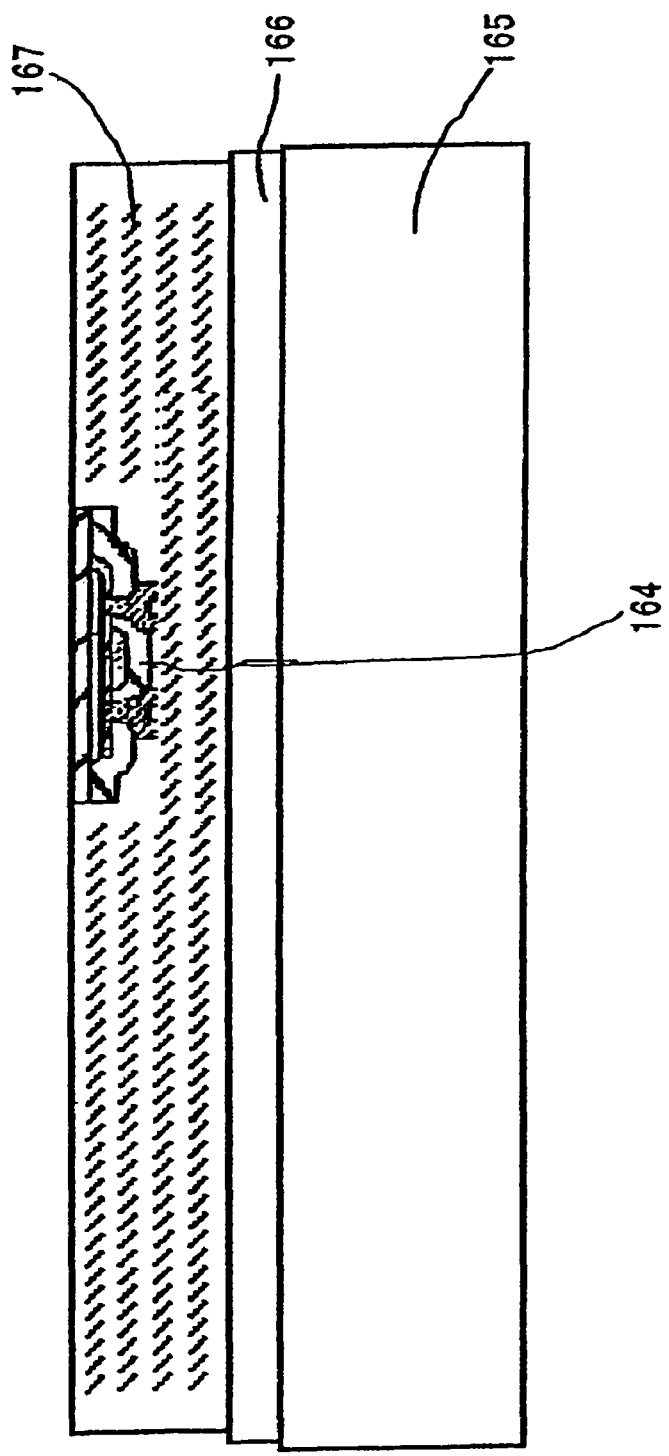
FIG. 28 is a sectional view showing a step of holding a selected device on a temporarily holding member in a method of arraying liquid crystal control devices according an embodiment of the present invention.

After selective transfer of the thin film transistor 164 from the first substrate 161 to the temporarily holding member 165, as shown in FIG. 28, the adhesive in the non-hardened region is hardened for fixing the thin film transistor 164 thereto. The hardening of the non-hardened region can be performed by applying an energy such as heat, light or the like to the non-hardened region 167y. The thin film transistor 164 is held by the temporarily holding member 165 in the adhesive layer 167.

Figure 29:
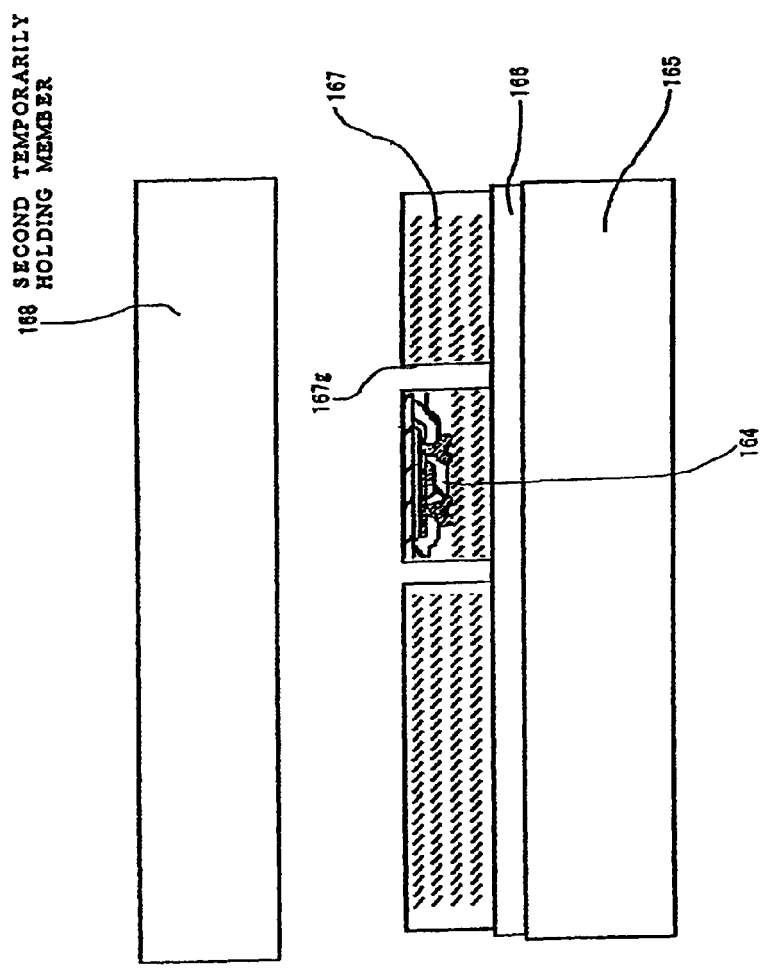
FIG. 29 is a sectional view showing a step of transferring a device from a temporarily holding member to a second temporarily holding member in a method of arraying liquid crystal control devices according an embodiment of the present invention.
Figure 30:
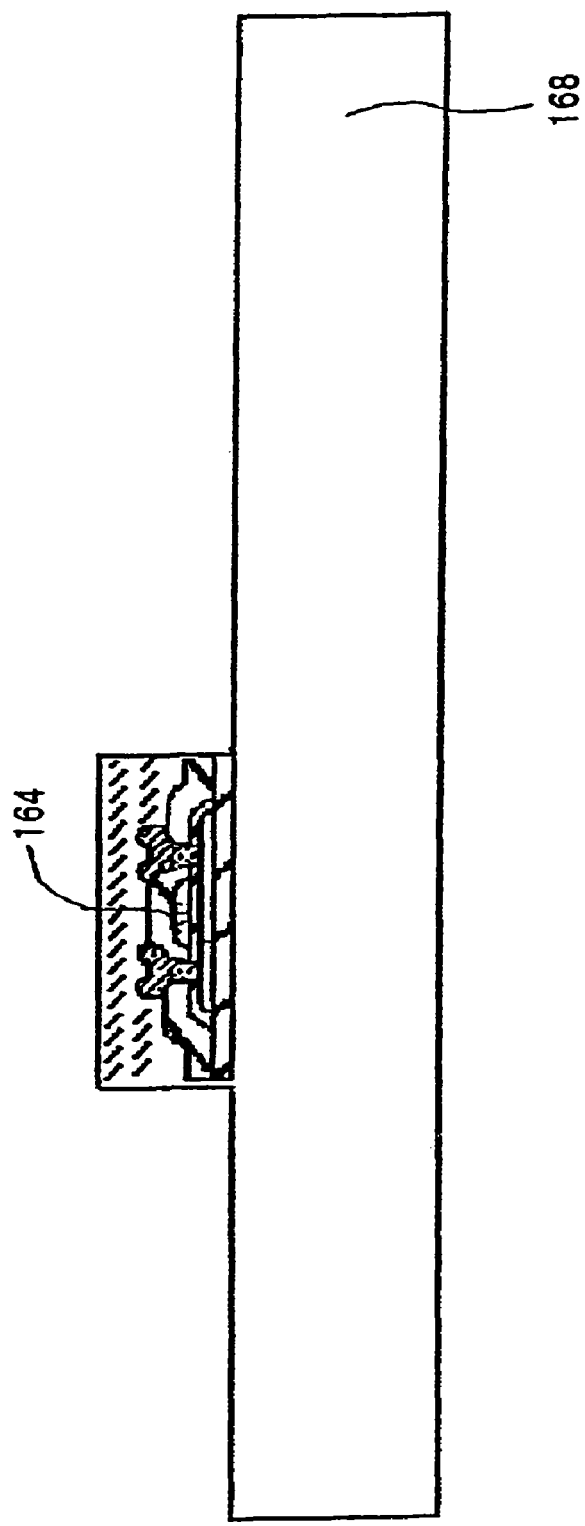
FIG. 30 is a sectional view showing a step of holding a device on a second temporarily holding member in a method of arraying liquid crystal control devices according an embodiment of the present invention.

As shown in FIG. 29, the thin film transistor 164 is transferred from the temporarily holding member 165 to a second temporarily holding member 168. The second temporarily holding member 168 is used for mounting a thin film transistor layer side of the thin film transistor 164 on a second board. Accordingly, if it does not matter whether the front side or the back side of the thin film transistor 164 is mounted on the second board, use of the second temporarily holding member 168 is not required. When transferring the thin film transistor 164 from the temporarily holding member 165 to the second temporarily holding member 168, separation grooves 167g are formed in the adhesive layer 167 for separating a region of the thin film transistor 164 from the other region. The depth of the separation groove 167g reaches the upper surface of the peeling layer 166, or it may reach the bottom surface of the peeling layer 166.

In an embodiment, the thin film transistor 164 is peeled from the upper surface of the peeling layer 166, and is transferred from the temporarily holding member 165 to the second temporarily holding member 168 (see FIG. 30), and is then transferred to the second board while being spaced from another thin film transistor 164 by way of an attracting mechanism (not shown). This step is the same as that described in a previously described embodiment of arraying devices with reference to FIG. 22.

Figure 31:
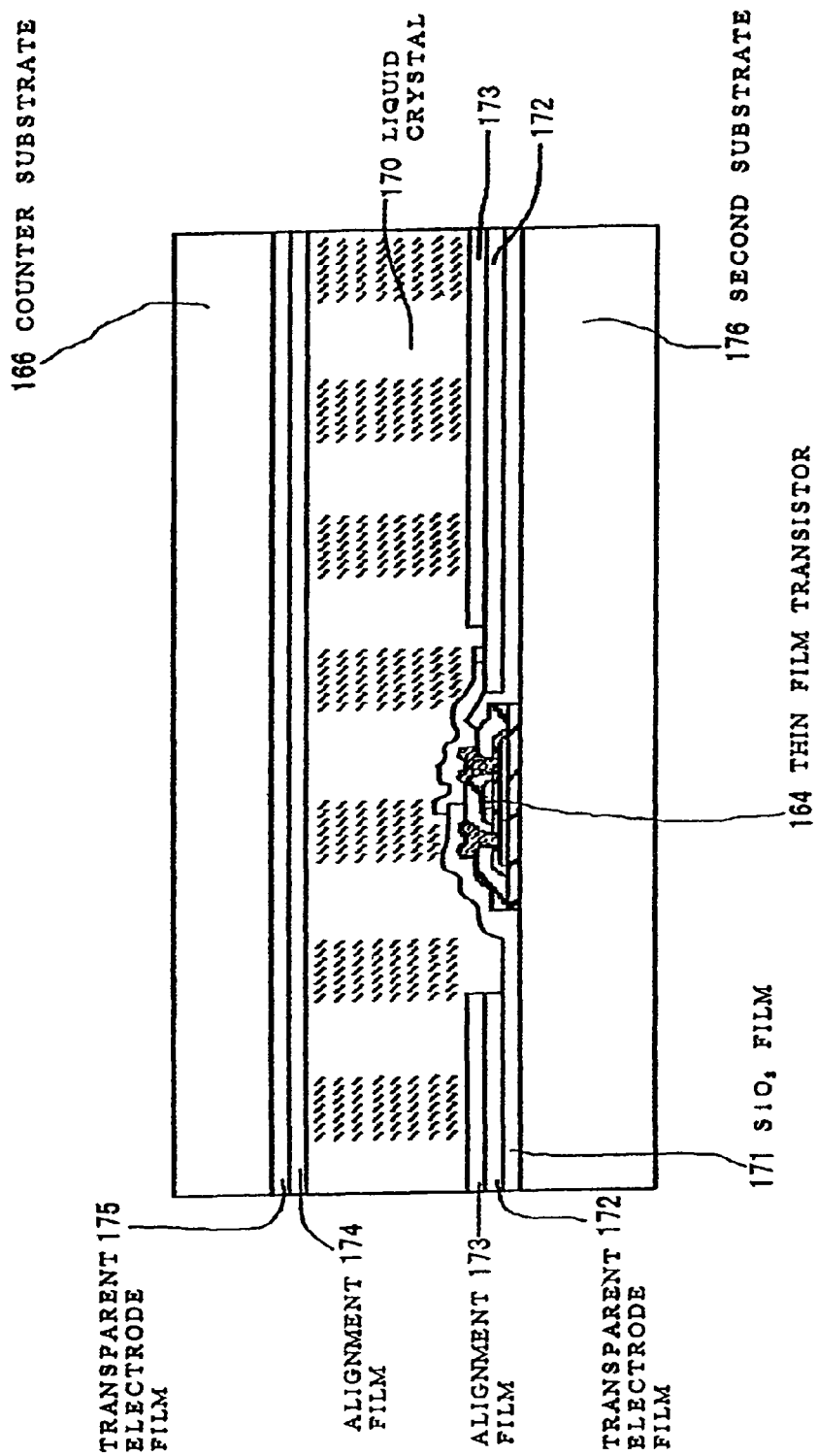
FIG. 31 is a sectional view showing a step of forming a counter board of a liquid crystal panel and sealing liquid crystal in a gap in a method of arraying liquid crystal control devices according an embodiment of the present invention.

Finally, as shown in FIG. 31, in an embodiment, after the thin film transistors 164 are thus mounted on the second board 176 made from glass, a transparent plastic, or the like, while being spaced from each other, gate electrode lines, source electrodes, and drain electrodes are formed on the second board 176 and are connected to sources and drains of the thin film transistors 164. A transparent electrode film 172 and an alignment film 173 are formed on the second board 176 side. A counter board 166 having on its surface a transparent electrode film 175 and an alignment film 174 is opposed to the second board 176. A gap lies between the counter board 166 and the second board 176 with the gap being filled with liquid crystal to obtain a liquid crystal panel. The thin film transistor 164 on the second board 176 functions as a control device for liquid crystal.

In an embodiment, the thin film transistors 164 are mounted on the second board 176 while being sufficiently spaced from each other by using two-step enlarged transfer which is a combination of enlarged transfer in the first transfer step and enlarged transfer in the second transfer step. In a two-step enlarged transfer method, letting enlargement ratios in the first and second transfer steps be "n" and "m", respectively, the total transfer magnification becomes n×m, and in order to achieve such a total transfer magnification of n×m, transfer may be repeated by n2 times in the first transfer step and be repeated by m2 times in the second transfer step, and therefore, the total number of transfer becomes (n2+m2) times. In contrast, according to a one-step transfer method, in order to achieve the transfer magnification of n×m, the number of transfer becomes (n+m)2=n2+2 nm+m2. As a result, according to the two-step enlarged transfer method, the number of transfer can be made smaller than that according to the one-step transfer method by 2 nm times, to correspondingly save time and cost required for the production step. This becomes more significant as the transfer magnification becomes larger.

As previously discussed, it is known that there are some image display units in which light emitting devices such as light emitting diodes are mounted so as to be arrayed on a wiring board in a matrix.

Figure 32:
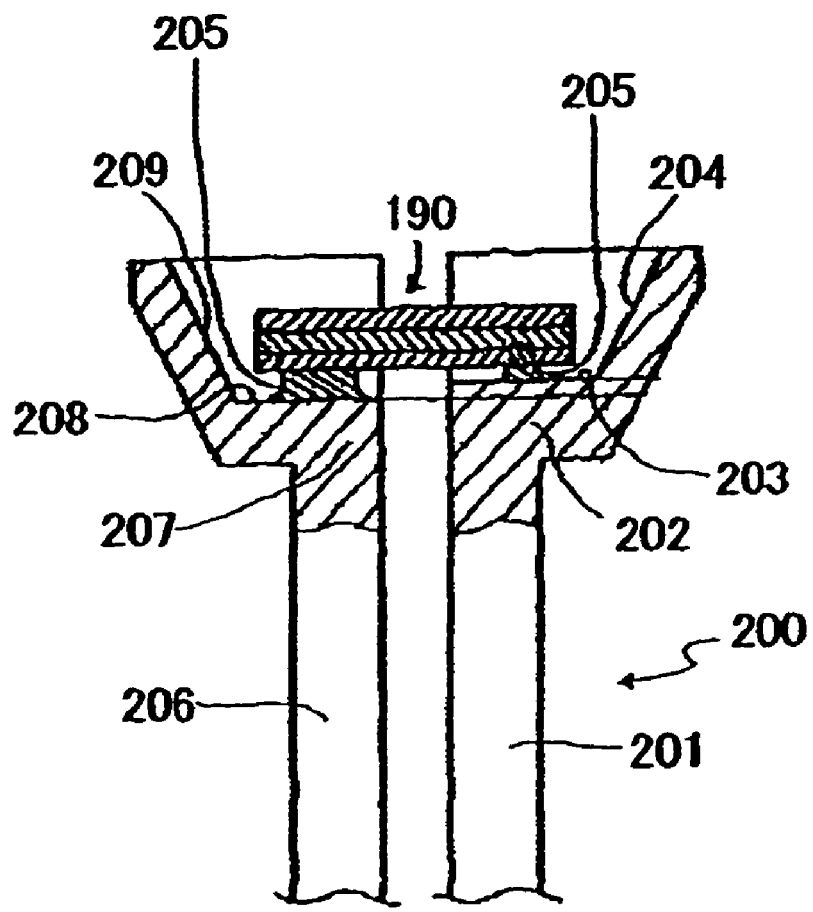
FIG. 32 is a sectional view showing a light emitting device.

FIG. 32 shows a light emitting diode disclosed in the specification and the drawings of Japanese Patent No. 2895566. The light emitting diode of a so-called flip-chip type having a pair of positive and negative electrode portions on the same surface side. A lead frame 200 includes lead members 201 and 206 forming a pair of positive and negative electrodes disposed in parallel with a gap between the two electrodes 201, 206. Flattened portions 203 and 208 are formed on leading ends 202 and 207 of the lead members 201 and 206, respectively, and a light emitting chip 190 is mounted so as to be bridged between the flattened portions 203 and 208. Reflection portions 204 and 209 are integrally formed on side peripheral surfaces continuous to the flattened portions 203 and 208 such as to be inclined outward from the flattened portions 203 and 208, respectively. Electrode portions of the light emitting chip 190 as a GaN blue light emitting chip are connected to both the lead member 201 as the negative electrode and the lead member 206 as the positive electrode via bumps or elevated regions 205.

Figure 33:
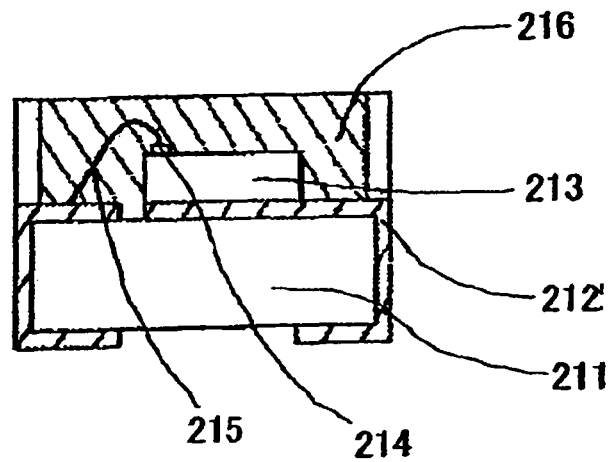
FIG. 33 is a sectional view showing a light emitting device.

FIG. 33 shows a chip type LED (Light Emitting Diode) disclosed in Japanese Patent Laid-open No. Hei 9-293904. An LED 213 is mounted on a conductive layer formed on an insulating ceramic supporting member 211, wherein an electrode 214 of the LED 213 is bonded to an electrode terminal 212 via a wire 215 and a cavity around the LED 213 is filled with a sealing resin 216.

Figure 34:
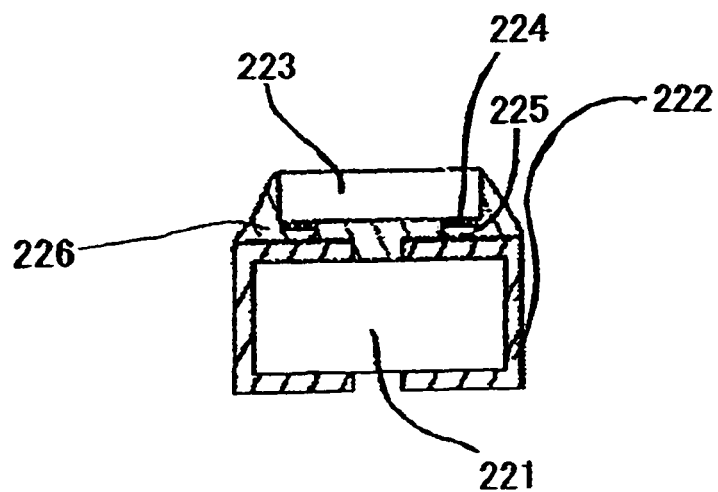
FIG. 34 is a sectional view showing a light emitting device.

FIG. 34 shows a chip type LED disclosed in the same document, Japanese Patent Laid-open No. Hei 9-293904. A pair of electrode terminals 222 are formed on a ceramic supporting member 221, and a pair of electrodes 224 on the surface of an LED 223 are flip-chip connected to the pair of the electrode terminals 222 via conductive brazing portions 225. To forcibly bond the LED 223 to the ceramic supporting member, a gap between the LED and the supporting member is filled with a sealing resin 226.

As previously discussed, when producing an image display unit by arraying such light emitting diodes in a matrix, each light emitting diode must be contained in a package and an array of a number of these light emitting diodes must be mounted for assembly into a flat type image display unit or the like. Thus, since LEDs formed on a wafer are diced (i.e., separated) into individual chips and are each sealed in a package, each LED chip in a bare chip state has a size less than about 1 mm (e.g., each side of an approximately square-shaped chip is less than about 1 mm) and the package of the LED chip has a size on order of about several millimeters. As a result, the size of one pixel becomes large, thereby degrading the resolution, and failing to produce a small-sized high definition image display unit. Further, for a light emitting diode made from a GaN based nitride semiconductor, since the light emitting diode is generally formed on a sapphire substrate, the package of each LED becomes thicker than the thickness of the sapphire substrate.

Figure 35:
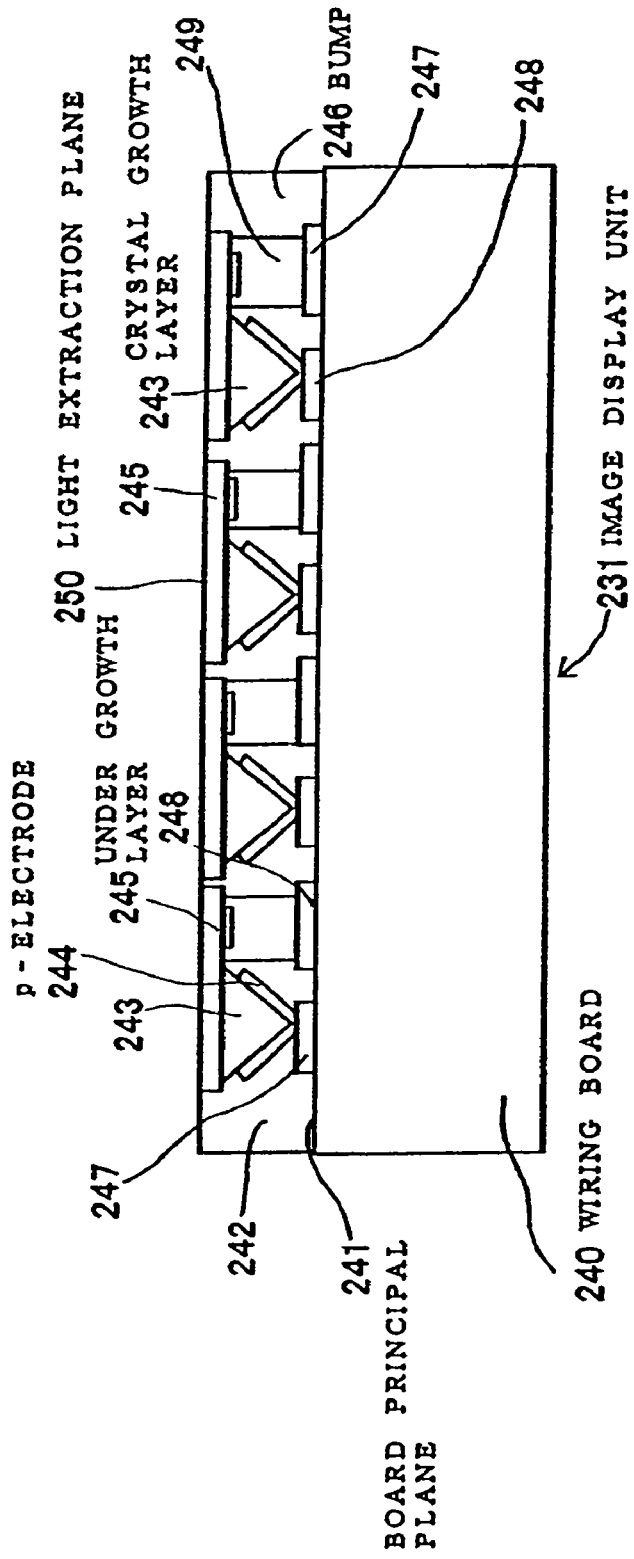
FIG. 35 is a sectional view showing a portion of an embodiment of an image display unit on which crystal growth layers of light emitting devices are inversely mounted according to the present invention.

FIG. 35 is a sectional view of a portion of an embodiment of an image display unit on which light emitting devices are mounted in accordance with a mounting method of the present invention. The image display unit according to this embodiment is a full color-ready color image display unit 231 in which light emitting devices configured as light emitting diodes for emitting light of red, green, and blue are arrayed in a matrix.

In the image display unit 231 according to this embodiment, wiring layers 247 and 248 are previously formed into specific wiring patterns on a board principal plane 241 of a wiring board 240 made from glass, a plastic material, or the like. The wiring layer 248 forms wiring for supplying a signal to a p-electrode of each light emitting diode, and the wiring layer 247 forms wiring for supplying a signal to an n-electrode of each light emitting diode. It should be noted that one of the wiring layers 247 and 248 can be used commonly to respective light emitting diodes.

For each light emitting diode, a crystal growth layer 243 is provided on the wiring layer 248 via a p-electrode 244. The crystal growth layer 243 is disposed in a state vertically inverted from a state at the time of crystal growth. As will be described later, the crystal growth layer 243 is a layer formed by selective growth from an under growth layer 245 located on the upper side of the crystal growth layer 243 via an opening or a window portion of a mask layer (not shown). The under growth layer 245 is also disposed in a state vertically inverted from a state at the time of crystal growth of the crystal growth layer 243.

In an embodiment, the crystal growth layer 243 is made from a nitride semiconductor material having a wurtzite type crystal structure, for example, GaN doped with silicon. The crystal growth layer 243 is formed into a hexagonal pyramid shape having inclined side surfaces covered with an S-plane, that is, (1-101) plane.

In an embodiment, the crystal growth layer 243 is provided with a light emission region formed by providing an active layer between an n-type semiconductor layer and a p-type semiconductor layer. The active layer is formed near an outermost portion of the inverted hexagonal pyramid shape of the crystal growth layer 243. In an embodiment, band gap energies of the active layers provided in three of the adjacent light emitting devices are different from each other in order to correspond to light emission of red, green and blue, respectively. The light emitting diodes are substantially identical to each other in terms of the other structural and dimensional configurations.

The hexagonal pyramid shaped crystal growth layer 243 in an embodiment is mounted on the wiring board 240 with its posture inverted from that at the time of crystal growth along the normal line of the principal plane of the wiring board 240. Accordingly, in the mounted state of the crystal growth layer 243, a back surface of the hexagonal pyramid shape thereof at the time of crystal growth becomes a top surface thereof, the surface acting as a light extraction side. More specifically, the hexagonal pyramid shaped crystal growth layer 243 is joined to the under growth layer 245 via the above-described window portion of the mask layer (not shown) used for crystal growth, and the window portion of the mask layer (not shown) acts as a light extraction opening.

The under growth layer 245 functions as a seed layer for selective growth in an embodiment according to the present invention. The under growth layer 245 is joined to the crystal growth layer 243 via the window portion or opening of the mask layer, and a flat top surface of the under growth layer 245 serves as a light extraction plane 250. The under growth layer 245 also serves as part of the wiring on the n-electrode side (i.e., it functions as a current path between an n-electrode 249 made from a metal and the crystal growth layer 243).

In an embodiment shown in FIG. 35, the n-electrode 249 is positioned under the under growth layer 245 due to the vertical inversion of the light emitting device. With respect to such an n-electrode 249, since the crystal growth layer 243 is larger than the n-electrode 249, a height of the n-electrode 249 is matched with a height of the crystal growth layer 243 by forming a bump or elevated region 246 under the n-electrode 249. The bump or elevated region 246 is a connecting portion by plating or the like. In an embodiment, the bump or elevated region 246 is formed from Cu, Ni, or the like to a thickness of about 10 gm by electroplating or electrolyses plating. To prevent oxidation of the bump or elevated region 246, an Au layer having a thickness of about 0.1 gm is formed on the surface of the bump or elevated region 246 by plating. At the time of mounting each light emitting device, a bottom portion of the bump or elevated region 246 is connected to the wiring layer 247 previously disposed on the board principal plane 241.

In terms of the function of the light emitting device, gaps are formed around the bump or elevated region 246, the wiring layers 247 and 248, and the crystal growth layer 243. In an embodiment, these gaps are filled with an adhesive layer 242 made from a thermosetting adhesive, an ultraviolet-curing type adhesive, or the like.

Figures 36A, 36B:
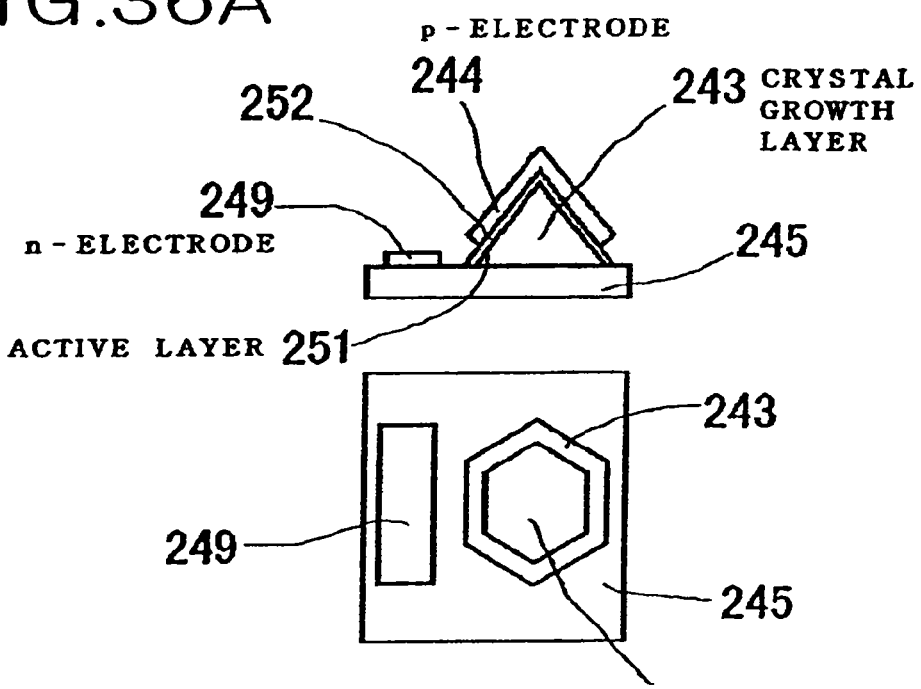

FIGS. 36A and 36B are views showing a light emitting diode to be mounted on an image display unit of an embodiment, wherein FIG. 36A is a sectional view of the light emitting device and FIG. 36B is a top view of the light emitting diode. It should to be noted that the posture of each of a number of the light emitting diodes mounted on the image display unit shown in FIG. 35 is inverted from that of the light emitting diode shown in FIG. 36A along the normal line of the board principal plane.

The production of the light emitting diode will be described with reference to FIGS. 36A and 36B. A hexagonal pyramid shaped or a hexagonal trapezoid shaped crystal growth layer 243 is formed by selective growth on a growth substrate different from the wiring board 240, for example, a sapphire substrate, preferably, via an under growth layer 245. The crystal growth layer 243 can be easily formed by selective growth so as to have a structure having a crystal plane inclined to the substrate principal plane, for example, an S-plane. In particular, the S-plane is a stable plane formed by selective growth on a (C+) plane, and is relatively easily formed. The S-plane is expressed as a (1-101) plane by Miller indices of a hexagonal system. For a crystal layer made from a gallium nitride based compound semiconductor, the number of bonds are maximized at the S-plane, with a result that a VIII ratio is effectively increased. This is advantageous in improving the crystallinity of a stacked structure. Further, in this crystal growth layer 243, since crystal is grown in an orientation different from that of a substrate, dislocations extending upward from the substrate may be often bent. This is advantageous in reducing crystal defects.

Types of materials used for forming the crystal growth layer 243 are not particularly limited insofar as the materials can form a light emission region composed of a first conductive layer, an active layer 251, and a second conductive layer 252, but may be desirable to have a wurtzite type crystal structure. Specific examples of these materials may include a group III based compound semiconductor, a BeMgZnCdS based compound semiconductor, and a BeMgZnCdO based compound semiconductor, and further a gallium nitride (GaN) based compound semiconductor, an aluminum nitride (AlN) based compound semiconductor, an indium nitride (InN) based compound semiconductor, an indium gallium nitride (InGaN) based compound semiconductor, and an aluminum gallium nitride (AlGaN) based compound semiconductor. In particular, a nitride semiconductor such as a gallium nitride based compound semiconductor is preferably used. It should be noted that according to the present invention, InGaN, AlGaN or the like does not necessarily mean a nitride semiconductor having only a ternary mixed crystal structure, and similarly, GaN or the like does not necessarily mean a nitride semiconductor having only a binary mixed crystal structure. For example, even if InGaN contains a trace of Al and inevitable impurities in a range not to change the function of InGaN, such a material can be used for forming the crystal growth layer according to the present invention.

To grow the above-described crystal layer, there can be used various vapor phase growth methods: a metal organic chemical vapor deposition method including metal organic chemical vapor deposition (MOCVD) and metal organic vapor phase epitaxy (MOVPE) and the like, and a molecular beam expitaxial growth (MBE) method, and further, a hydride vapor phase epitaxy (HYPE) method. In particular, the MOCVD method is effective to rapidly grow a crystal layer having a high crystallinity. When adopting the MOCVD method, trialkyl metal compounds are used as source materials, for example, TMG (trimethyl gallium) or TEG (triethyl gallium) used as a Ga source, TMA (trimethyl aluminum) or TEA (triethyl aluminum) is used as an Al source, and TMI (trimethyl indium) or TEI (triethyl indium) used as an In source; a gas such as ammonia or hydrazine is used as a nitrogen source; and various gases are used as impurity sources, for example, silane gas for Si, germanium gas for Ge, Cp2Mg (cyclopentadienyl magnesium) for Mg, and DEZ (diethyl zinc) for Zn. According to the MOCVD method of the present invention, these gases are supplied to a surface of a substrate heated typically at about 600° C. or more to be decomposed, to form an InAlGaN based compound semiconductor by epitaxial growth.

Concretely, selective growth may be performed by forming a thin mask layer on the under growth layer 245, and selectively opening the mask layer to form a window region. The mask layer can be made from silicon oxide or silicon nitride. The window region is an opening portion formed in the mask layer. The window region is formed into a hexagonal shape in this embodiment. However, it may be formed into any other shape such as a circular shape, a square shape, a triangular shape, a rectangular shape, a diamond shape, an elliptic shape, the like and combinations thereof. Since crystal growth proceeds in the transverse direction during the process of selective growth from the window region of the mask layer, it is possible to suppress occurrence of through-dislocations.

In each of the light emitting diodes used for the image display unit of the present invention, the active layer 251 extends within a plane parallel to the inclined crystal plane and is held between the first conductive layer and the second conductive layer 252. The active layer 243 is formed on the crystal growth layer 243 via a semiconductor layer, or formed in the crystal growth layer or on the surface of the crystal growth layer.

In an embodiment, the first conductive layer is a p-type or an n-type cladding layer, and the second conductive layer is an n-type or a p-type cladding layer. For the crystal growth layer formed by a silicon-doped gallium nitride based compound semiconductor layer, a silicon-doped gallium nitride based compound semiconductor is formed by an n-type cladding layer, an InGaN layer is formed as the active layer 251, and a magnesium-doped gallium nitride based semiconductor layer is formed as a p-type cladding layer. Such a structure is known as a double-hetero structure. The InGaN layer formed as the active layer 251 may be held between AlGaN layers. The active layer 251 may be configured as a single bulk active layer. However, it may be configured as that having a quantum well structure, such as a single quantum well (SQW) structure, a double quantum well (DQW) structure, or a multi-quantum well (MQW) structure. The quantum well structure has a barrier layer for separating quantum wells from each other, as needed. The active layer 251 configured as the InGaN layer has an advantageous structure allowing easy production and improvement in luminous characteristics of the device using the same. The InGaN layer has another advantageous structure allowing easy crystallization when growth of InGaN on the S-plane from which nitrogen atoms are hard to be released, to improve the crystallinity, thereby enhancing a luminous efficiency of the device using the same.

A p-electrode 244 formed on the crystal growth layer 243 is an electrode for injecting a current in the active layer 251. According to an embodiment, the p-electrode 244 is formed on the inclined crystal plane of the crystal growth layer 243, and since the light emitting diode is inversely mounted on the wiring board, the p-electrode 244 functions as a reflection film opened upward, which contributes to improvement of an efficiency of extracting light from the inverted light emitting diode.

In an embodiment, each light emitting diode is disposed on the wiring board 240 in the posture being inverted from that at the, time of crystal growth. At this time, the flat top surface of the under growth layer 245 functions as the light extraction plane 250 through which light is extracted from the active layer 251 of the crystal growth layer 243. The function of the top surface of the under growth layer 245 makes it possible to enhance the light extraction efficiency in combination with the function of the p-electrode 244 as the reflection film. Although the crystal growth layer 243 is formed into a hexagonal pyramid shape by selective growth, since the bump or elevated region 246 is disposed on the n-electrode 249 side, the top surface of the under growth layer 246 of each device, which functions as the light extraction plane 250, can be kept substantially at the same level, (i.e., at the same horizontal height). Further, since a space around each device is filled with an adhesive 242, it is possible to eliminate, for example, tilting of the crystal growth layer 243.

Since each light emitting diode is mounted after being finished, it is possible to prevent a defective device from being mounted on the wiring board, and hence to improve the production yield of the image display unit as a whole. With the provision of the bump or elevated region 246, a pair of the positive and negative electrodes are collected on the wiring board 240 side, it is possible to eliminate, for example, the reduction of the light extraction area by the presence of the electrodes. With this configuration, the image display unit of this embodiment enables high definition color display. Additionally, the image display unit of this embodiment can be produced in accordance with a production process which effectively uses the advantages of selective growth.

In the image display unit of this embodiment, the n-electrode 249 and the bump or elevated region 246 can be each used commonly, adjacent to two of the diodes, and the under growth layer 245 of each diode may be formed so as to be continuous to that-of the adjacent diode. In this embodiment, the image display unit is configured as that allowing color display. However, it may be configured to allow two colors or to allow a combination of another color with R, G, and B. A selective transistor for driving each diode can be disposed on the wiring board 240.

Although the device is configured as a light emitting device in this embodiment, the present invention is not limited thereto. For example, each device inversely mounted on the wiring board may be configured as a transistor or any other semiconductor device. A device mounting board on which such devices are mounted may be prepared, followed by completion of an image display unit or any other semiconductor device in the subsequent steps.

Figure 37:
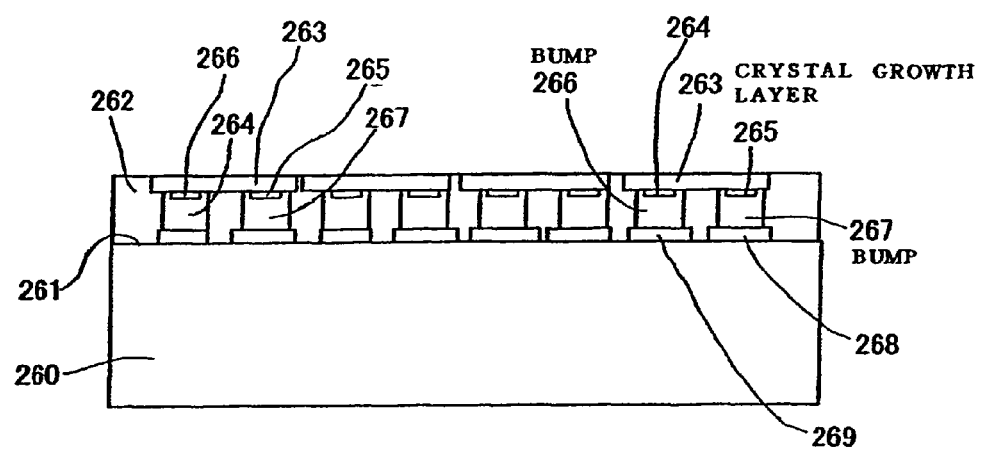
FIG. 37 is a sectional view showing a portion of an image display unit according to an embodiment of the present invention.

An image display unit using light emitting diodes according to an embodiment of the present invention will be described with reference to FIG. 37. Wiring layers 268 and 269 are formed on a board principal plane 261 of a wiring board 260, bumps or elevated regions 266 and 267 are formed on the wiring layers 268 and 269, respectively, and a crystal growth layer 263 is connected to the upper sides of the bumps or elevated regions 266 and 267 via the p-electrode 264 and n-electrode 265. The crystal growth layer 263 is formed into an approximately flat plate shape. An active layer (not shown) extends on the crystal growth layer 263, and the p-electrode 264 and the n-electrode 265 are formed so as to be electrically connected to a first conductive layer and a second conductive layer formed to hold the active layer there between. The light emitting diode thus prepared is then inverted, and is placed on the bumps or elevated regions 266 and 267 so that the p-electrode 264 and the n-electrode 265 positioned on the back surface of the crystal growth layer 263 are connected to the upper portions of the bumps or elevated regions 266 and 267, respectively. Like the previous embodiment, spaces around the bumps or elevated regions 266 and 267 are filled with an adhesive layer 262 made from a thermosetting adhesive, an ultraviolet-curing type adhesive, or the like.

In the image display unit of this embodiment, since the p-electrode 264 and the n-electrode 265 are connected to the bumps or elevated regions 266 and 267, respectively, the crystal growth layer allowing light emission can be kept at a specific horizontal height, and since the spaces around the bumps or elevated regions 266 and 267 are filled with the adhesive layer 262, it is possible to eliminate, for example, tilting of the crystal growth layer 263. Since each light emitting diode is mounted after being finished, it is possible to prevent a defective device from being mounted on the wiring board, and hence to improve the production yield of the image display unit as a whole. With the provision of the bumps or elevated regions 266 and 267, a pair of the positive and negative electrodes are collected on the wiring board 260 side, and it is possible to eliminate, for example, reduction of the light extraction area by the presence of the electrodes. With this configuration, the image display unit of this embodiment enables high definition color display.

A method of producing an image display unit in accordance with an embodiment of the present invention will be described with reference to FIGS. 38 to 46.

Figure 38:
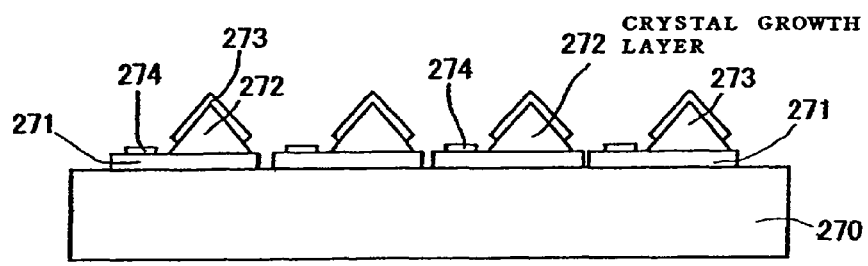
FIG. 38 is a sectional view showing a step of forming crystal growth layers and electrodes in a method of producing an image display unit according to an embodiment of the present invention.

As shown in FIG. 38, a substrate 270 for growth, which is configured as a sapphire substrate with a C-plane taken as a principal plane is prepared, and an under growth layer 271, which is composed of low temperature and high temperature buffer layers, is formed on the substrate 270 for growth. A mask layer (not shown) made from silicon oxide, silicon nitride or the like is formed so as to cover the under growth layer 271, and window regions or openings corresponding to crystal growth regions are formed in the mask layer. Subsequently, each hexagonal pyramid shaped crystal growth layer 272 having side surfaces covered with an inclined S-plane is obtained by selective crystal growth from the corresponding window region. A first conductive layer, an active layer, and a second conductive layer (which are not shown) are formed on each crystal growth layer 272. At openings formed in the mask layer, p-electrodes 273 are formed by a multi-layer metal film such as an Ni/Pt/Au film or the like, and n-electrodes 274 are formed by a multi-layer metal film such as a Ti/Al/Pt/Au film or the like. The p-electrode 273 is formed, for example, by vapor-deposition, and the n-electrode 274 is formed, for example, by a lift-off process (i.e., peeling away the unwanted metal and leaving behind metal traces where desired).

After the p-electrodes 273 and the n-electrodes 274 are formed, the under growth layer 271 on the substrate 270 for growth is separated into parts corresponding to respective devices. The separation of the under growth layer 271 is performed, for example, by reactive ion etching. A chip size of each device is typically set to a value of about 20 gm (e.g., each side of an approximately square-shaped chip is about 20 gm), and an array pitch of the chips is typically set to a value of about 25 μm.

Figure 39:
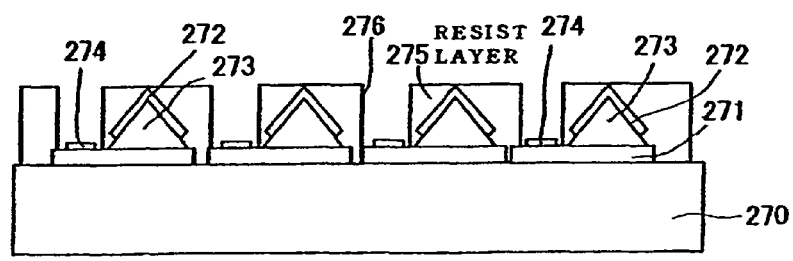
FIG. 39 is a sectional view showing a step of forming a resist layer in a method of producing an image display unit according to an embodiment of the present invention.

A resist layer 275 is formed overall on the substrate 270 for growth. A height of the resist layer 275 is set to a value being nearly equal to a height of a tip portion of each p-electrode 273. A region corresponding to each n-electrode 274 is opened in the resist layer 275, to form an opening 276 in the resist layer 275, as shown in FIG. 39, so that the n-electrode 274 located on the bottom of the opening 276 is exposed.

Figure 40:
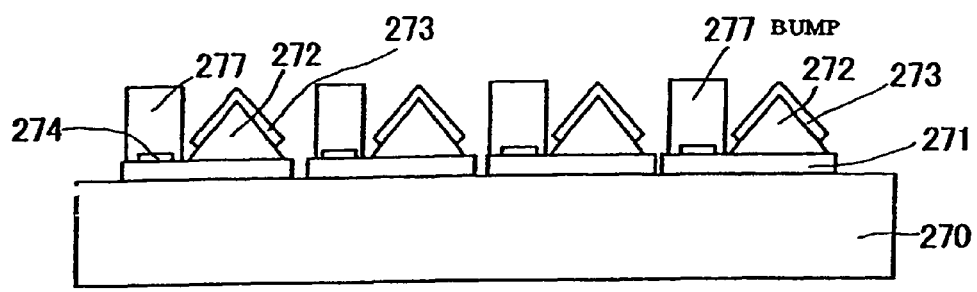
FIG. 40 is a sectional view showing a step of forming bumps in a method of producing an image display unit according to an embodiment of the present invention.

A bump or elevated region 277 is formed in each opening 276 formed in the resist layer 275, for example, by plating. More specifically, the bump or elevated region 277 is a connecting portion formed from Cu, Ni, or the like, to a height of about 10 gm by electroplating or electrolyses plating. In order to prevent oxidation, an Au layer having a thickness of about 0.1 gm is formed on the surface of the bump or elevated region 277 by plating. After formation of each bump or elevated region 277, the resist layer 275 is removed (as shown in FIG. 40).

Figure 41:
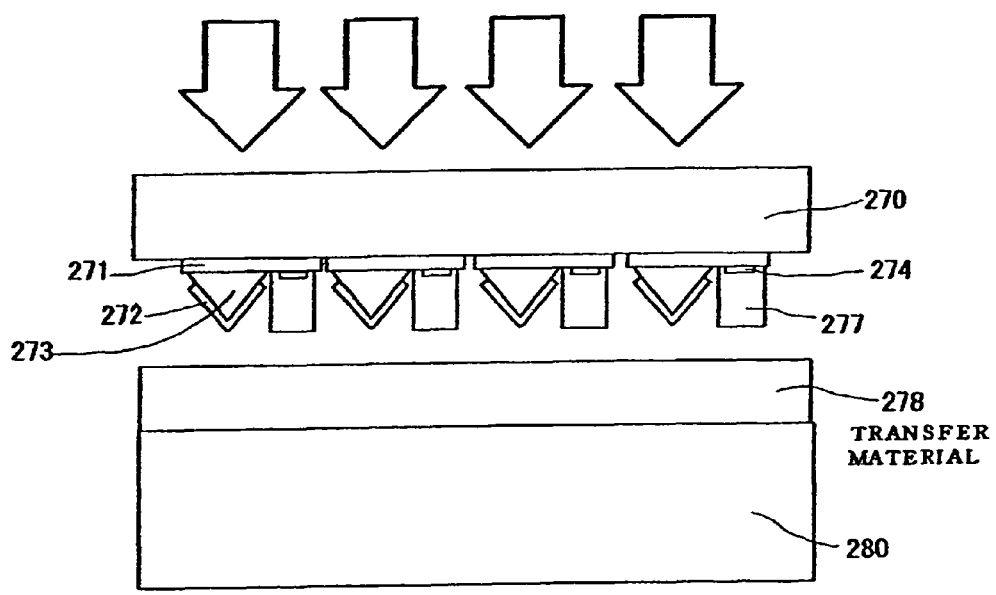
FIG. 41 is a sectional view showing a step of irradiating devices with an energy beam in a method of producing an image display unit according to an embodiment of the present invention.

After removal of the resist layer 275, as shown in FIG. 41, a board 280 for transfer, which is made from glass or the like and is coated with a transfer material 278, is prepared, and the substrate 270 for growth, on which the bumps or elevated regions 277 have been already formed (as described above), is opposed to the board 280 for transfer. The transfer material 278 is an adhesive material, which preferably exhibits low absorption against a wavelength of a laser beam used for irradiation. This is because such a material is low in abrasion caused by a laser beam, to improve a positional accuracy of separated light emitting devices. When the principal plane of the substrate 270 for growth 270 is opposed to the principal plane of the substrate 280 for transfer, the back surface of the substrate 270 for growth, opposed to the side on which the light emitting devices are formed, is irradiated with a KrF excimer laser beam, a triple wave YAG laser beam, or the like. With irradiation by the laser beam, nitrogen is generated at a boundary between the under growth layer 271 and the substrate 270 for growth, whereby the light emitting devices are separated from the substrate 270 for growth.

As shown in FIG. 42, each of the light emitting diodes thus separated from the substrate 270 for growth by irradiation with the laser beam is temporarily held by the board 280 for transfer while being buried in the transfer material 278. At this time, a Ga layer 281 adheres on the upper surface of each under growth layer 271, from which the light emitting diode is separated from the substrate 279 for growth. Since the upper surface of the under growth layer 271 acts as a light extraction plane, the Ga layer 281 must be removed by etching or the like. An etchant used for such etching may be of an alkali or an acid type, but should be selected so as not to reduce the adhesive strength of the transfer material 278.

The image display unit is configured such that the light emitting devices of one of R, G, and B are regularly arrayed, and consequently, as shown in FIG. 43, those of the light emitting devices, which are located with a pitch corresponding to an electrode pitch of the wiring board, are selectively taken from the board 280 for transfer. This is based on the assumption that the light emitting diodes held on the board 280 for transfer are identical to each other in terms of color (i.e., emission wavelength). Accordingly, in order to mount light emitting diodes different in emission wavelength on the wiring board, a number of the substrates 280 for transfer must be used.

In this embodiment, an attracting head 282 is used for selectively taking the light emitting diodes from the board 280 for transfer. The attracting head 282 has leading ends 284, in each of which an attracting hole 283 is formed. The leading ends 284 are located with a pitch corresponding to the electrode pitch of the wiring board. A portion, around the attracting hole 283, of each leading end 284 of the attracting head 282 is flattened, and the upper surface of the under growth layer 271, which acts as the light extraction plane of the light emitting device, is attracted to the flatted portion of the leading end 284. The attracting work can be performed for each device. According to this embodiment, a number of the light emitting devices located with a pitch corresponding to the electrode pitch of the wiring board are simultaneously attracted. With this configuration, it is possible to simplify the production process and reduce the production cost.

Figure 44:
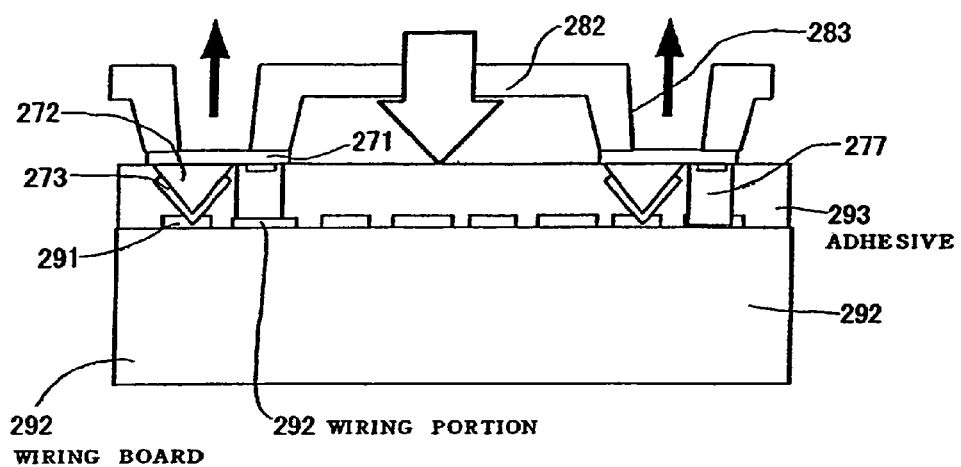
FIG. 44 is a sectional view showing a step of mounting a light emitting device in a method of producing an image display unit according to an embodiment of the present invention.

As shown in FIG. 44, a number of the light emitting devices located with a pitch corresponding to the electrode pitch of the wiring board are carried to the wiring board, which is designated by reference numeral 290. The devices come closer to a principal plane of the wiring board 290 in the direction perpendicular to the principal plane of the wiring board 290, to be adhesively bonded thereto. Wiring layers 291 and 292 are previously formed on the principal plane of the wiring board 290. After bringing the devices into press-contact with the principal plane of the wiring board 290, the attracting head 282 is released, to allow each device to be temporarily bonded to the wiring board 290. The principal plane of the wiring board 290 is coated with an adhesive, which functions to hold the devices on the principal plane of the wiring board 290. In addition, the adhesive 293 may be configured as a thermosetting adhesive, an ultraviolet-curing type adhesive, or the like.

Figure 45:
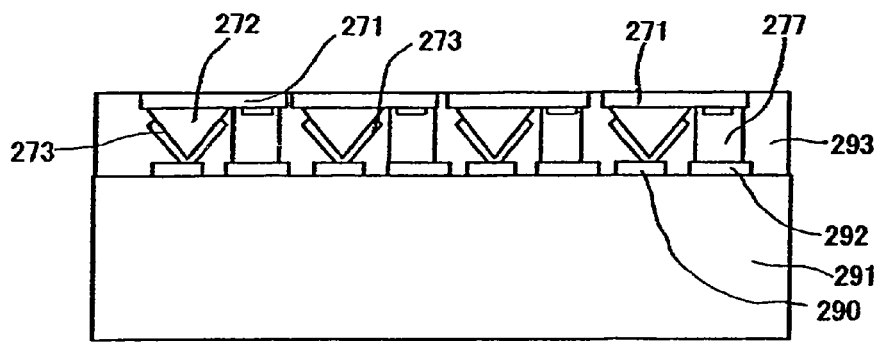
FIG. 45 is a sectional view showing a state after light emitting devices are mounted in a method of producing an image display unit according to an embodiment of the present invention.
Figure 46:
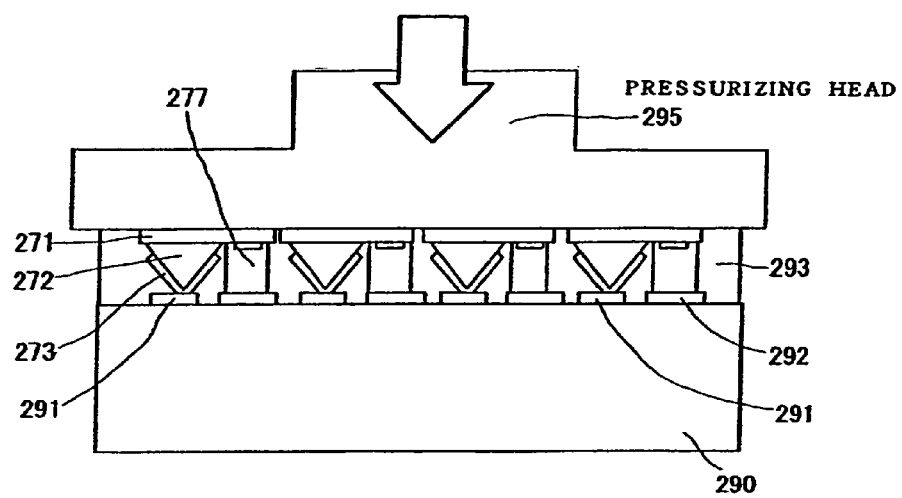
FIG. 46 is a sectional view showing a step of pressing light emitting devices in a method of producing an image display unit according to an embodiment of the present invention.

FIG. 45 shows a state obtained by carrying the devices of R, G, and B to the principal plane of the wiring board 290. The adjacent two of the devices are different in emission wavelength. Each device is mounted on the wiring board 290 while being kept horizontally with respect to the principal plane of the wiring board 290 by using the bump or elevated region 277.

A pressurizing head 295 is pressed down onto the upper surface of each under growth layer 271, which is taken as the light extraction side of each device, and in such a state, the adhesive 293 is hardened. If the adhesive 293 is of a thermosetting type, the pressurizing head 295 may be configured as a heating type pressuring head which is heated by a pulse heating manner. If the adhesive 293 is of an ultraviolet-curing type, ultraviolet rays may be emitted upward from the back surface of the wiring board 290 in the state that each device is pressed on the wiring board 290 by the pressurizing head 295, or in the case where the pressurizing head 295 is made from a light transmission material such as glass or quartz, ultraviolet rays may be emitted downward from the upper side of the pressurizing head 295.

In the method of producing an image display unit according to this embodiment, since a number of the light emitting devices located with a pitch corresponding to the electrode pitch of the wiring board 290 are collectively mounted on the principal plane of the wiring board 290, it is possible to produce the image display unit in a short time and at a low cost. Each device can be mounted in a horizontal posture and prevented from being tilted by using the bump or elevated region 277, and further, the devices can be mounted on the wiring board with a reduced margin for alignment. As a result, it is possible to array the light emitting devices on the wiring board at high accuracy. Further, the use of the bump or elevated region 277 enables greater reliability in the electrical wiring and maximization of the light extraction efficiency.

In this embodiment, since the light emitting devices can be inspected while being held on the substrate 280 for transfer, it is possible, early on, to identify and remove defective devices, and hence to improve the production yield. Further, since the Ga layer can be removed before the devices are mounted on the wiring board 290, it is possible to eliminate, for example, damage to the wiring board 290 caused by etching.

An embodiment in which light emitting devices are formed with a pitch corresponding to an electrode pitch of a wiring board and are directly mounted on the wiring board, will be described with reference to FIGS. 47 and 48.

Figure 47:
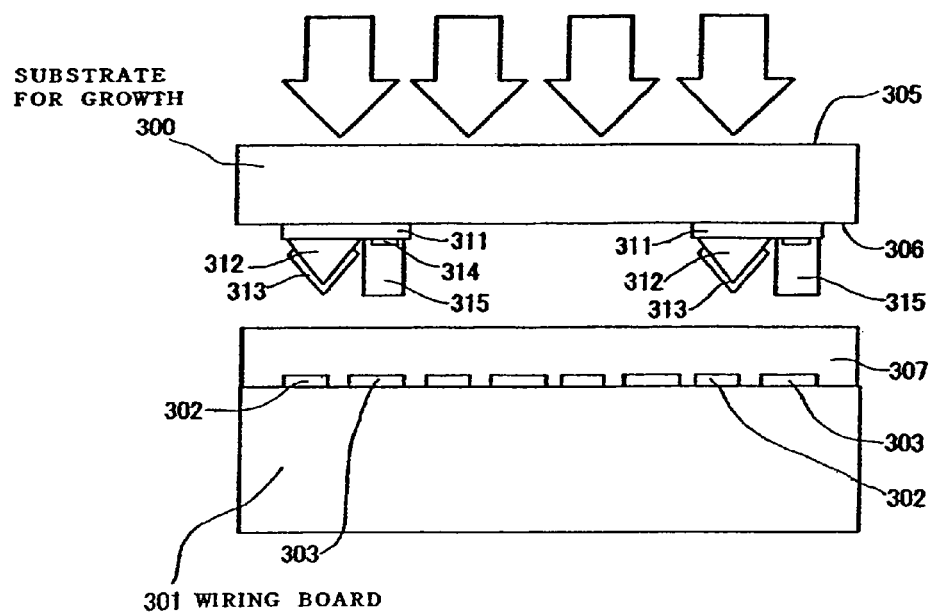
FIG. 47 is a sectional view showing a step of irradiating light emitting devices with an energy beam in a method of producing an image display unit according to an embodiment of the present invention.

As shown in FIG. 47, light emitting devices arrayed with a pitch corresponding to an electrode pitch of a wiring board 301 are formed on a substrate 305 for growth. Like the previous embodiments, each light emitting device is produced by forming a hexagonal pyramid shaped crystal growth layer 312 on an under growth layer 311, forming a p-electrode 313 on the crystal growth layer 312 and an n-electrode 314 on the under growth layer 311, and forming a bump or elevated region 315 having a height nearly equal to a height of the p-electrode 313. A number of the light emitting devices thus formed on the substrate 305 for growth are arrayed with a pitch corresponding to an arrangement pitch of sets of electrode layers 303 and 302 of the wiring board 301.

The substrate 305 for growth, on which the light emitting devices have been formed, is opposed to the wiring board 301, and in such a state, the back surface of the substrate 305 for growth is irradiated with a KrF excimer laser beam, a triple wave YAG laser beam, or the like so that nitrogen is generated at a boundary between each under growth layer 311 and the substrate 305 for growth, whereby each light emitting device is separated from the substrate 305 for growth and is held on the wiring board 301.

Figure 48:
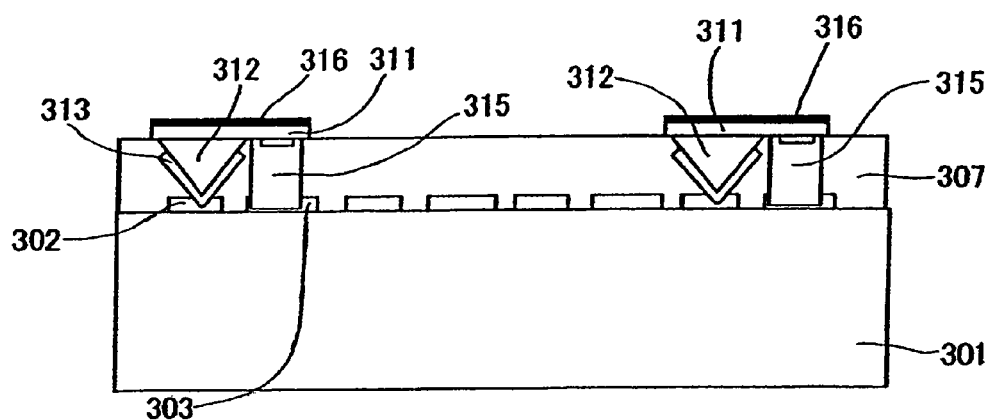
FIG. 48 is a sectional view showing a step of mounting light emitting devices in a method of producing an image display unit according to an embodiment of the present invention.

FIG. 48 shows an embodiment in which the light emitting devices are held on the wiring board 301. Subsequently, the mounting is repeated for light emitting devices of other emission wavelengths, followed by hardening of an adhesive 307, to produce an image display unit. At this time, a Ga layer 316 is formed on an upper surface of the under growth layer 311, and accordingly, if the adhesive 307 is of an ultraviolet-curing type, ultraviolet rays may be emitted from the back surface side of the wiring board 301. If the adhesive 307 is of a thermosetting type, the hardening may be performed in the same manner as that described in a previous embodiment. By removing the Ga layer 316 after hardening the adhesive 307, it is possible to significantly reduce damages of the wiring board 301.

An embodiment in which light emitting devices located with a pitch corresponding to an electrode pitch of a wiring board are selectively irradiated with laser beams and the separated light emitting devices are directly mounted on the wiring board, will be described with reference to FIG. 49.

Figure 49:
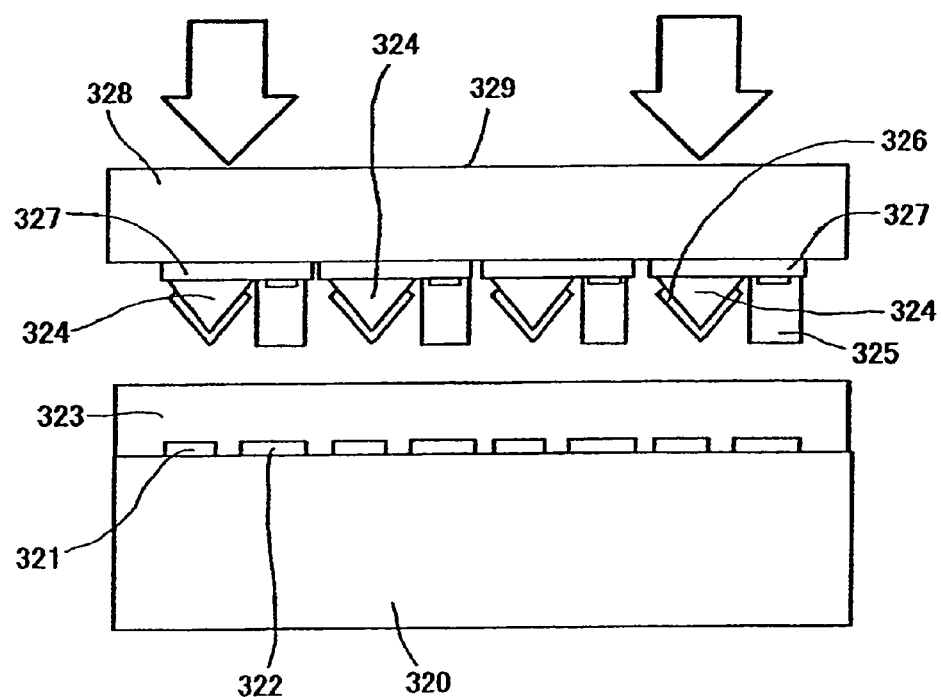
FIG. 49 is a sectional view showing a step of irradiating selected light emitting devices with an energy beam in a method of producing an image display unit according to an embodiment of the present invention.

As shown in FIG. 49, a number of light emitting devices are formed on a substrate 328 for growth. Like the previous embodiment, each light emitting device is produced by forming a hexagonal pyramid shaped crystal growth layer 324 on an under growth layer 327, forming a p-electrode 326 on the crystal growth layer 324 and an n-electrode on the under growth layer 327, and forming a bump or elevated region 325 having a height nearly equal to a height of the p-electrode 326.

In an embodiment, sets of electrode layers 312 and 322 are formed with a specific pitch on a principal plane of a wiring board 320. When the substrate 328 for growth is opposed to the wiring board 320, those of the light emitting diodes, located with a pitch corresponding to the electrode pitch of the wiring board 320, are irradiated with laser beams. With the laser irradiation of the back surface of the substrate 328 for growth with a KrF excimer laser beam, a triple wave YAG laser beam, or the like, nitrogen is generated at a boundary between each under growth layer 327 and the substrate 328 for growth, whereby each light emitting device is separated from the substrate 328 for growth and is held on the wiring board 320. Thus, since those of the light emitting devices, located with the pitch corresponding to the electrode pitch of the wiring board 320, are selectively irradiated with laser beams, all of the light emitting devices on the substrate 328 for growth are not separated from the substrate 328 for growth but only the devices of one color, located with the pitch corresponding to the electrode pitch of the wiring board 320, can be separated and transferred to the wiring board 320. By repeating such a step for devices of other emission wavelengths, an image display unit is produced. The irradiation of a laser beam may be performed by scanning a single beam or moving the substrate for growth and the wiring board relative to each other with a single beam fixed.

An embodiment in which light emitting devices are mounted by using two boards for transfer, will be described with reference to FIGS. 50 to 54.

Figure 50:
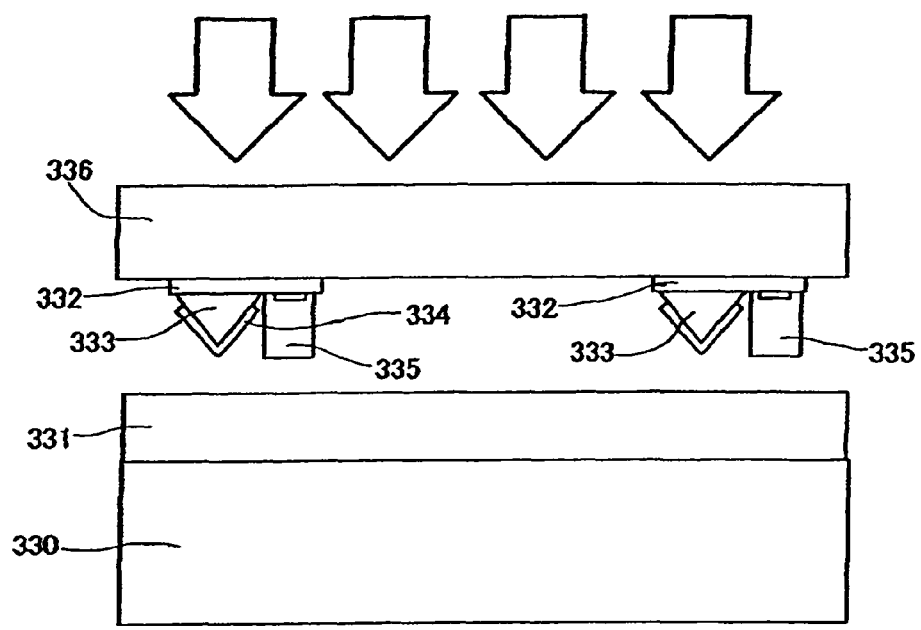
FIG. 50 is a sectional view showing a step of irradiating selected light emitting devices with an energy beam in a method of producing an image display unit according to an embodiment of the present invention.

As shown in FIG. 50, in an embodiment, each light emitting device is produced on a substrate 336 for growth by forming a hexagonal pyramid shaped crystal growth layer 333 on an under growth layer 332, forming a p-electrode 334 on the crystal growth layer 333 and an n-electrode on the under growth layer 332, and forming a bump or elevated region 335 having a height nearly equal to a height of the p-electrode 334. The light emitting devices thus formed on the substrate 336 for growth are spaced from each other with a pitch corresponding to an electrode pitch of a wiring board. The substrate 336 for growth is opposed to a board 330 for transfer, and in such a state, each light emitting device is separated from the substrate 336 for growth by irradiating the back surface of the substrate 336 for growth with a laser beam, and is transferred to the board 330 for transfer. The board 330 for transfer has a layer of a transfer material 331 such as a silicone resin, and each light emitting device is held on the board 330 for transfer via the transfer material 331.

Figure 51:
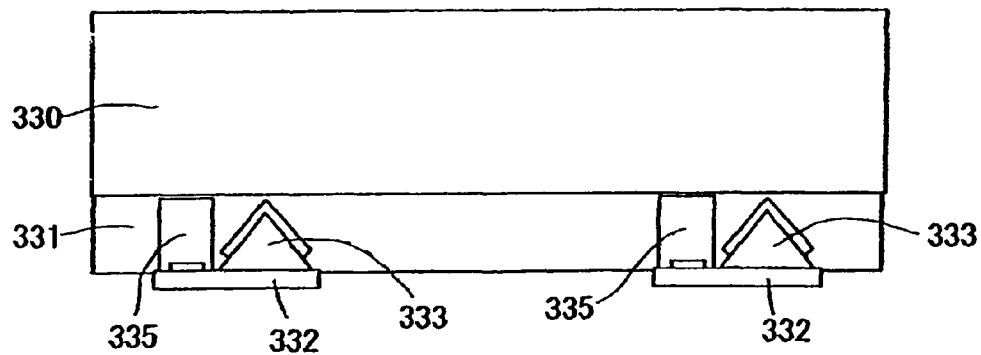
FIG. 51 is a sectional view showing a transfer step in a method of producing an image display unit according to an embodiment of the present invention.
Figure 52:
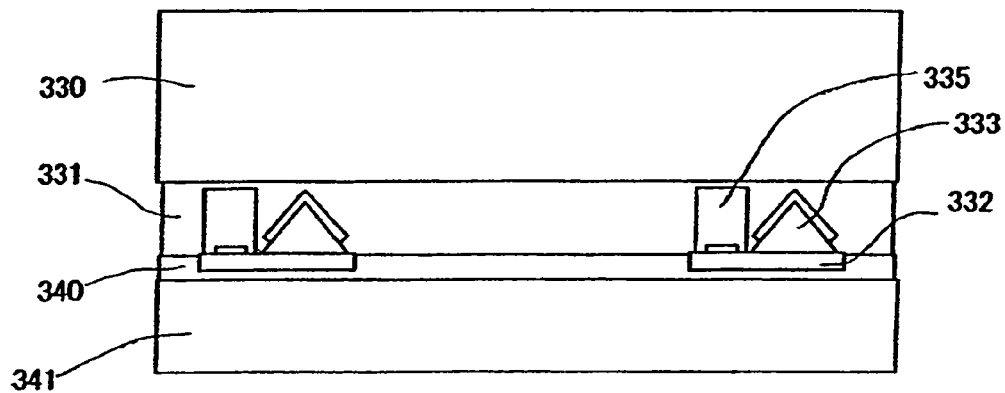
FIG. 52 is a sectional view showing a second transfer step in a method of producing an image display unit according to an embodiment of the present invention.

In an embodiment, as shown in FIG. 51, a Ga layer is removed, whereby the light emitting device is held by the board 330 for transfer with a light extraction plane exposed to the outside. Subsequently, as shown in FIG. 52, a second board 341 for transfer, whose upper surface is coated with a transfer material 340, is stuck on the board 330 for transfer. In an embodiment, the transfer material 340 is an ultraviolet-curing type adhesive, and the second board 341 for transfer is made from glass or quartz glass.

Figure 53:
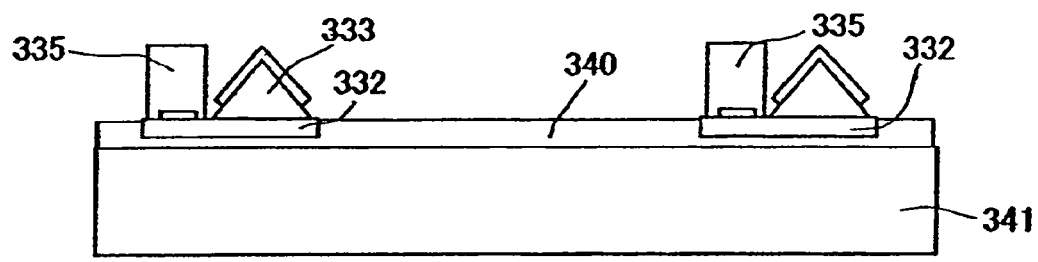
FIG. 53 is a sectional view showing a state after a second transfer in a method of producing an image display unit according to an embodiment of the present invention.

The first board 330 for transfer is then peeled, whereby the light emitting devices are transferred to the second board 341 for transfer, as shown in FIG. 53.

Figure 54:
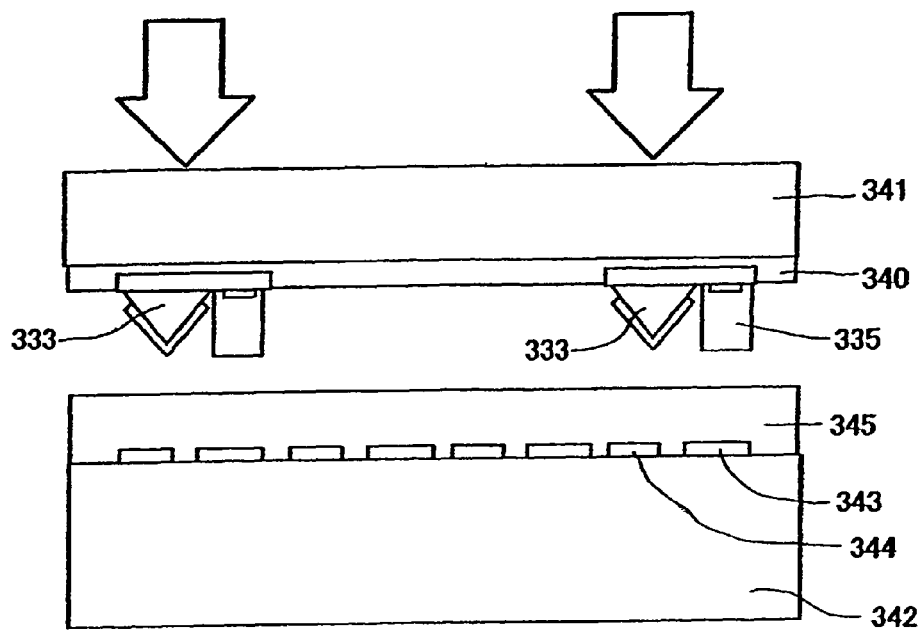
FIG. 54 is a sectional view showing a step of mounting light emitting devices in a method of producing an image display unit according to an embodiment of the present invention.

As shown in FIG. 54, the second board 341 for transfer is opposed to a wiring board 342 such that the light emitting devices correspond to sets of electrode layers 343 and 344 formed on a principal plane of the wiring board with a specific pitch. In such a state, the back surface of the substrate 328 for growth is irradiated with laser beams at positions spaced with a pitch corresponding to the electrode pitch of the wiring board 342, whereby each light emitting device is separated by abrasion of the transfer material 340 and is held on the wiring board 342. In this transfer method, since irradiation of laser beams is selectively performed at positions spaced with a pitch corresponding to the electrode pitch, all of the light emitting devices on the substrate 328 for growth are not separated but only devices of one color, spaced from each other with the pitch corresponding to the electrode pitch of the wiring board, can be transferred. Subsequently, the above step is repeated for light emitting devices of other emission wavelengths, followed by hardening of an adhesive 345 on the wiring board 342, to produce an image display unit. In addition, if the residue of the transfer material 340 after abrasion adheres on the back surface of each light emitting device, it may be removed by cleaning or polishing.

Figure 55:
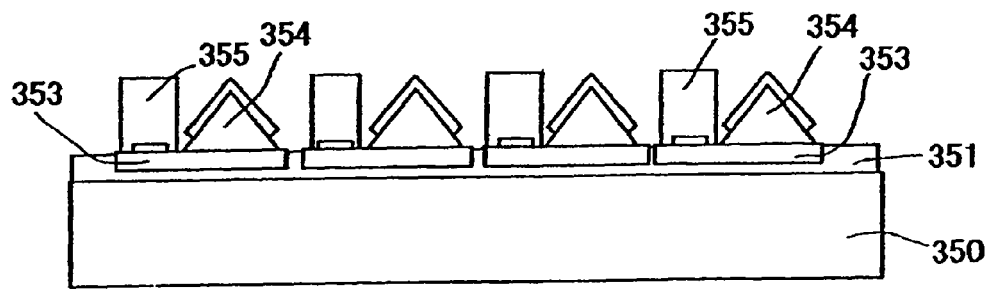
FIG. 55 is a sectional view showing a step of forming light emitting devices in a method of producing an image display unit according to an embodiment of the present invention.

In an embodiment, light emitting devices are disposed on a second board 350 for transfer using a transfer material 351, as shown in FIG. 55 The light emitting device is produced by forming a hexagonal pyramid shaped crystal growth layer 354 on an under growth layer 353, and forming a bump or elevated region 355 having a height nearly equal to a height of the p-electrode. The light emitting devices are spaced from each other not with a pitch corresponding to an electrode pitch of a wiring board but with a pitch convenient to production. The other steps are the same as those shown in the previously described embodiment.

Figure 56:
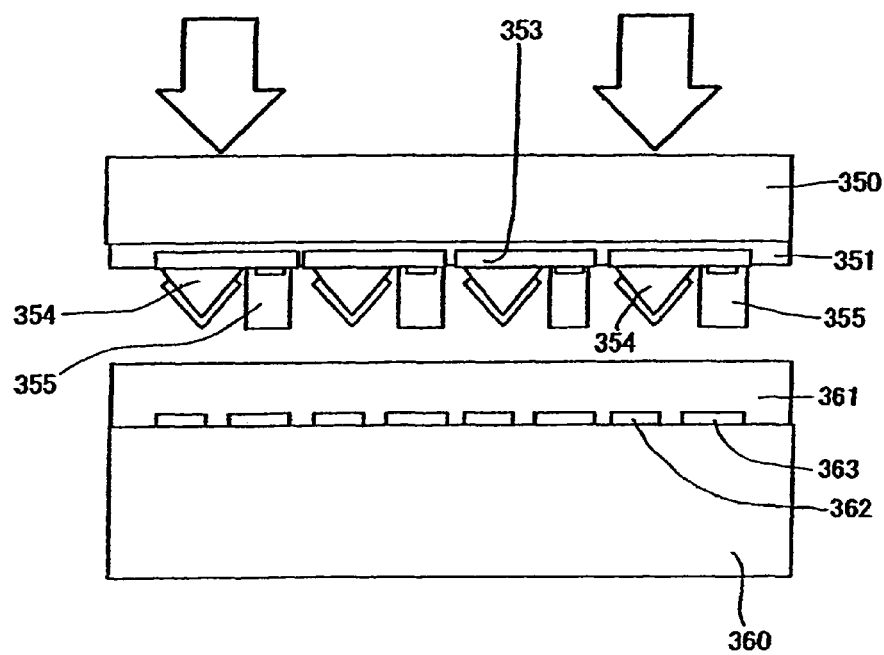
FIG. 56 is a sectional view showing a mounting step accompanied by energy irradiation in a method of producing an image display unit according to an embodiment of the present invention.

As shown in FIG. 56, in an embodiment, the back surface side of the second board 350 for transfer is selectively irradiated with laser beams, whereby the selected light emitting devices are separated from the second board 350 for transfer by abrasion of the transfer material 351 and are transferred to a wiring board 360 having wiring layers 362 and 363. In this transfer method, since irradiation with the laser beams is selectively performed at positions spaced with a pitch corresponding to the electrode pitch, all of the light emitting devices are not separated at once but only devices of one color, spaced from each other with the pitch corresponding to the electrode pitch of the wiring board, can be transferred. Subsequently, the above step is repeated for light emitting devices of other emission wavelengths, followed by hardening of an adhesive 361 on the wiring board 360, to produce an image display unit. In addition, if the residue of the transfer material 351 after abrasion adheres on the back surface of each light emitting device, it may be removed by cleaning or polishing.

Figure 57:
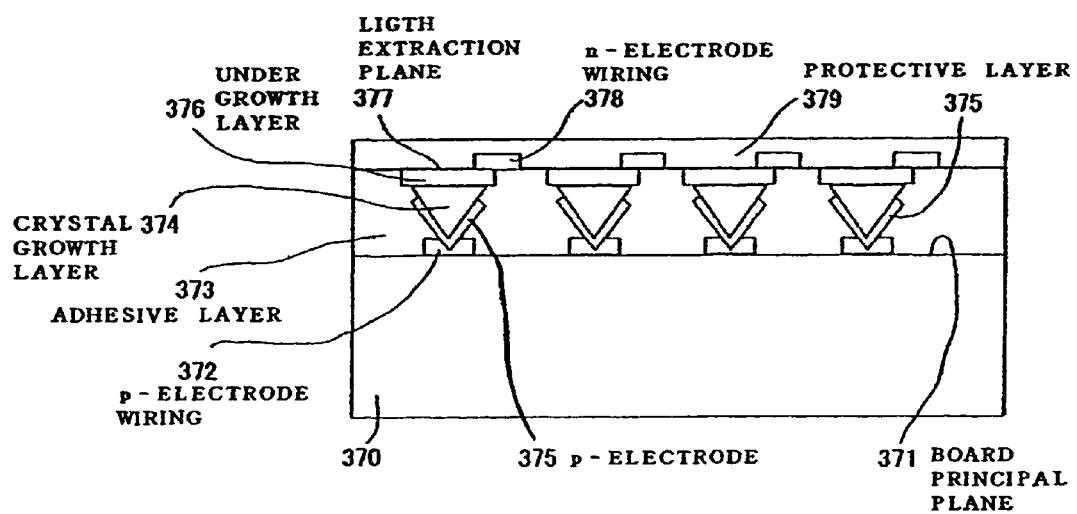
FIG. 57 is a sectional view of an image display unit according to an embodiment of the present invention.

In an embodiment, an n-electrode wiring portion and a p-electrode wiring portion are formed on upper and lower sides of a crystal growth layer, of an image display unit, as shown in FIG. 57. Each p-electrode wiring portion 372 is formed on a board principal plane 371 of a wiring board 370, and a hexagonal pyramid shaped crystal growth layer 374 having an inclined crystal plane is connected to and supported by an upper end of the p-electrode wiring portion 372. A space around the crystal growth layer 374 is filled with an adhesive layer 373. A first conductive layer, an active layer, and a second conductive layer (not shown) are formed on the crystal growth layer 374. It should be noted that the crystal growth layer 374 is supported in the adhesive layer 373 in a posture inverted from that at the time of crystal growth. A p-electrode 375 is formed on a plane parallel to the inclined crystal plane of the crystal growth layer 374. A flat under growth layer 376 used for crystal growth is present on the upper side of the crystal growth layer 374, and an upper surface of the under growth layer 376 is taken as a light extraction plane 377. An n-electrode wiring portion 378 is formed on and electrically connected to a corner portion, on the light extraction plane 377 side, of the under growth layer 376, which corner portion is not overlapped to a light emission region composed of a stack of the first conductive layer, the active layer, and the second conductive layer in the direction along the normal line of the board principal plane 371. Part of the n-electrode wiring portion 378 extends on the adhesive layer 373. More specifically, an n-electrode wiring layer is formed on the adhesive layer 373 typically made from a resin, and after the adhesive layer 373 is hardened, the n-electrode wiring layer is patterned into respective n-electrode wiring portions 378. Each n-electrode wiring portion 378 is covered with a protective layer 379 made from a resin such as polyimide, or the like.

In the image display unit of this embodiment, unlike the light emitting device in which both the p-electrode and the n-electrode are present on the crystal growth plane side, the light emitting device in this image display unit is configured such that at least the n-electrode wiring portion 378 is positioned on the light extraction 377 side of the under growth layer 376. As a result, the chip size of each light emitting device can be reduced by a size corresponding to that of the n-electrode wiring portion. Since the n-electrode wiring portion 378 and the p-electrode wiring portion 372 are formed on the upper and lower sides of the crystal growth layer 374, they are three-dimensionally separated from each other. Accordingly, it is possible to eliminate short-circuit between the p-electrode wiring portion 378 and the n-electrode wiring portion 372, and also to widen the width of the n-electrode wiring portion 378 and hence to realize easy wiring.

In the above-described embodiments, the surface of the bump or elevated region made from Cu or Ni is covered with an Au layer. However, the bump or elevated region may be made from any suitable solder material. A bump or elevated region can be formed on an electrode of a light emitting device by plating or vapor-deposition of a solder material. When using a solder bump, a wiring board may be previously coated with a flux for soldering in place of an adhesive held on the wiring board. Thus, the light emitting device is held on the wiring board with an adhesive strength of the flux. With respect to connection by soldering, according to an embodiment, after light emitting devices of three colors are separated and transferred, a wiring board is overall subjected to a reflow treatment, to connect the light emitting devices to the wiring board. Thus, since the wiring board is put in a reflow furnace, a glass board may be used as the wiring board.

After connection by soldering, the flux is cleaned, and a sealer put between the chips and the wiring board is hardened. The connection by soldering is advantageous in that the connection resistance is low, and that since the alignment accuracy of the light emitting devices is improved by self-alignment at the time of melting of the solder, the pitch of pixels corresponds to the patterning accuracy of the wiring electrodes, to keep the pitch of pixels constant, thereby enhancing the definition of the image display unit. When repairing light emitting devices, the light emitting devices are visually inspected before injection of a sealer, and if a defective device is found, such a defective device is repaired by locally heating the defective device so as to melt the solder bump of the defective device.

An image display unit of the present invention may be embodied as a display unit using light emitting devices such as light emitting diodes (LEDs), semiconductor lasers, or the like and may include an image display unit which has a structure that light emitting devices are arrayed on a wiring board and which is incorporated in separate electronic equipment, for example, a monitor for electronic equipment such as television receivers, video reproducing systems, or computers; an output system for game devices; a monitor for household electronic appliances; and further a small-sized image display unit functioning as a monitor screen for vehicle-mounted navigation systems, portable telephones, portable information terminals, picture recording systems, monitors, the like and combinations thereof.

As described above, according to an embodiment of an image display unit of the present invention, it is possible to enhance various characteristics such as resolution, image quality, and luminous efficiency, easily realize a large-sized screen, and reduce production costs. In particular, according to an embodiment of an image display unit of the present invention, since each light emitting device has a micro-size represented by an occupied area which ranges from about 25 µm2 to about 10,000 µm2, the light emitting devices can be arrayed at a high density; and since the light emitting devices are mounted on the wiring board after being finished, the production yield can be improved and further, if a large-sized screen is required to be formed, it is possible to eliminate the need of a strict process control on the order of µm over the screen.

According to a method of producing an image display unit in accordance with an embodiment of the present invention, it is possible to easily array light emitting devices on a wiring board at a high density, and to mount micro-devices to desired positions of a wiring board while transferring the micro-devices thereto by making use of a temporarily holding board and an energy beam.

Also, according to the method of arraying devices and the method of producing an image display unit in accordance with an embodiment of the present invention, since devices can be held on a temporarily holding member in a state being spaced from each other at large intervals, relatively large electrode pads and the like can be provided by making use of the large intervals, and since wiring is performed by making use of the relatively large electrode pads, even if a size of a final unit is significantly large as compared with the chip size of each device, it is possible to realize easy wiring between the devices.

According to a method of arraying devices and the method of producing an image display unit in accordance with an embodiment of the present invention, since spaces around light emitting devices are covered with a hardened adhesive layer, electrode pads can be each accurately formed on a flattened surface of the adhesive layer such as to extend to a region wider than the chip size of each device, so that the handling of the electrode pads in the second transfer step carried out by using an attracting jig can be facilitated. Additionally, with respect to transfer of light emitting diodes from a substrate for growth, typically, a sapphire substrate to a temporarily holding member, each device can be relatively easily peeled from the sapphire substrate by making use of decomposition of a GaN based material into metal Ga and nitrogen at a boundary between the sapphire substrate and the same.

In a two-step enlarged transfer method adopted in a method of arraying devices and a method of producing an image display unit according to an embodiment of the present invention, letting enlargement ratios in the first and second transfer steps be "n" and "m", respectively, the total transfer magnification becomes n×m, and in order to achieve such a total transfer magnification of n×m, transfer must be repeated by n2 times in the first transfer step and be repeated by m2 times in the second transfer step, and therefore, the total number of transfer becomes (n2+m2) times. In contrast, according to one-step transfer method, in order to achieve the transfer magnification of n×m, the number of transfer becomes (n+m) 2=n2+2 nm+m2. As a result, according to the two-step enlarged transfer method, the number of transfer can be made smaller than that according to the one-step transfer method by 2 nm times, thereby saving time and cost required for the production step. This becomes more significant as the transfer magnification becomes larger.

According to an image display unit of an embodiment of the present invention, in which each light emitting diode is arrayed on a wiring board in a posture being inverted from that at the time of crystal growth, since an upper surface of a flat under growth layer functions as a light extraction plane and also a p-electrode functions as a reflection film, it is possible to enhance a light extraction efficiency. In this unit, although a crystal growth layer is typically formed into a hexagonal pyramid shape by selective growth, since a bump or elevated region is disposed on an n-electrode side, the crystal growth layer can be kept at the same height as that of the under growth layer for each device, and since spaces around devices are filled with an adhesive, it is possible to eliminate an inconvenience that the crystal growth layer and the like of each device are tilted.

In the above-described image display unit, since each light emitting device is mounted on a wiring board after being finished, it is possible to prevent a defective device from being mounted on the wiring board, and hence to improve the production yield of the image display unit as a whole. With the provision of each bump or elevated region, a pair of the positive and negative electrodes are collected on the wiring board side, and it is possible to eliminate, for example, reduction of the light extraction area by the presence of the electrodes. With this configuration, the image display unit of this embodiment enables high definition color display. Additionally, the image display unit of this embodiment can be produced in accordance with a production process which effectively takes the advantages of selective growth.

In a method of producing an image display unit according to this embodiment, since a number of light emitting devices located with a pitch corresponding to an electrode pitch of a wiring board are collectively mounted on the principal plane of the wiring board, it is possible to produce the image display unit in a short time at a low cost. Each device can be certainly mounted in a horizontal posture and prevented from being tilted by using each bump or elevated region, and the devices can be mounted on the wiring board with a reduced margin for alignment. As a result, it is possible to array the light emitting devices on the wiring board at high accuracy. The use of the bump or elevated region also enables reliability in the electrical wiring and maximization of the light extraction efficiency.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of producing light emitting devices, the method comprising the steps of:
    growing a semiconductor layer on an upper surface of a single layer sapphire substrate, the single layer sapphire substrate having an exposed back surface that is opposite to the upper surface;
    forming an array of light emitting devices on the semiconductor layer;
    dividing the array of light emitting devices into a plurality of individual light emitting devices by forming separation grooves to separate peripheries of respective individual light emitting devices from each other, wherein a depth of the separation grooves is sufficient to allow the upper surface of the single layer sapphire substrate to be exposed; and
    collectively separating the light emitting devices from the single layer sapphire substrate.

2. The method as claimed in claim 1, wherein the step of separating each of the individual light emitting devices from the single layer sapphire substrate includes irradiating each of the individual light emitting devices with an energy beam from the back surface of the single layer sapphire substrate.

3. The method as claimed in claim 2, the method further comprising the steps of:
    staging each of the individual light emitting devices between the single layer sapphire substrate and a temporary holding board before the step of separating each of the individual light emitting devices from the single layer sapphire substrate; and
    staging each of the individual light emitting devices on the temporary holding board after the step of separating each of the individual light emitting devices from the single layer sapphire substrate.

4. The method as claimed in claim 3, wherein an adhesive material is substantially formed on the temporary holding board, and a front surface of each of the light emitting devices is temporarily affixed to the adhesive.

5. The method as claimed in claim 3, further comprising bringing an attracting mechanism into contact with a back surface of one of the light emitting devices held on the temporary holding board and removing the light emitting device from the temporary holding board.

6. The method as claimed in claim 1, further comprising forming at least one buffer layer directly on an upper surface of the sapphire substrate and forming the semiconductor layer on the at least one buffer layer.

7. The method as claimed in claim 1,
    wherein the light emitting devices include a conductive cladding layer formed on the single layer sapphire substrate, and
    wherein separating each of the individual light emitting devices from the single layer sapphire substrate is performed by peeling the single layer sapphire substrate from the conductive cladding layer so that the upper surface of the single layer sapphire substrate separates from the conductive cladding layer.

8. The method as claimed in claim 1, wherein separating each of the individual light emitting devices from the single layer sapphire substrate is performed by irradiating an entire back side of the single layer sapphire substrate with an energy beam such that a bonding force between the single layer sapphire substrate and light emitting devices is reduced.

9. The method as claimed in claim 1, further comprising bringing a continuous adhesive material layer into press contact with the light emitting devices and at least partially filling the separation grooves with the continuous adhesive material layer prior to separating each of the individual light emitting devices from the single layer sapphire substrate.

10. The method as claimed in claim 9, wherein the light emitting devices are substantially buried within the adhesive material layer.

11. The method as claimed in claim 9, wherein the continuous adhesive material layer is formed on a front surface of a temporary holding member.

12. A method of producing light emitting devices, the method comprising the steps of:
    forming an array of light emitting devices on an upper surface of a sapphire substrate, the sapphire substrate having an exposed back surface that is opposite to the upper surface, the forming of the array of light emitting devices including
    growing a gallium nitride based first conductive type cladding layer on the sapphire substrate,
    growing an active layer on the first conductive type cladding layer, and
    growing a second conductive type cladding layer on the active layer;
dividing the array of light emitting devices into a plurality of individual light emitting devices by forming separation grooves through the first conductive type cladding layer, the active layer and the second conductive type cladding layer to separate peripheries of respective individual light emitting devices from each other, wherein a depth of the separation grooves is sufficient to allow the upper surface of the sapphire substrate to be exposed through the light emitting devices; and
irradiating an entire exposed back surface of the sapphire substrate with an energy beam to decompose a portion of the gallium nitride in the first conductive type cladding layer into nitrogen gas and metal gallium, thereby reducing a bonding force between the sapphire substrate and the first conductive type cladding layer of the light emitting devices; and
peeling the sapphire substrate as a whole from each of the individual light emitting devices.

13. The method as claimed in claim 12, further comprising forming at least one buffer layer directly on an upper surface of the sapphire substrate and forming the semiconductor layer on the at least one buffer layer.

* * * * *